US012700464B2

(12) United States Patent (10) Patent No.: US 12,700,464 B2
Maejima (45) Date of Patent: Aug. 4, 2026

(54) SEMICONDUCTOR MEMORY DEVICE

(71) Applicant: Kioxia Corporation, Tokyo (JP)

(72) Inventor: Hiroshi Maejima, Tokyo (JP)

(73) Assignee: Kioxia Corporation, Tokyo (JP)

( * ) Notice: Subject to any disclaimer, the term of this patent is extended or adjusted under 35 U.S.C. 154(b) by 172 days.

(21) Appl. No.: 18/438,636

(22) Filed: Feb. 12, 2024

(65) Prior Publication Data

US 2024/0282391 A1     Aug. 22, 2024

(30) Foreign Application Priority Data

Feb. 20, 2023     (JP) ................................. 2023-024406

(51) Int. Cl.
| | |
|---|---|
| *G11C 16/34* | (2006.01) |
| *G11C 16/04* | (2006.01) |
| *G11C 16/08* | (2006.01) |
| *G11C 16/10* | (2006.01) |
| *G11C 16/26* | (2006.01) |
| *H10B 80/00* | (2023.01) |
| *H10W 90/00* | (2026.01) |

(52) U.S. Cl.
CPC ...... *G11C 16/3427* (2013.01); *G11C 16/0483* (2013.01); *G11C 16/08* (2013.01); *G11C 16/10* (2013.01); *G11C 16/26* (2013.01); *H10B 80/00* (2023.02); *H10W 90/00* (2026.01); *H10W 90/792* (2026.01)

(58) Field of Classification Search
CPC ..... G11C 16/0483; G11C 16/08; G11C 16/26; H01L 24/08; H01L 25/0657; H01L 2224/08145; H01L 2924/1431
See application file for complete search history.

(56) References Cited

U.S. PATENT DOCUMENTS

| | | | |
|---|---|---|---|
| 11,189,335 B2 | 11/2021 | Nishikawa et al. | |
| 11,211,328 B2 | 12/2021 | Oh et al. | |
| 11,705,443 B2 | 7/2023 | Maejima et al. | |
| 11,783,888 B2 | 10/2023 | Maejima | |
| 2009/0086542 A1* | 4/2009 | Lee ........................ | G11C 16/24 |
| | | | 365/185.25 |
| 2011/0051527 A1* | 3/2011 | Kirisawa ................ | H10B 43/27 |
| | | | 365/185.29 |
| 2013/0336062 A1* | 12/2013 | Maejima ............ | G11C 16/0483 |
| | | | 365/185.11 |
| 2016/0247573 A1* | 8/2016 | Maejima ................ | G11C 16/32 |
| 2019/0043868 A1 | 2/2019 | Hasnat et al. | |

(Continued)

FOREIGN PATENT DOCUMENTS

JP     2024046343  A     4/2024

*Primary Examiner* — Uyen Smet
(74) *Attorney, Agent, or Firm* — Holtz, Holtz & Volek PC

(57) ABSTRACT

According to one embodiment, a semiconductor memory device includes, a first string in which a first selection transistor, a first memory cell, and a second selection transistor are coupled in series, a second string in which a third selection transistor, a second memory cell, and a fourth selection transistor are coupled in series, a word line, a first selection gate line, a second selection gate line, a third selection gate line, a fourth selection gate line, a first bit line, and a second bit line. In a read operation of the first memory cell, when a voltage of the word line is raised to a first voltage, a second voltage is applied to the first bit line and a third voltage higher than the second voltage is applied to the second bit line.

18 Claims, 28 Drawing Sheets

(56)     References Cited

U.S. PATENT DOCUMENTS

| | | | |
|---|---|---|---|
| 2019/0206500 A1* | 7/2019 | Cho | G11C 16/08 |
| 2022/0351777 A1 | 11/2022 | Maejima | |
| 2022/0383961 A1* | 12/2022 | Lien | G11C 16/08 |
| 2023/0307434 A1 | 9/2023 | Maejima et al. | |
| 2023/0387053 A1* | 11/2023 | Kim | H01L 24/05 |
| 2023/0402087 A1 | 12/2023 | Maejima | |
| 2024/0105270 A1 | 3/2024 | Maejima | |

* cited by examiner

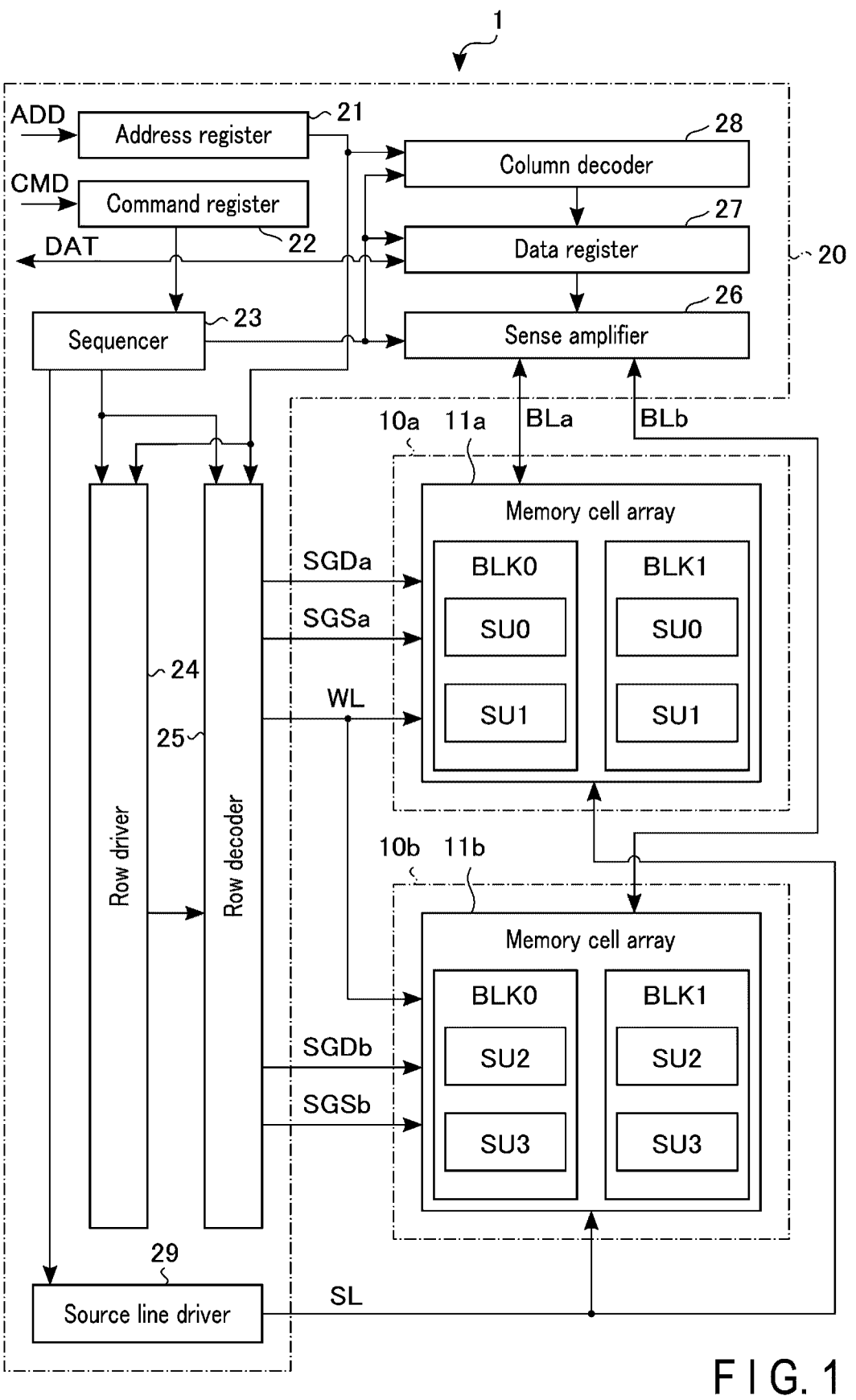
F I G. 1

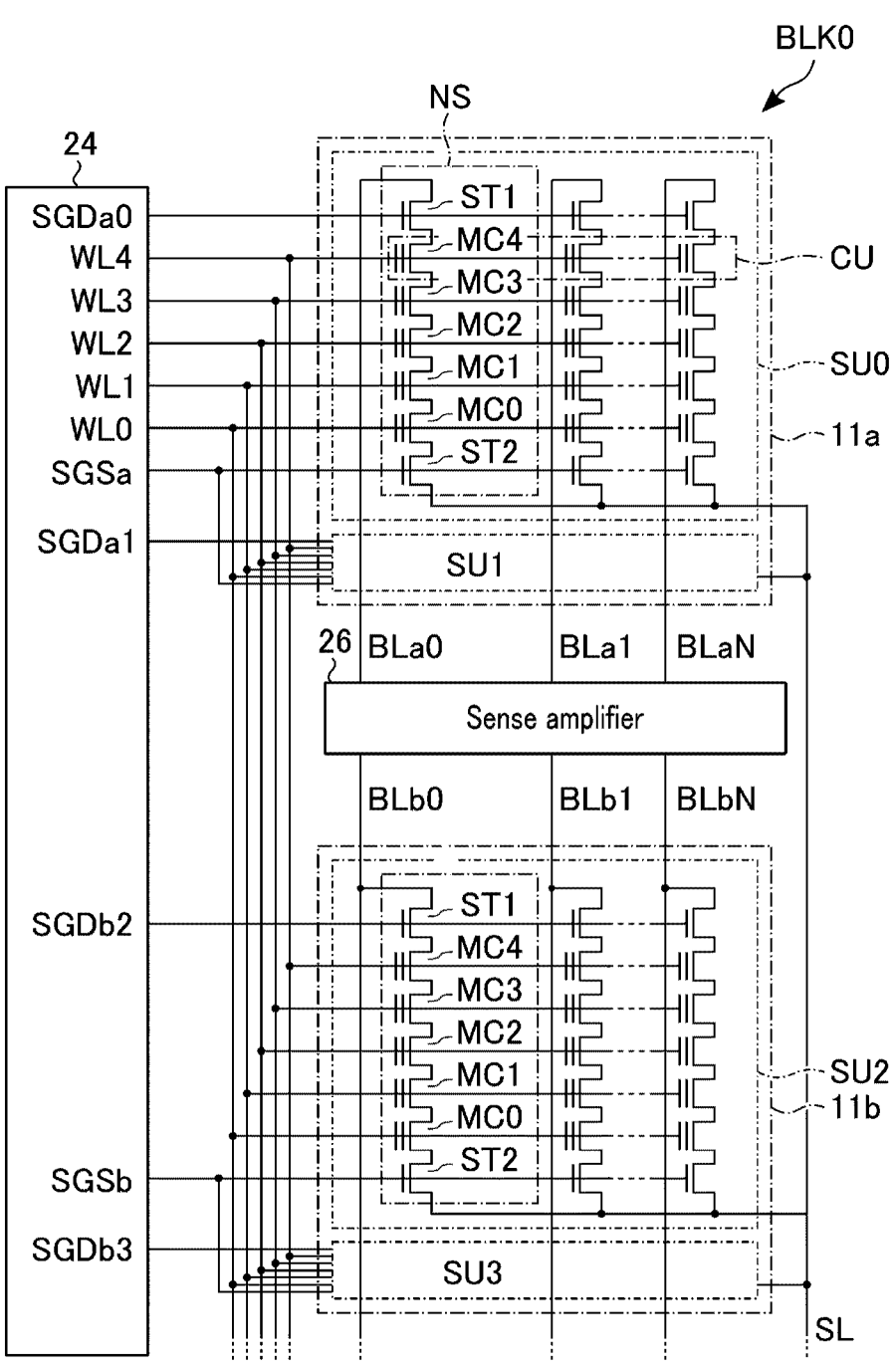
F I G. 2

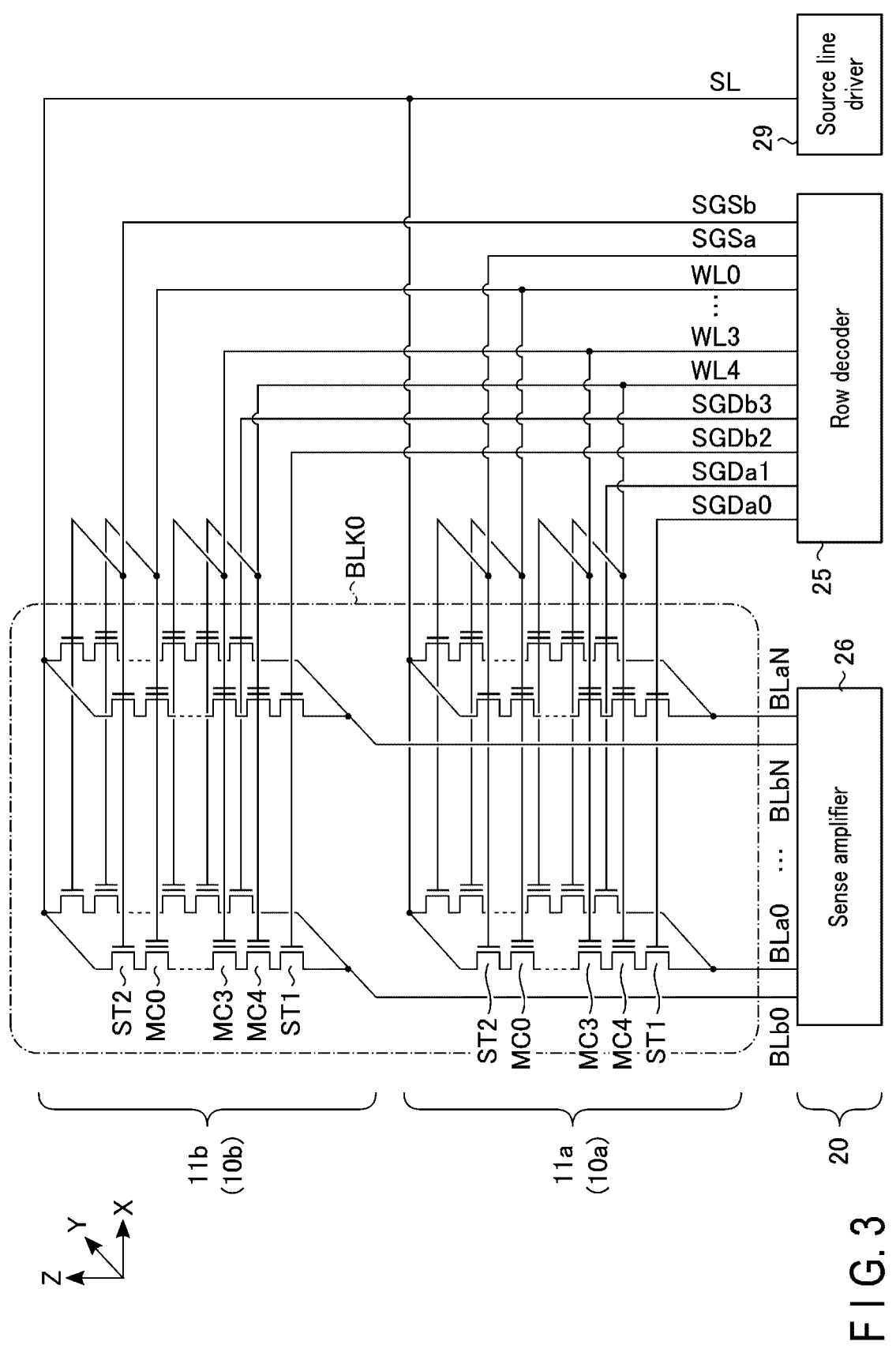
F I G. 3

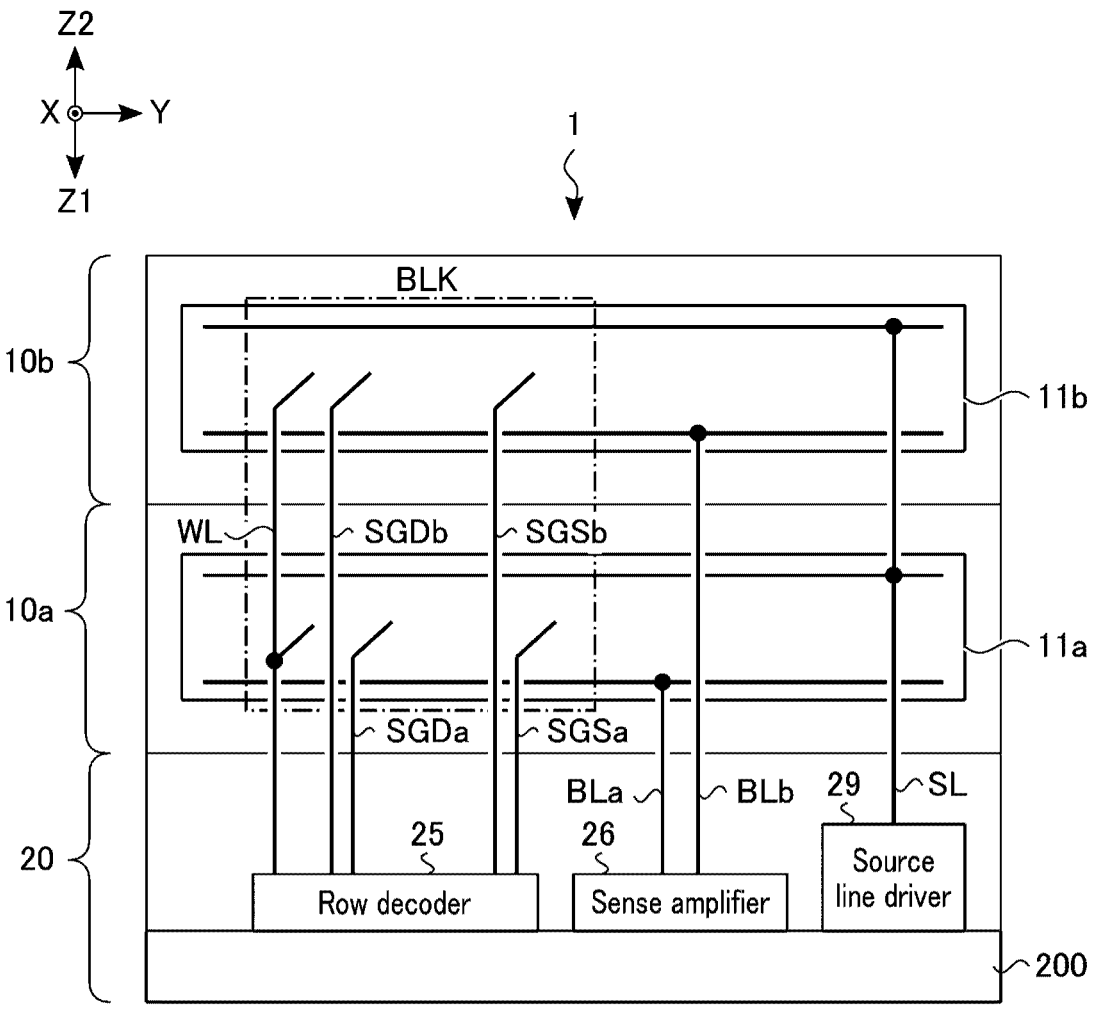
F I G. 4

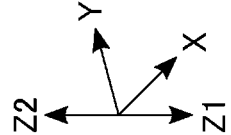
F I G. 5

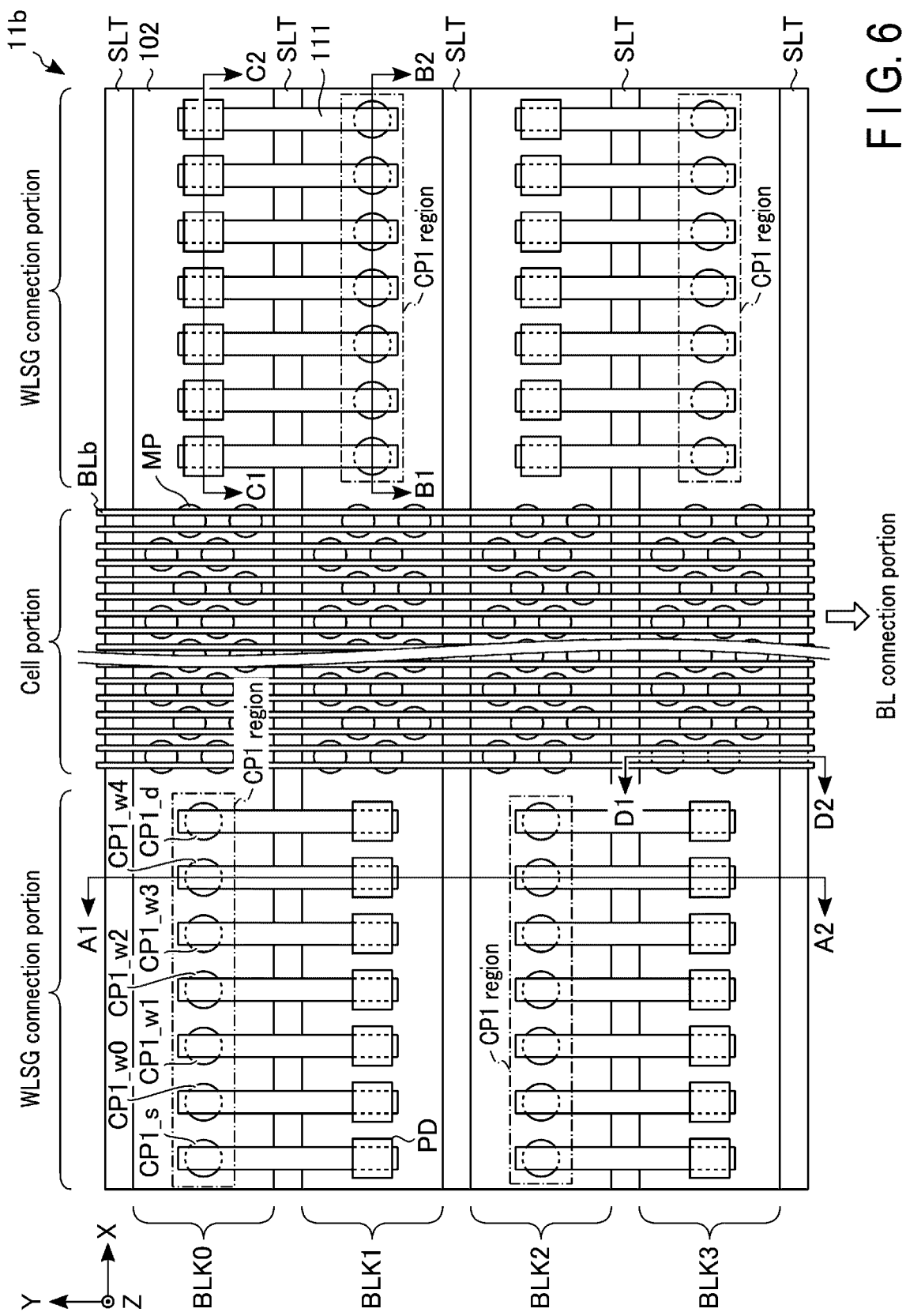
F I G. 6

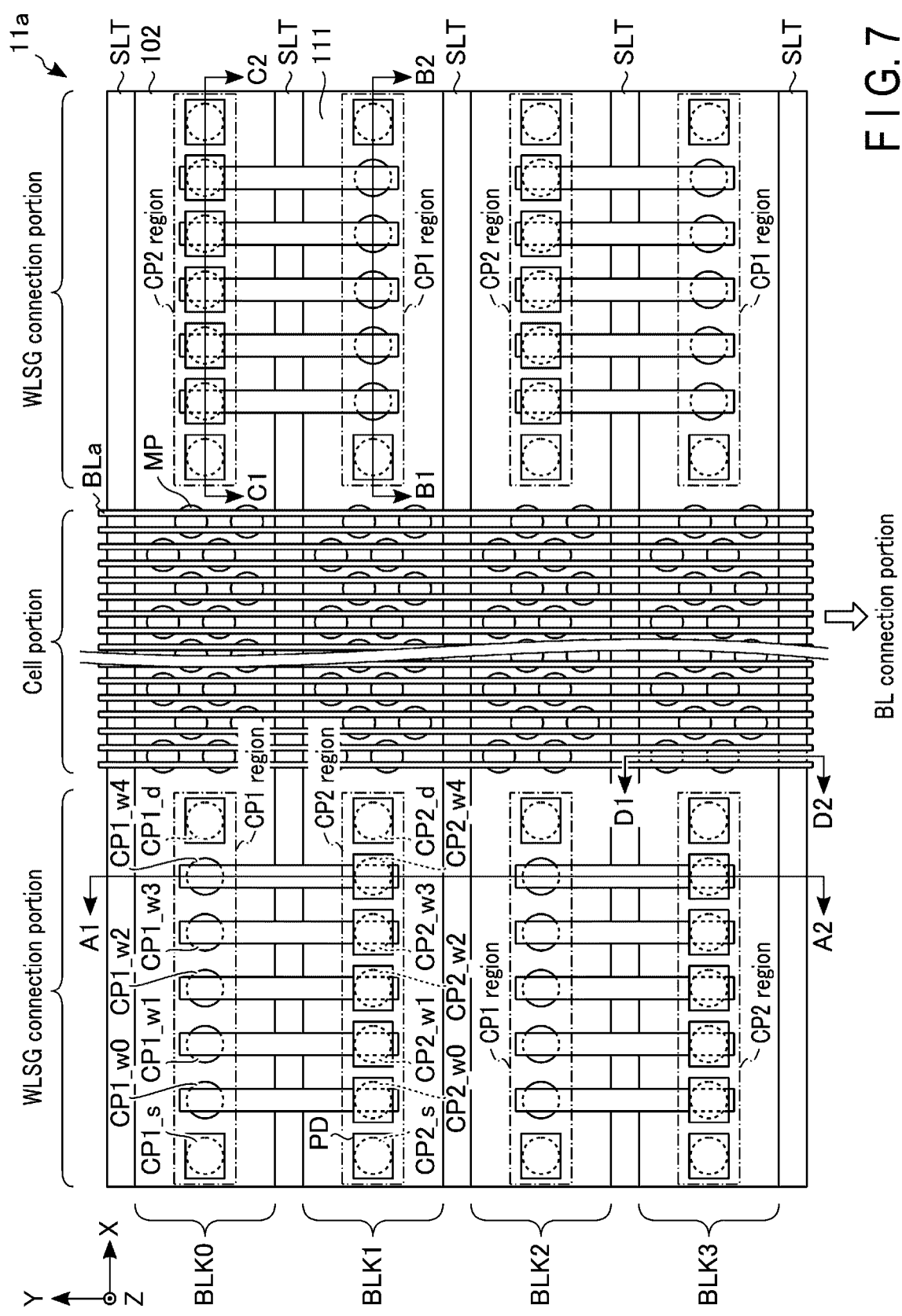
F I G. 7

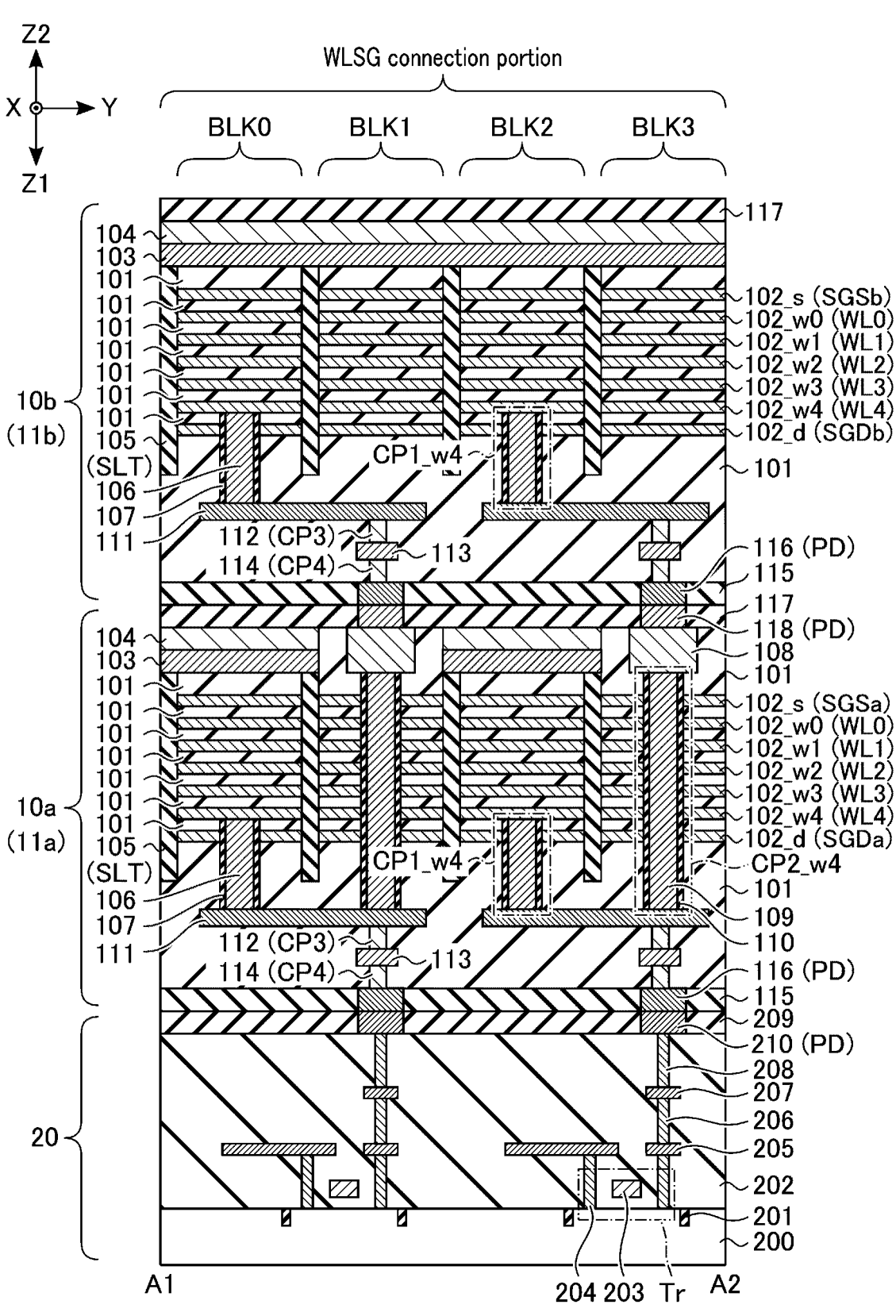
F I G. 8

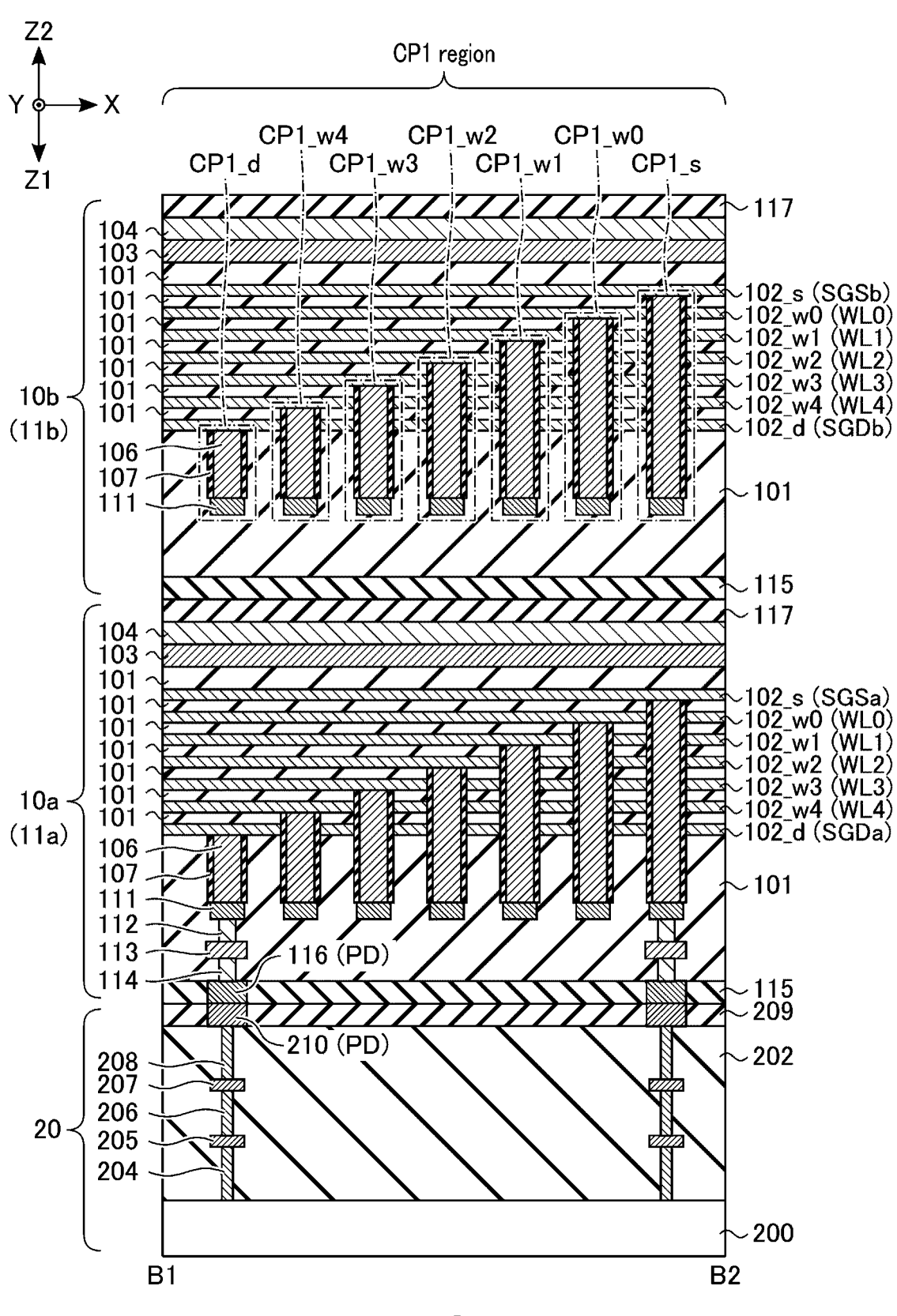
F I G. 9

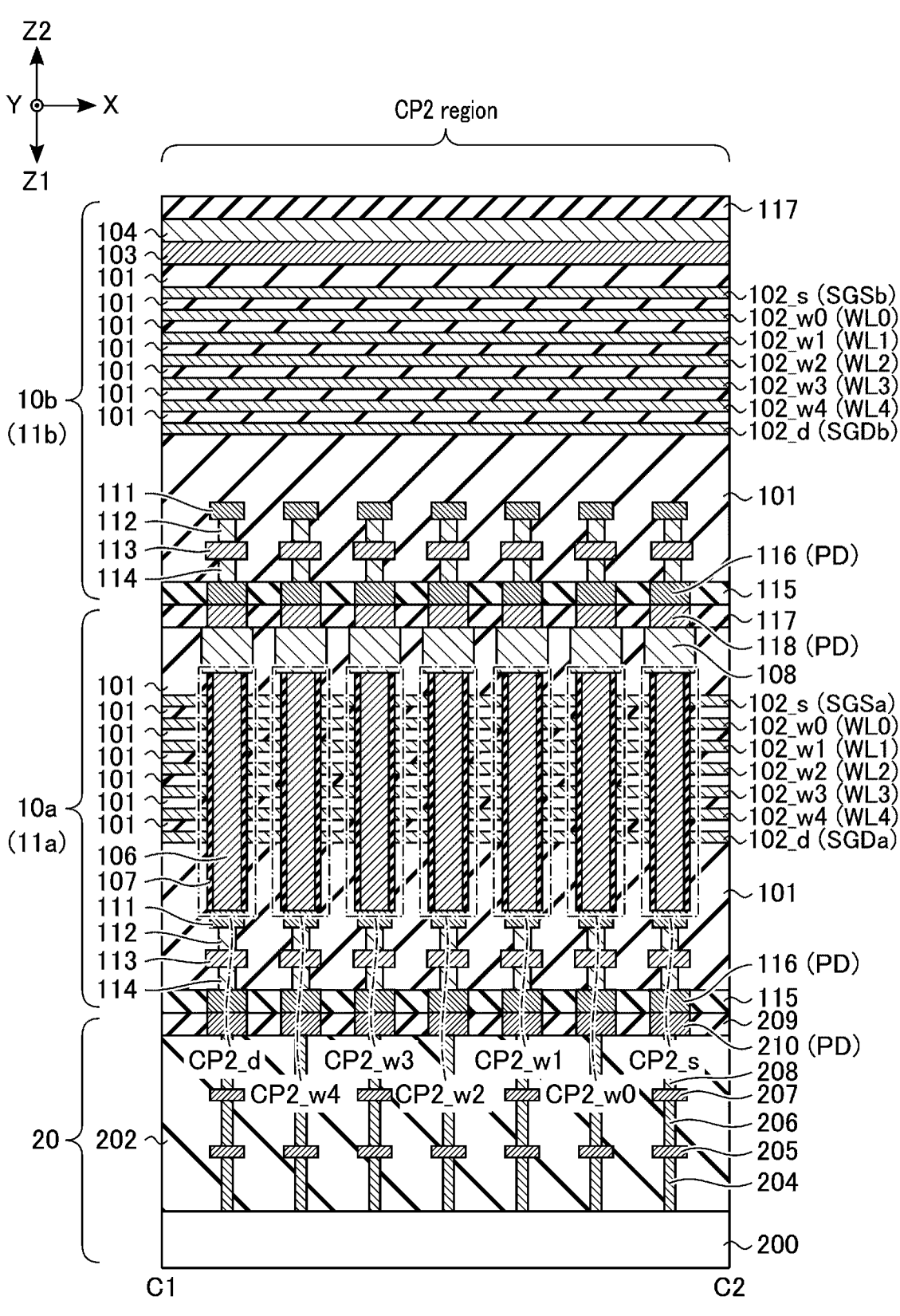
F I G. 10

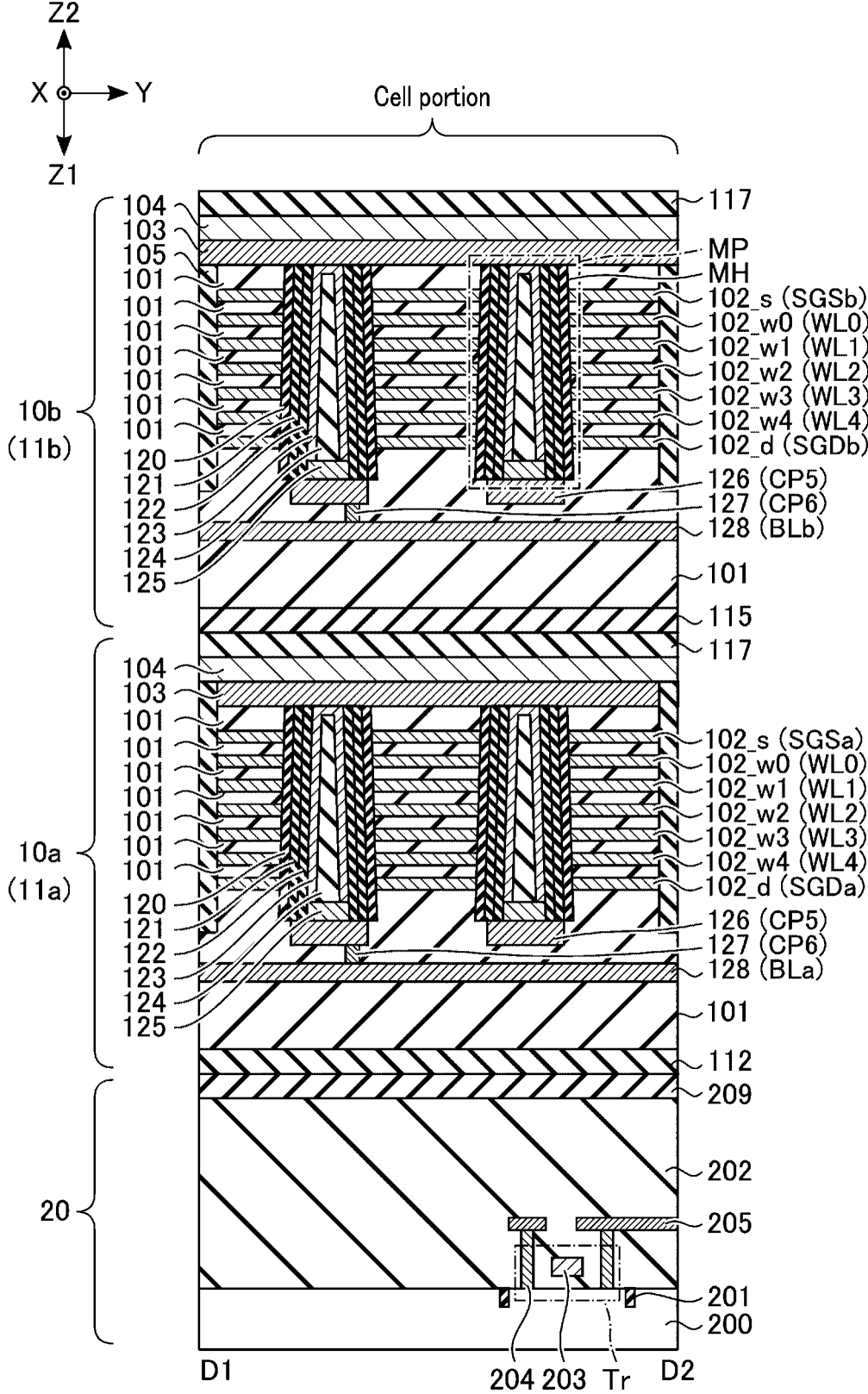
F I G. 11

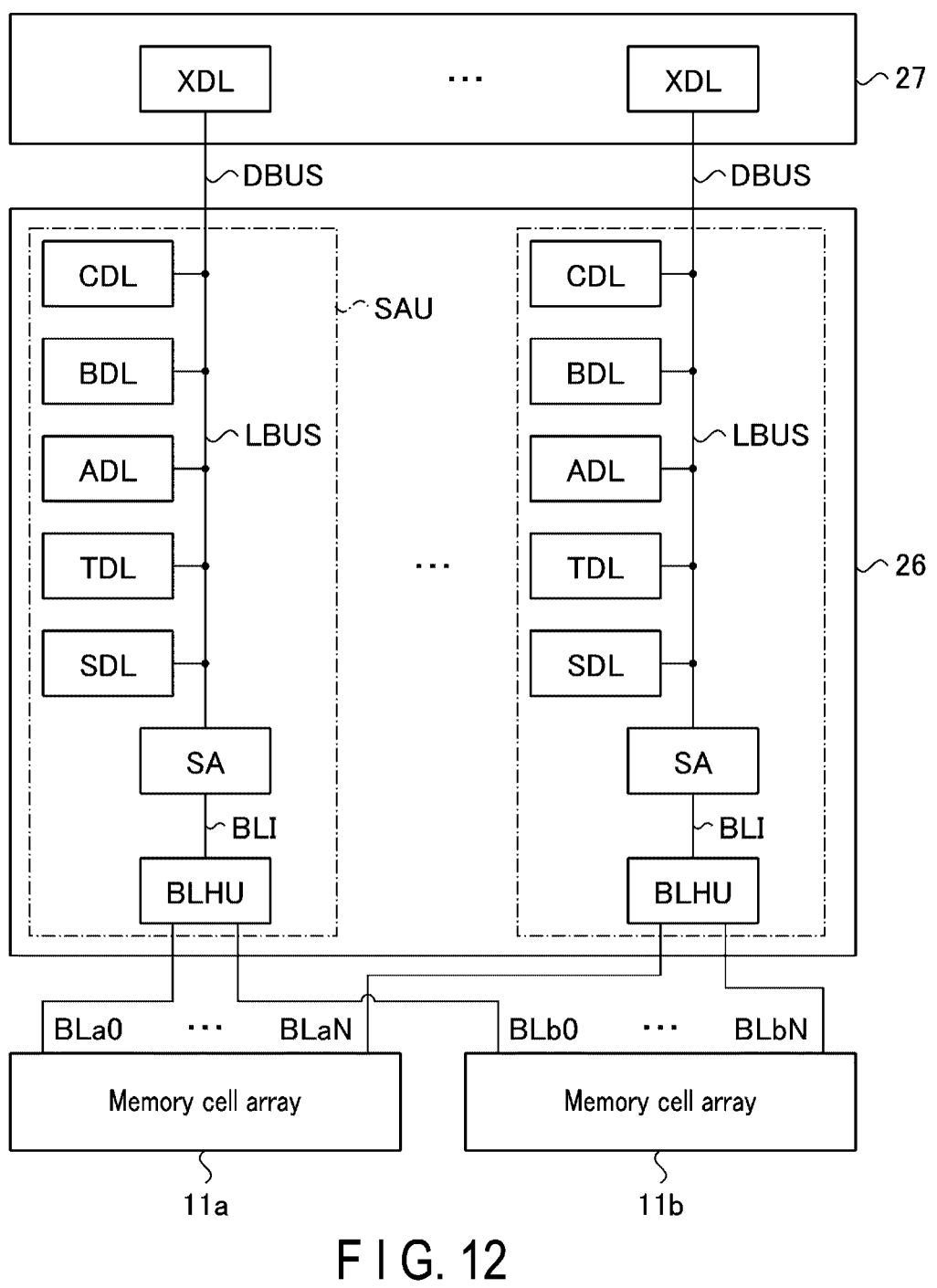
F I G. 12

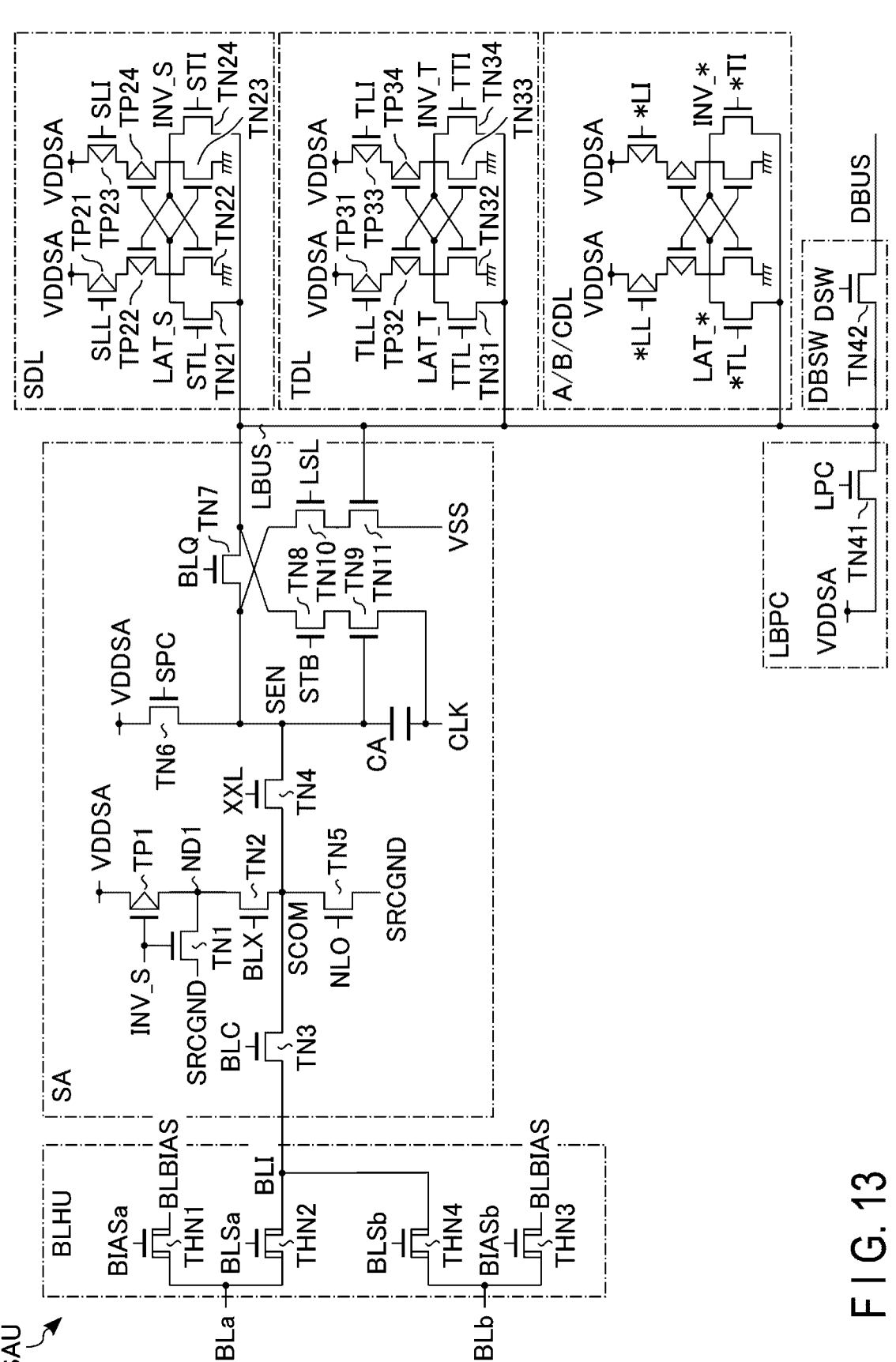
F I G. 13

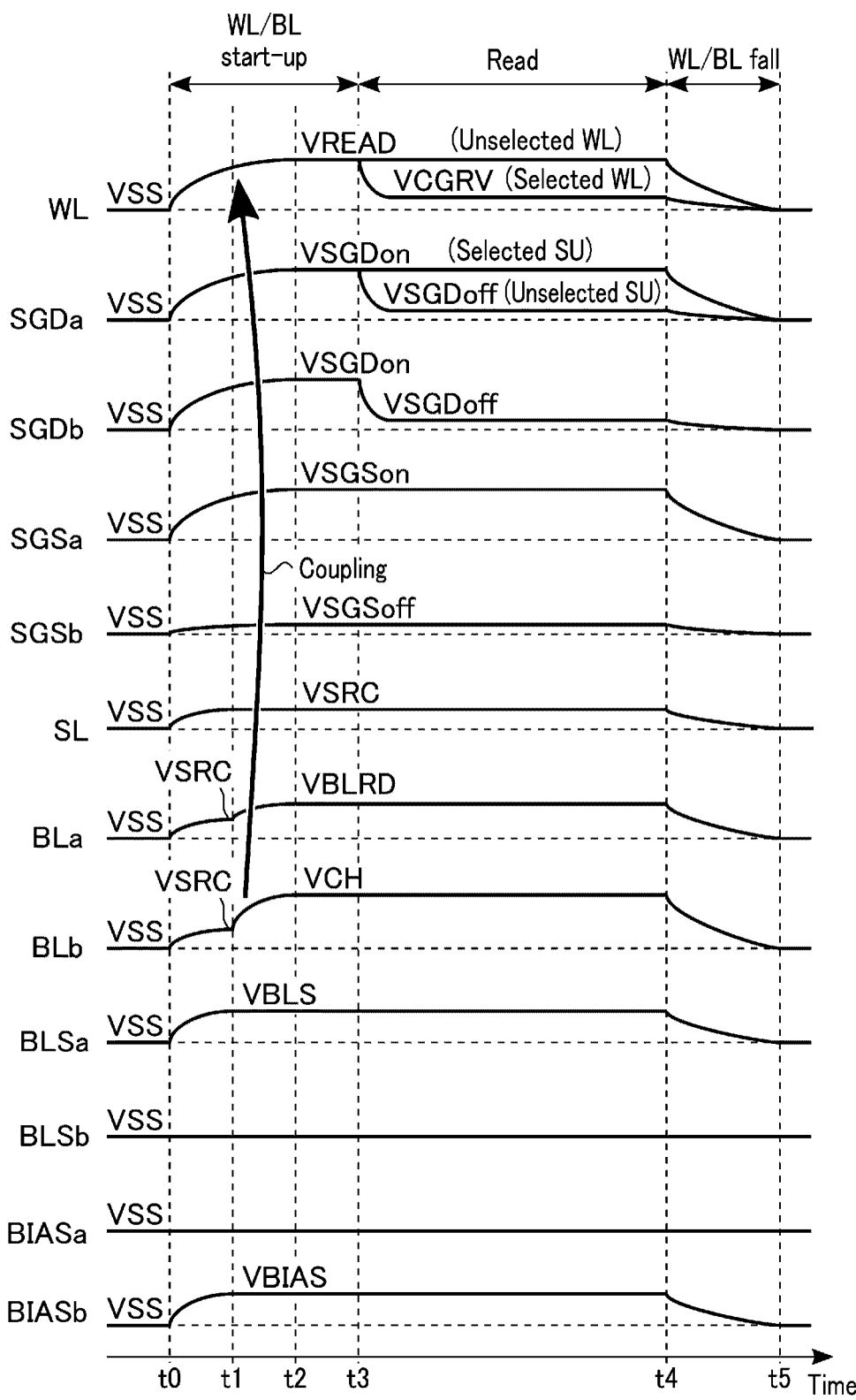
F I G. 14

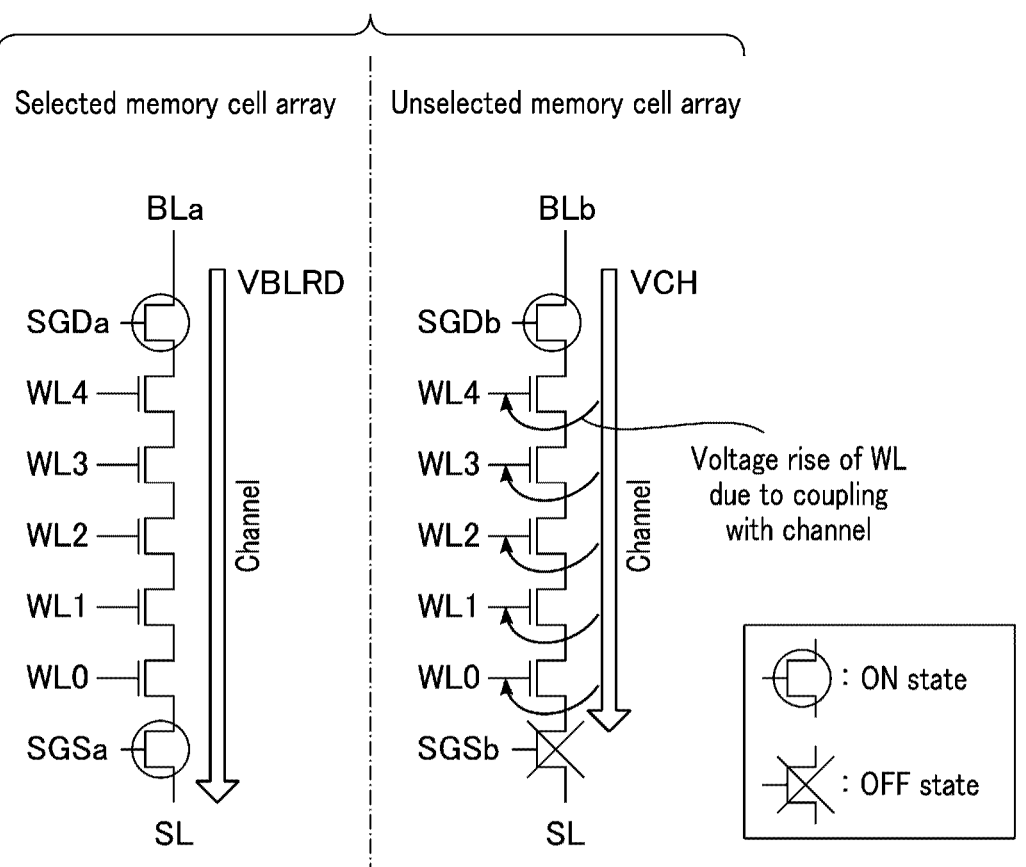
F I G. 15
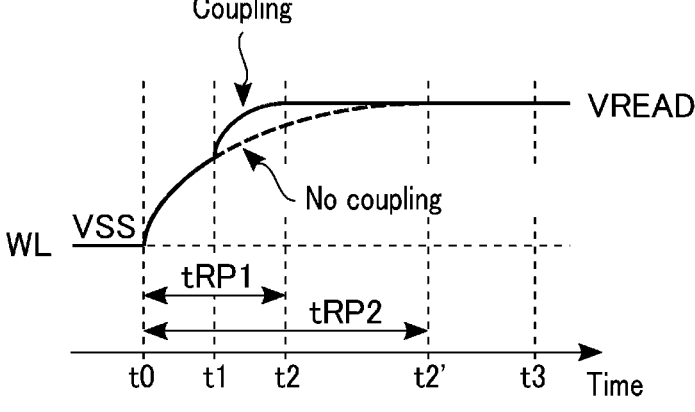
F I G. 16

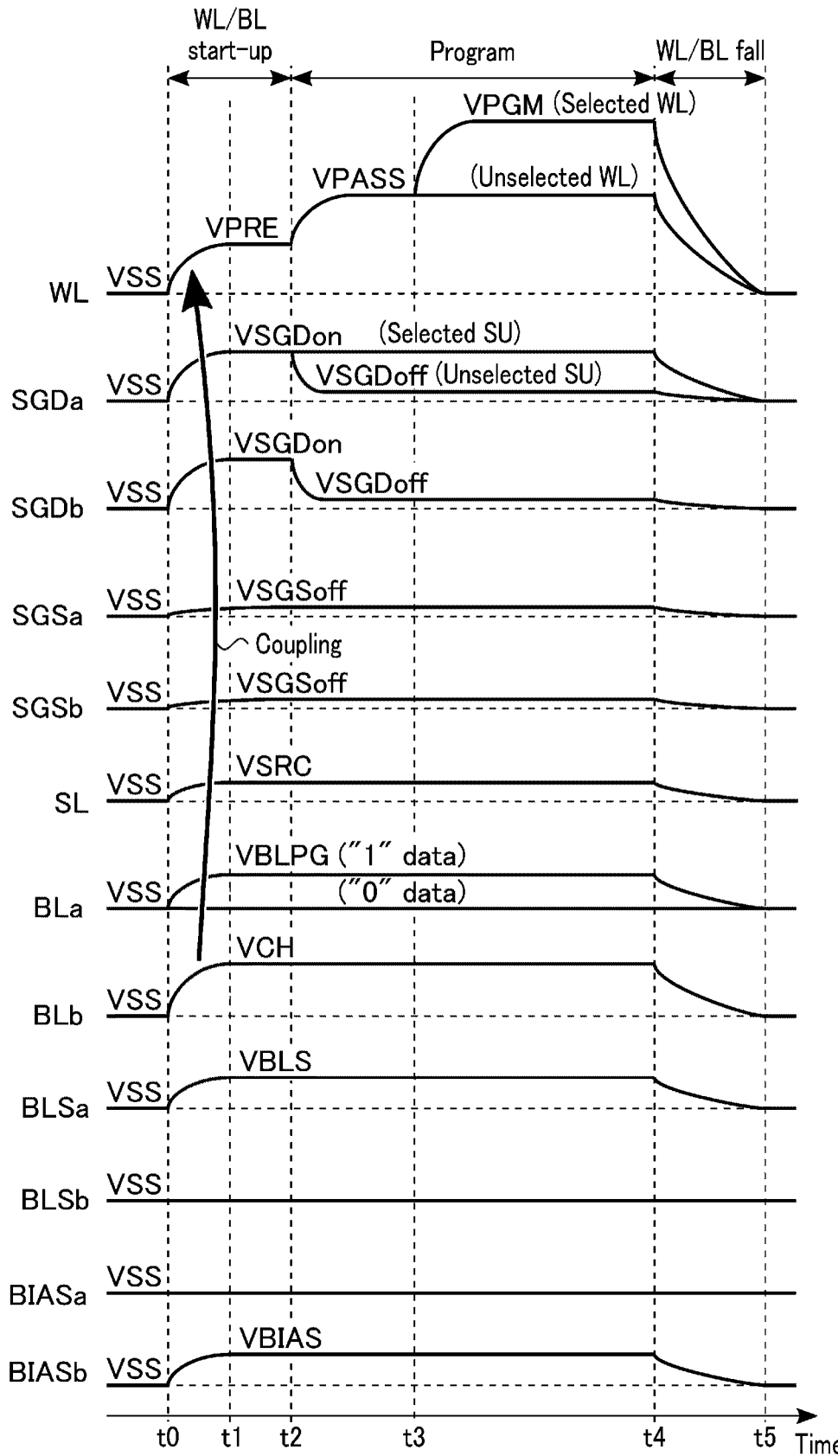
F I G. 17

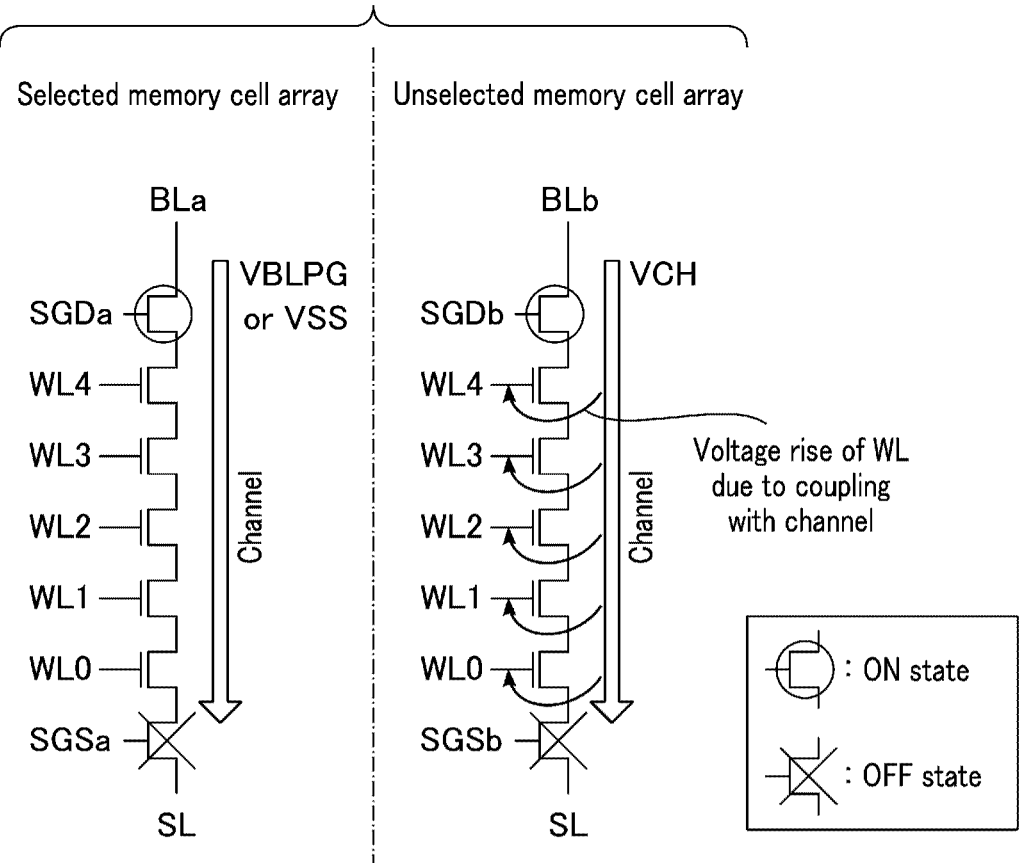
F I G. 18

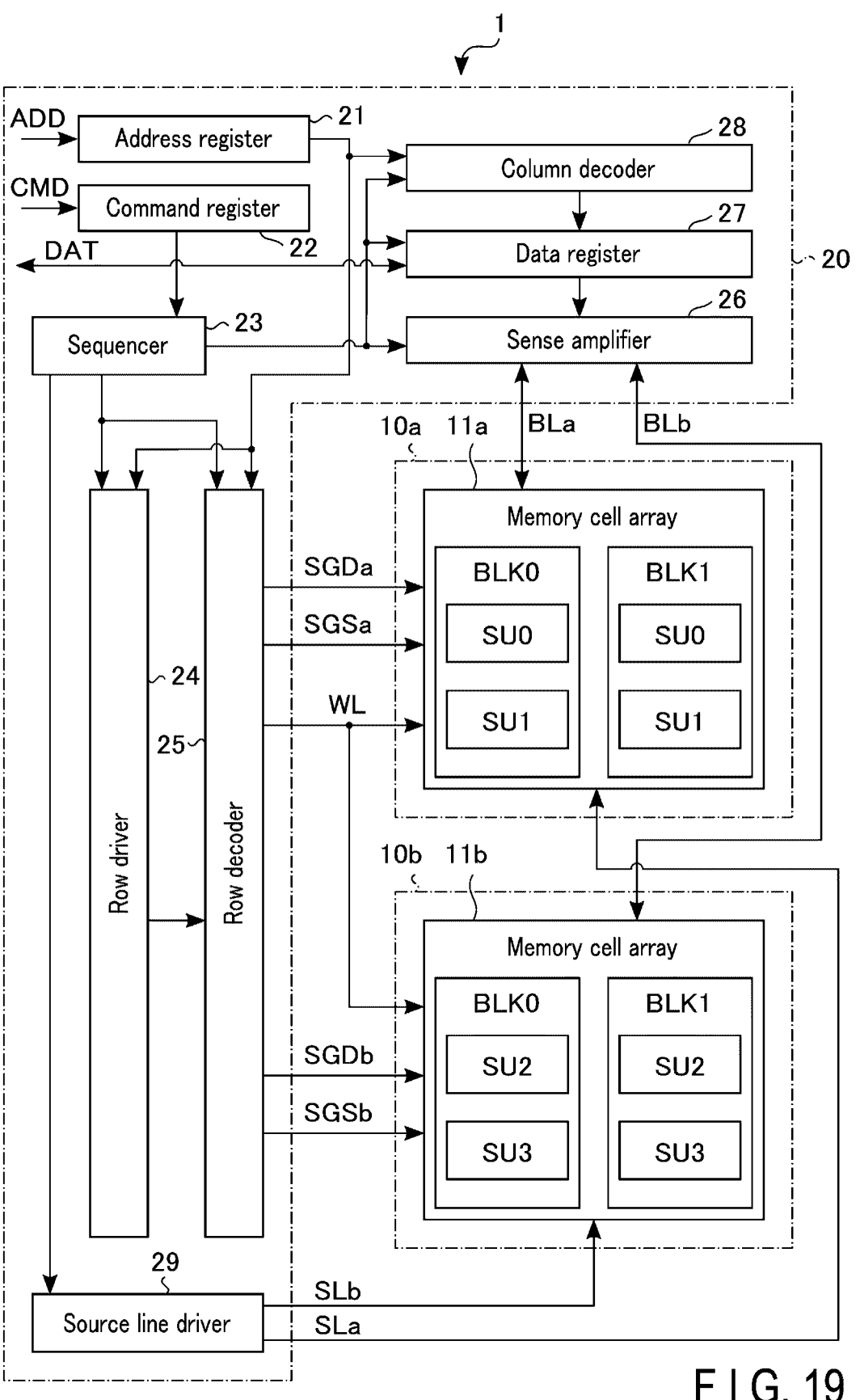
F I G. 19

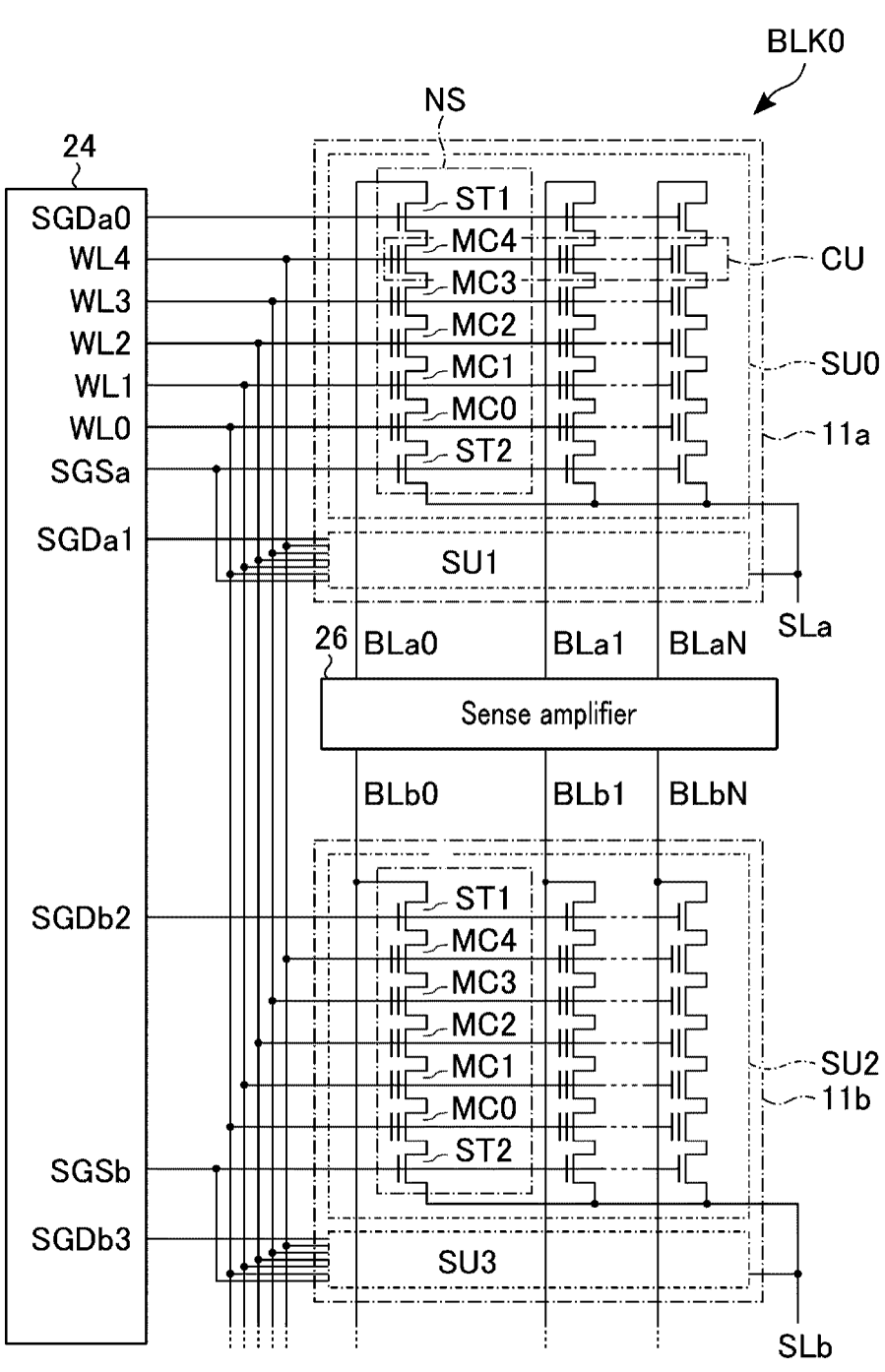
F I G. 20

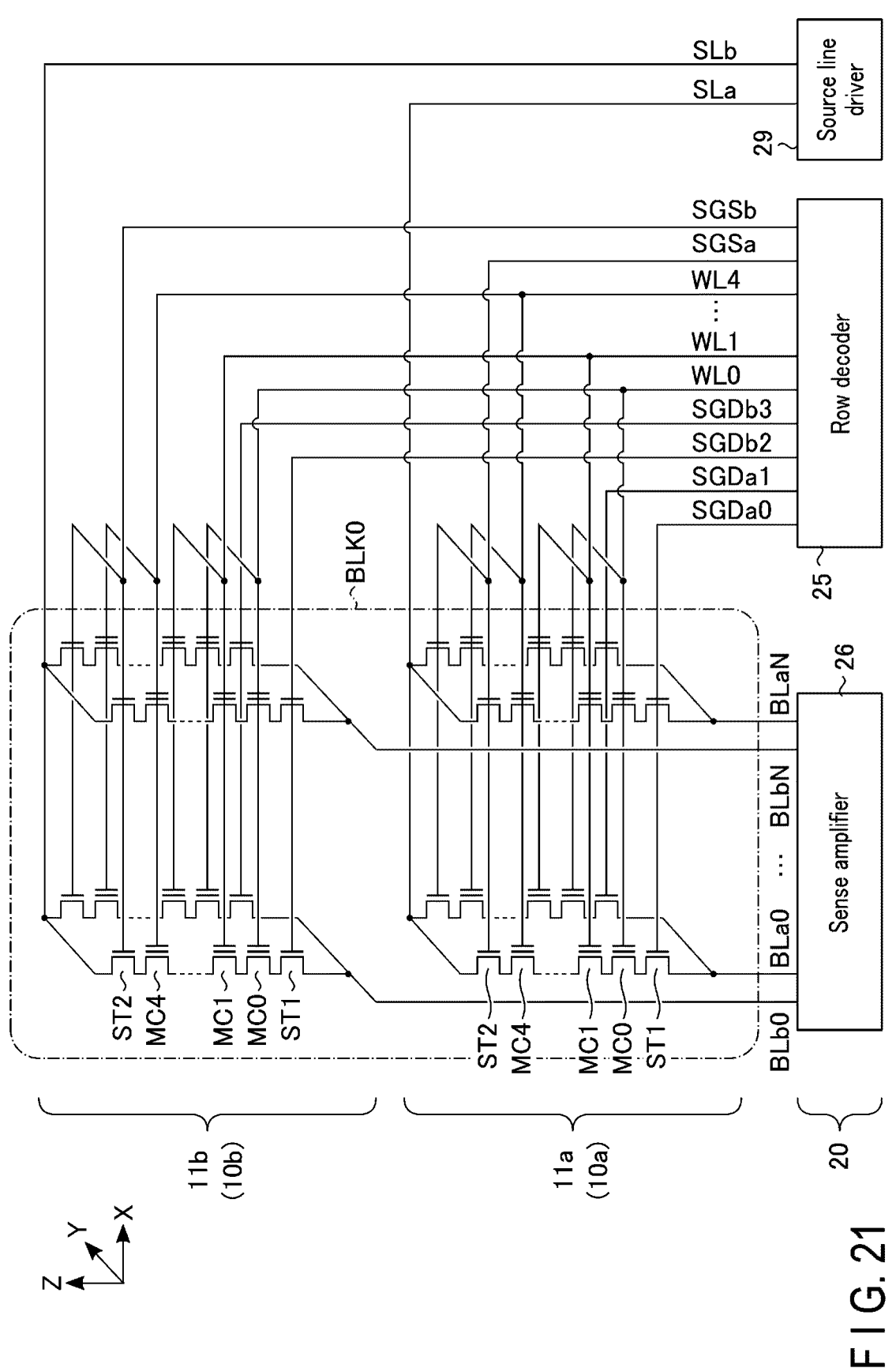
F I G. 21

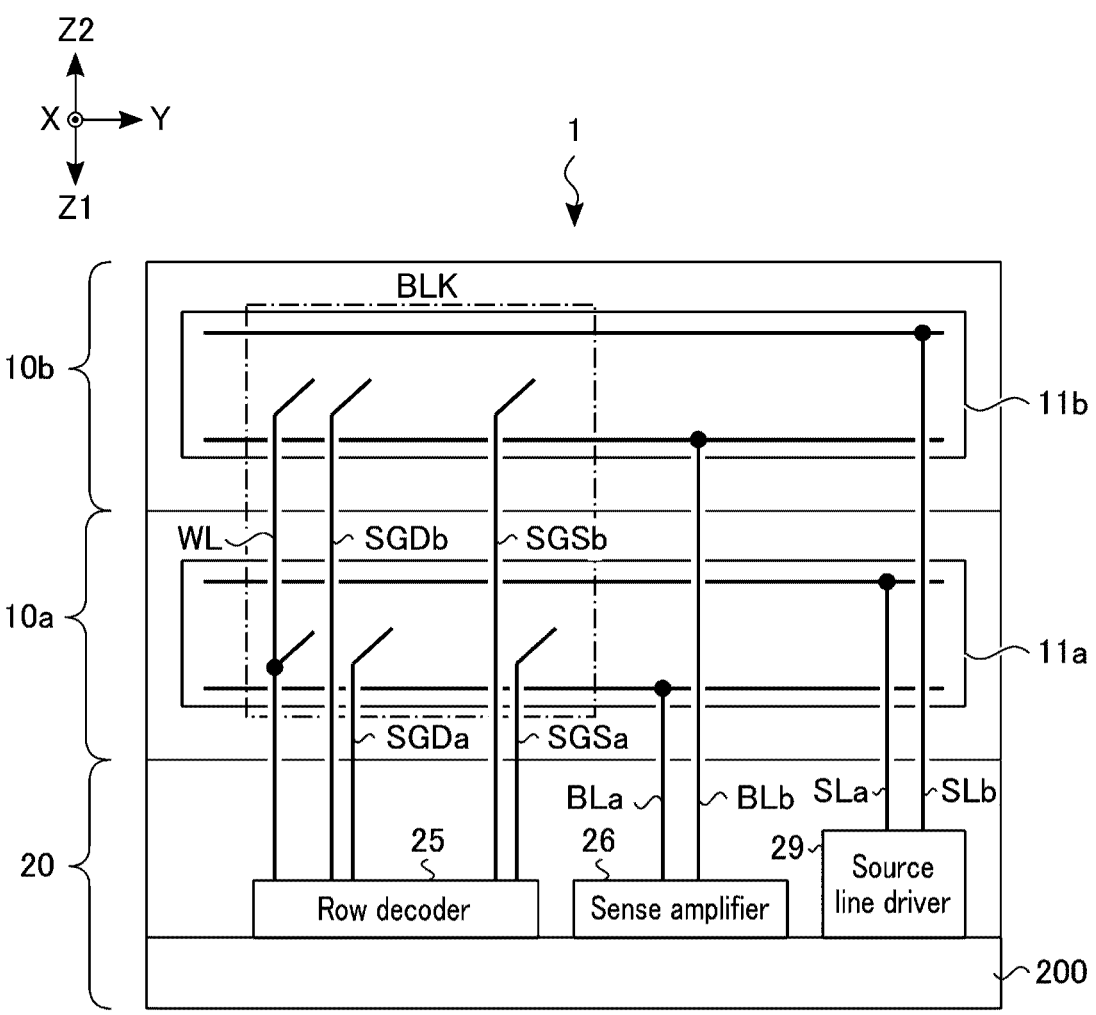
F I G. 22

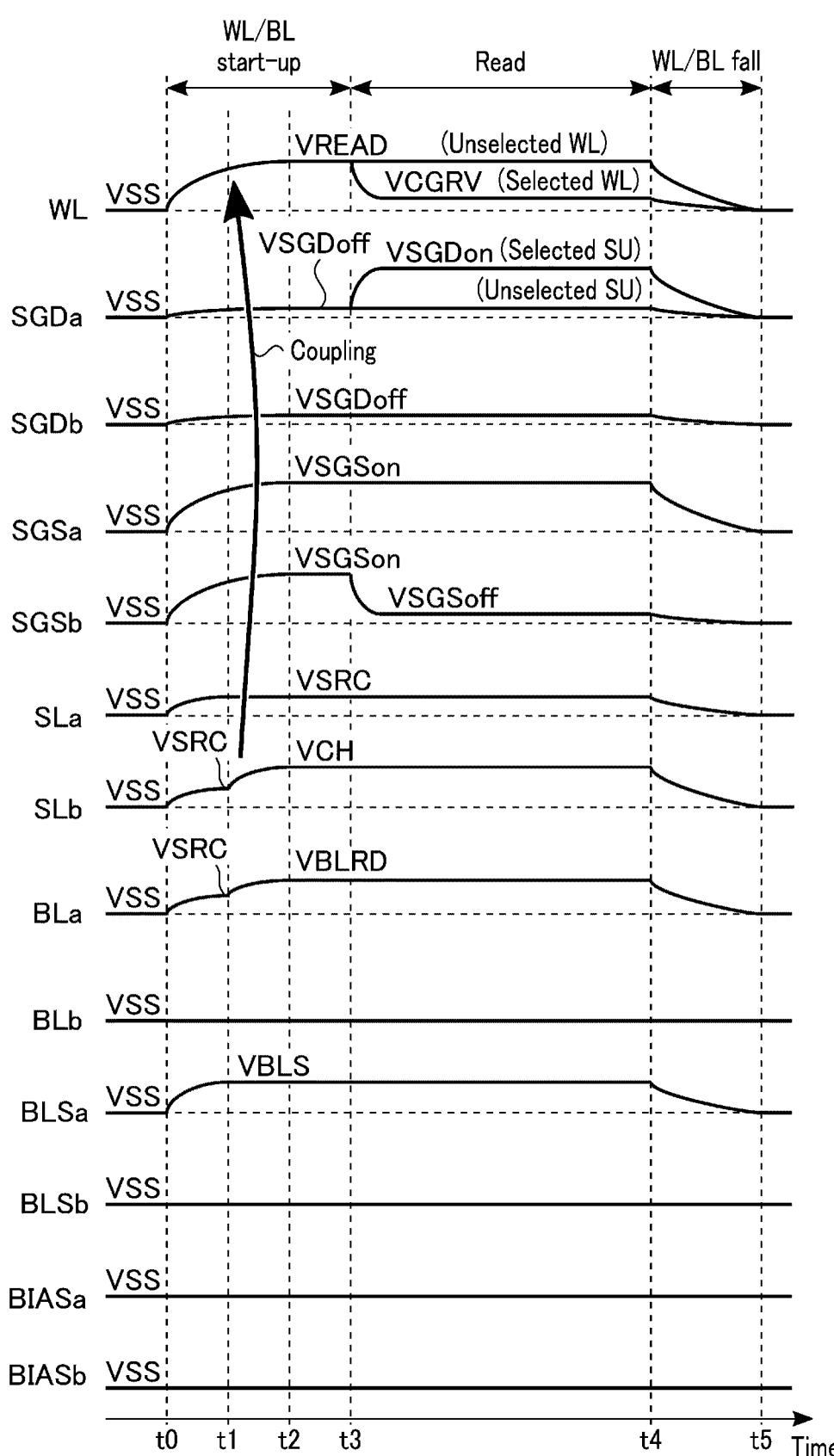
F I G. 23

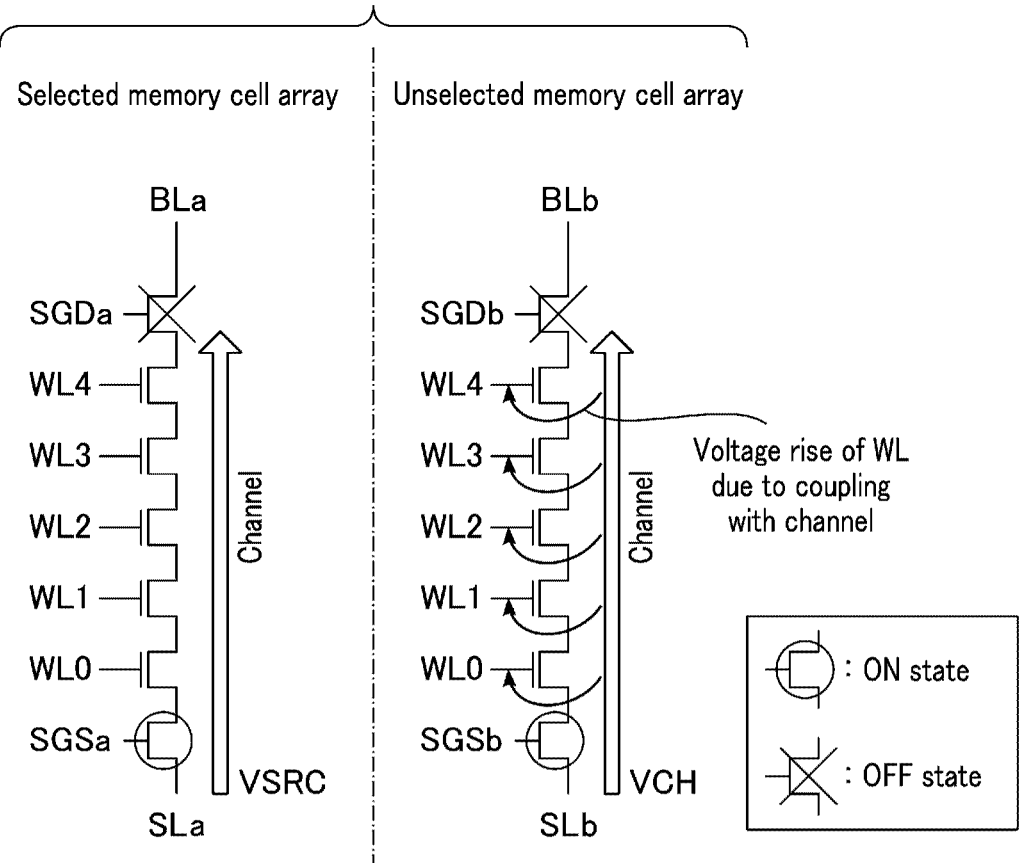
F I G. 24

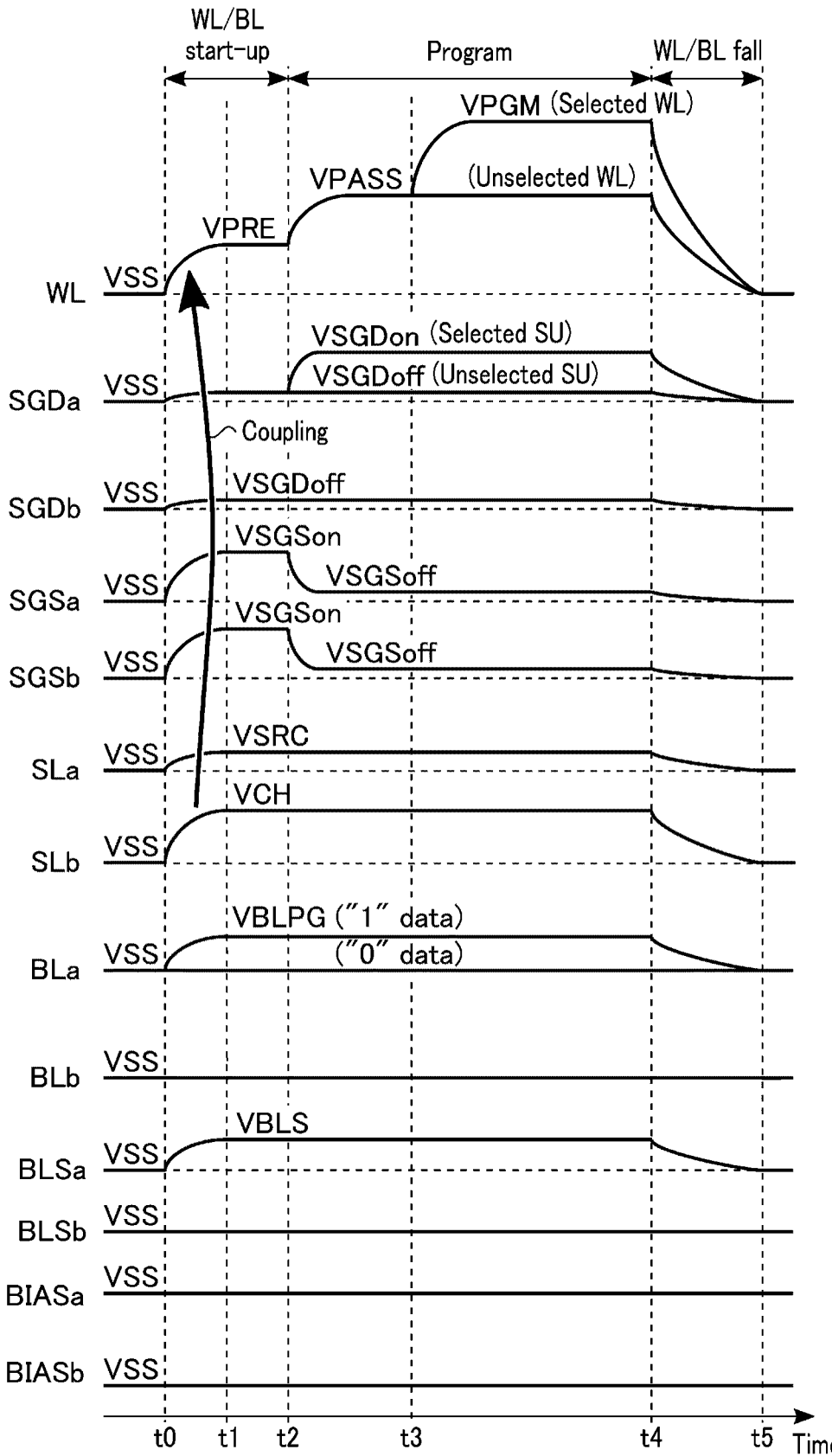
F I G. 25

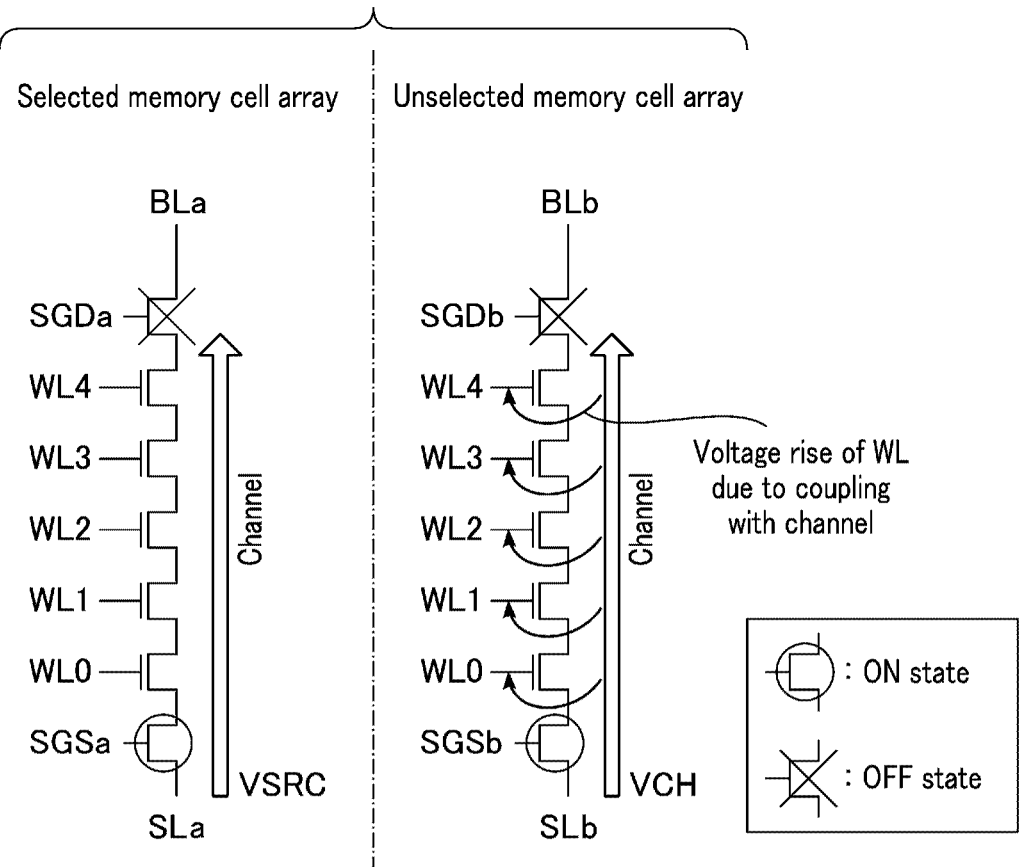
F I G. 26

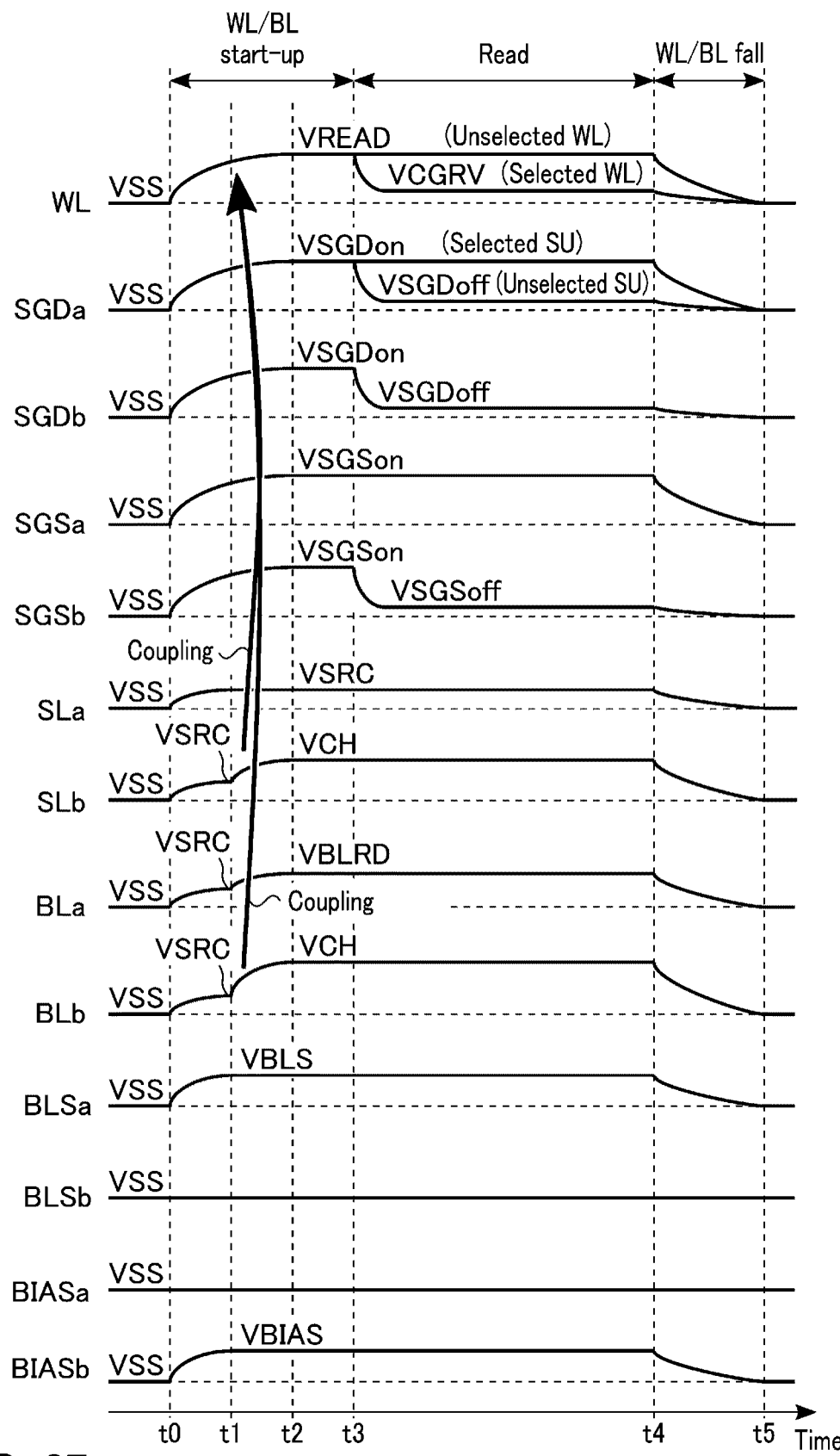
F I G. 27

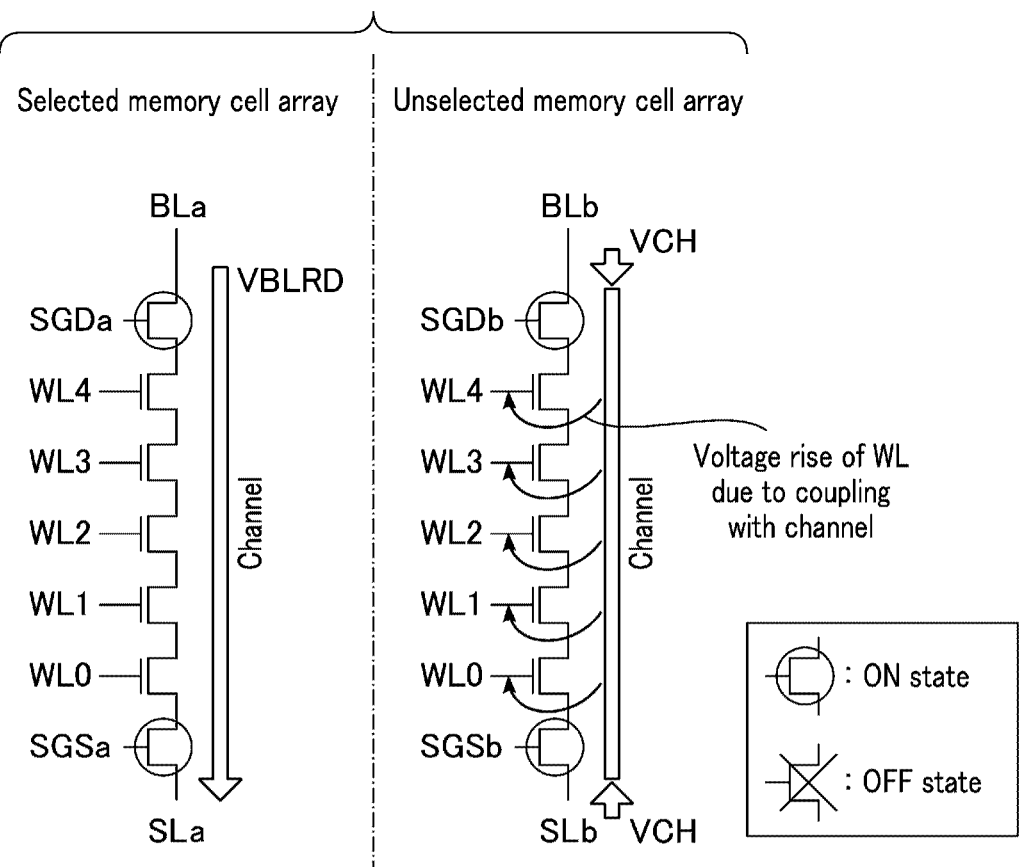
F I G. 28

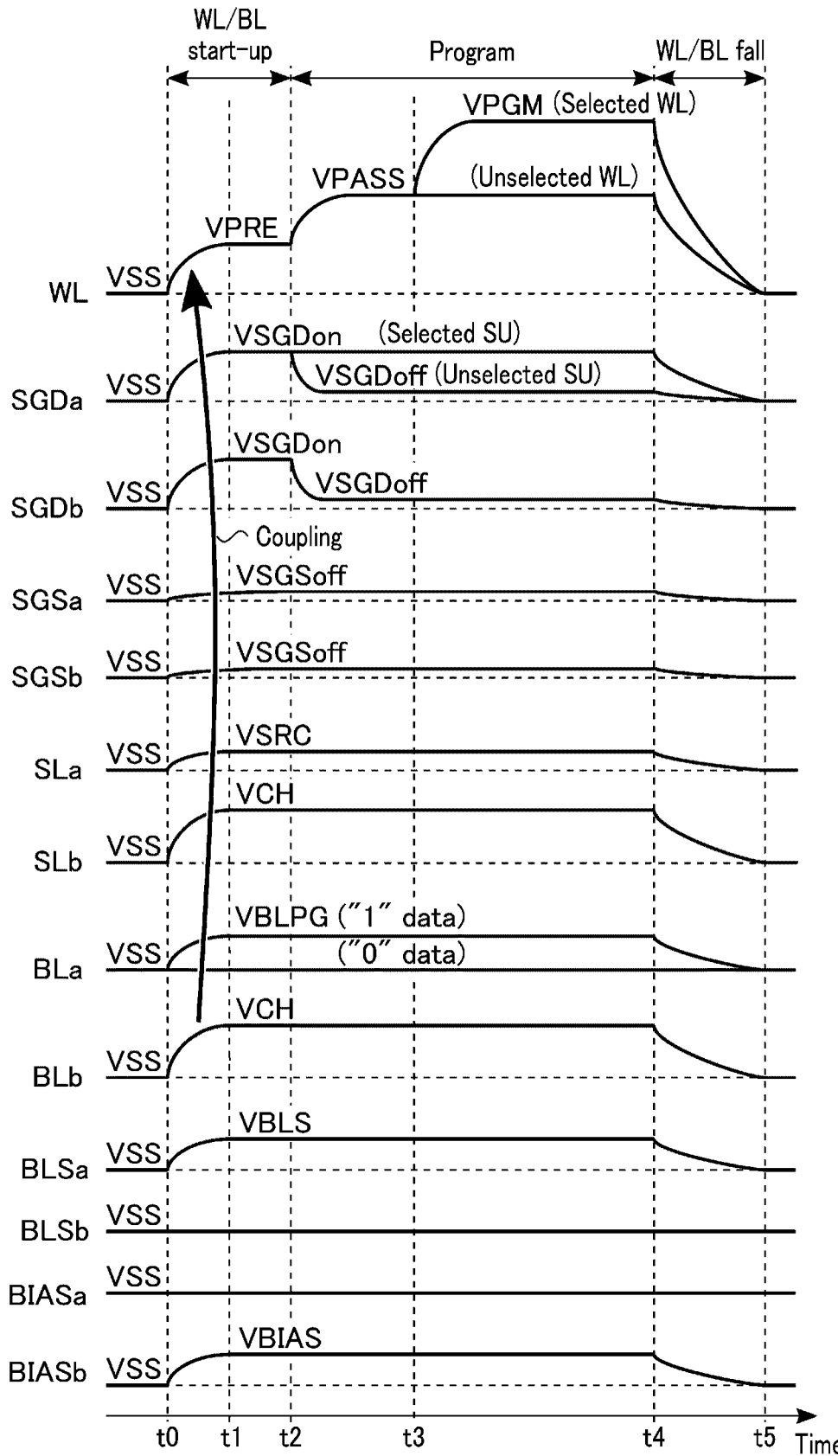
F I G. 29

SEMICONDUCTOR MEMORY DEVICE

CROSS-REFERENCE TO RELATED APPLICATIONS

This application is based upon and claims the benefit of priority from Japanese Patent Application No. 2023-024406, filed Feb. 20, 2023, the entire contents of which are incorporated herein by reference.

FIELD

Embodiments described herein relate generally to a semiconductor memory device.

BACKGROUND

A NAND-type flash memory is known as a semiconductor memory device.

BRIEF DESCRIPTION OF DRAWINGS

FIG. 1 is a block diagram illustrating the overall configuration of a semiconductor memory device according to a first embodiment.

FIG. 2 is a plan view illustrating a circuit configuration of a memory cell array included in the semiconductor memory device according to the first embodiment.

FIG. 3 is a perspective view illustrating a circuit configuration of the memory cell array included in the semiconductor memory device according to the first embodiment.

FIG. 4 is a cross-sectional view illustrating arrangement of array chips 10a and 10b and a circuit chip 20 included in the semiconductor memory device according to the first embodiment.

FIG. 5 is a perspective view illustrating arrangement of memory cell arrays 11a and 11b and a circuit chip 20 included in the semiconductor memory device according to the first embodiment.

FIG. 6 is a plan view of a cell portion and WLSG connection portions of the memory cell array 11b included in the semiconductor memory device according to the first embodiment.

FIG. 7 is a plan view of a cell portion and WLSG connection portions of the memory cell array 11a included in the semiconductor memory device according to the first embodiment.

FIG. 8 is a cross-sectional view taken along line A1-A2 in FIGS. 6 and 7.

FIG. 9 is a cross-sectional view taken along line B1-B2 in FIGS. 6 and 7.

FIG. 10 is a cross-sectional view taken along line C1-C2 in FIGS. 6 and 7.

FIG. 11 is a cross-sectional view taken along line D1-D2 in FIGS. 6 and 7.

FIG. 12 is a block diagram of a data register and a sense amplifier included in the semiconductor memory device according to the first embodiment.

FIG. 13 is a circuit diagram of a sense amplifier unit included in the semiconductor memory device according to the first embodiment.

FIG. 14 is a timing chart illustrating voltages of interconnects and signals in read operation of the semiconductor memory device according to the first embodiment.

FIG. 15 is a diagram illustrating a state of a NAND string in a period from time t1 to time t2 in FIG. 14.

FIG. 16 is an example diagram illustrating a difference in voltage rise of a word line WL depending on presence or absence of coupling.

FIG. 17 is a timing chart illustrating voltages of interconnects and signals in program operation of the semiconductor memory device according to the first embodiment.

FIG. 18 is a diagram illustrating a state of a NAND string in a period from time t0 to time t1 in FIG. 17.

FIG. 19 is a block diagram illustrating an overall configuration of a semiconductor memory device according to a second embodiment.

FIG. 20 is a plan view illustrating a circuit configuration of a memory cell array included in the semiconductor memory device according to the second embodiment.

FIG. 21 is a perspective view illustrating a circuit configuration of the memory cell array included in the semiconductor memory device according to a second embodiment.

FIG. 22 is a cross-sectional view illustrating arrangement of array chips 10a and 10b and a circuit chip 20 included in the semiconductor memory device according to the second embodiment.

FIG. 23 is a timing chart illustrating voltages of interconnects and signals in read operation of the semiconductor memory device according to the second embodiment.

FIG. 24 is a diagram illustrating a state of one NAND string of a memory cell array 11b in a period from time t1 to time t2 in FIG. 23.

FIG. 25 is a timing chart illustrating voltages of interconnects and signals in program operation of the semiconductor memory device according to the second embodiment.

FIG. 26 is a diagram illustrating a state of a NAND string in a period from time t0 to time t1 in FIG. 25.

FIG. 27 is a timing chart illustrating voltages of interconnects and signals in read operation of the semiconductor memory device according to a first modification of the second embodiment.

FIG. 28 is a diagram illustrating a state of one NAND string of a memory cell array 11b in a period from time t1 to time t2 in FIG. 27.

FIG. 29 is a timing chart illustrating voltages of interconnects and signals in program operation of a semiconductor memory device according to a second modification of the second embodiment.

DETAILED DESCRIPTION

In general, according to one embodiment, a semiconductor memory device includes: a first string in which a first selection transistor, a first memory cell, and a second selection transistor are coupled in series; a second string in which a third selection transistor, a second memory cell, and a fourth selection transistor are coupled in series; a word line coupled to a gate of the first memory cell and a gate of the second memory cell; a first selection gate line coupled to a gate of the first selection transistor; a second selection gate line coupled to a gate of the second selection transistor; a third selection gate line coupled to a gate of the third selection transistor; a fourth selection gate line coupled to a gate of the fourth selection transistor; a first bit line coupled to the first selection transistor; and a second bit line coupled to the third selection transistor. In a read operation of the first memory cell, when a voltage of the word line is raised to a first voltage, a second voltage is applied to the first bit line and a third voltage higher than the second voltage is applied to the second bit line.

Hereinafter, embodiments will be described with reference to the drawings. Note that, in the following description, constituent elements having substantially the same functions and configurations are denoted by the same reference numerals. Repetitive description may be omitted if not needed. In addition, each embodiment described below illustrates a device and a method for embodying a technical idea of the embodiment. The technical idea of the embodiment does not specify the material, shape, structure, arrangement, and the like of components described below. Various modifications can be made to the technical idea of the embodiment without departing from the gist of the invention. Such embodiments and modifications of the embodiments are included in the invention described in claims and the equivalent scope thereof.

1. First Embodiment

First, a semiconductor memory device according to a first embodiment will be described.

1.1 Configuration 1.1.1 Overall Configuration of Semiconductor Memory Device First, an example of the overall configuration of a semiconductor memory device 1 will be described with reference to FIG. 1. FIG. 1 is a block diagram illustrating the overall configuration of the semiconductor memory device 1. Note that some of couplings between respective constituent elements are indicated by arrow lines in FIG. 1. However, couplings between the constituent elements are not limited thereto.

The semiconductor memory device 1 is, for example, a three-dimensional (3D) stacked NAND-type flash memory. The 3D stacked NAND-type flash memory includes a plurality of non-volatile memory cell transistors three-dimensionally arranged on a semiconductor substrate.

As illustrated in FIG. 1, the semiconductor memory device 1 includes a plurality of array chips 10 and a circuit chip 20. The array chip 10 is a chip provided with arrays of non-volatile memory cell transistors. The circuit chip 20 is a chip provided with circuits that controls the array chips 10. The semiconductor memory device 1 of the present embodiment has a structure (hereinafter, also referred to as "bonding structure") in which a plurality of array chips 10 and a circuit chip 20 are bonded together. Note that the semiconductor memory device 1 may not have a bonding structure. Hereinafter, unless the chip is limited to the array chip 10 or the circuit chip 20, it is simply referred to as a "chip". Note that the semiconductor memory device 1 may include a plurality of circuit chips 20.

In the example of FIG. 1, the semiconductor memory device 1 includes two array chips 10*a* and 10*b*. Note that the number of array chips 10 may be three or more. Hereinafter, in a case where any one of the array chips 10*a* and 10*b* is not limited, these chips are referred to as array chips 10.

The array chip 10 includes a memory cell array 11. The memory cell array 11 is a region in which nonvolatile memory cell transistors are three-dimensionally arranged. Hereinafter, in a case where the memory cell array 11 of the array chip 10*a* is limited, the memory cell array 11 is referred to as "memory cell array 11*a*". In a case where the memory cell array 11 of the array chip 10*b* is limited, the memory cell array 11 is referred to as "memory cell array 11*b*".

The memory cell array 11 includes a plurality of blocks BLK. In the example of FIG. 1, the memory cell array 11 includes two blocks BLK0 and BLK1. The block BLK is, for example, a set of a plurality of memory cell transistors from which data is collectively erased. The plurality of memory cell transistors in the block BLK are associated with rows and columns. In the present embodiment, one block BLK is provided in a region where a part of the memory cell array 11*a* and a part of the memory cell array 11*b* are combined. That is, the block BLK includes a plurality of memory cell transistors provided in the memory cell array 11*a* and a plurality of memory cell transistors provided in the memory cell array 11*b*.

The block BLK includes a plurality of string units SU. The string unit SU is, for example, a set of a plurality of NAND strings that are collectively selected in the write operation or the read operation. The NAND string includes a plurality of memory cell transistors directly connected. Note that details of a circuit configuration of the memory cell array 11 will be described later. In the example of FIG. 1, each block BLK includes four string units SU0, SU1, SU2, and SU3. For example, the memory cell array 11*a* (array chip 10*a*) includes the string units SU0 and SU1 of each block BLK. The memory cell array 11*b* (array chip 10*b*) includes the string unit SU2 and the string unit SU3 of each block. Note that the arrangement of the string units SU included in the memory cell array 11*a* and the memory cell array 11*b* is arbitrary.

Next, the circuit chip 20 will be described. The circuit chip 20 includes an address register 21, a command register 22, a sequencer 23, a row driver 24, a row decoder 25, a sense amplifier 26, a data register 27, a column decoder 28, and a source line driver 29.

The address register 21 is a register that temporarily stores address information ADD. The address register 21 receives the address information ADD from an external controller (not illustrated). For example, the address information ADD includes a row address and a column address. The row address is an address designating interconnect in a row direction of the memory cell array 11. The column address is an address that designates interconnect in a column direction of the memory cell array 11. For example, the row address includes a block address and a page address. For example, the block address is used to select the block BLK. Hereinafter, the selected block BLK is referred to as a "selected block BLK". The non-selected block BLK is referred to as a "non-selected block BLK". The page address is used to select the word line WL. Hereinafter, the selected word line WL is referred to as "selected word line WL". The non-selected word lines WL are referred to as "non-selected word lines WL". The column address is used to select any bit line BL. For example, the address register 21 is connected to the row driver 24, the row decoder 25, and the column decoder 28. For example, the address register 21 transmits a page address to the row driver 24. The address register 21 transmits the block address to the row decoder 25. The address register 21 transmits the column address to the column decoder 28.

The command register 22 is a register that temporarily stores a command CMD. The command register 22 receives the command CMD from the external controller. The command register 22 is connected to the sequencer 23. The command register 22 transmits the command CMD to the sequencer 23.

The sequencer 23 is a circuit that controls the entire semiconductor memory device 1. The sequencer 23 is connected to the row driver 24, the row decoder 25, the sense amplifier 26, the data register 27, the column decoder 28, and the source line driver 29. Then, the sequencer 23 controls the row driver 24, the row decoder 25, the sense amplifier 26, the data register 27, the column decoder 28, and the source line driver 29. In addition, the sequencer 23 controls the entire operation of the semiconductor memory device 1 on the basis of the command CMD or the like. More specifically, the sequencer 23 executes a write operation, a read operation, an erase operation, and the like.

The row driver 24 is a driver that supplies voltages to the row decoder 25. The row driver 24 is connected to the row decoder 25. The row driver 24 supplies voltages to the row decoder 25 based on a row address (for example, a page address).

The row decoder 25 is a circuit that decodes the row address. The row decoder 25 selects any block BLK in the memory cell array 11 based on the decoding result of the row address (for example, the block address).

More specifically, the row decoder 25 is connected to the memory cell array 11 through the plurality of word lines WL and a plurality of selection gate lines SGD and SGS. The word line WL is a interconnect used for controlling the memory cell transistor. The selection gate lines SGD and SGS are interconnects used for selecting any string units SU. The row decoder 25 applies voltages supplied from the row driver 24 to the word lines WL and the selection gate lines SGD and SGS corresponding to the selected block BLK.

In the present embodiment, the word line WL of the memory cell array 11a and the word line WL of the memory cell array 11b are commonly connected to the row decoder 25. A selection gate line SGDa of the memory cell array 11a and a selection gate line SGDb of the memory cell array 11b are independently connected to the row decoder 25. A selection gate line SGSa of the memory cell array 11a and a selection gate line SGSb of the memory cell array 11b are independently connected to the row decoder 25. That is, the selection gate line SGDa of the memory cell array 11a and the selection gate line SGDb of the memory cell array 11b are not electrically connected. Similarly, the selection gate line SGSa of the memory cell array 11a and the selection gate line SGSb of the memory cell array 11b are not electrically connected. In other words, the memory cell array 11a and the memory cell array 11b share the word lines WL. The memory cell array 11a and the memory cell array 11b do not share the selection gate lines SGD and SGS. Hereinafter, in a case where one of the selection gate lines SGDa and SGDb is not limited, the selection gate lines are referred to as "selection gate lines SGD". In a case where any one of the selection gate lines SGSa and SGSb is not limited, the selection gate lines are referred to as "selection gate lines SGS".

The sense amplifier 26 is a circuit that writes and reads data. The sense amplifier 26 senses data read from any string unit SU of any block BLK during the read operation. In addition, the sense amplifier 26 supplies voltages corresponding to write data to the corresponding memory cell array 11 during the write operation.

The sense amplifier 26 is connected to the memory cell array 11 through the plurality of bit lines BL. A bit line BLa of the memory cell array 11a and a bit line BLb of the memory cell array 11b are independently connected to the sense amplifier 26. That is, the memory cell array 11a and the memory cell array 11b do not share the bit lines BL. Hereinafter, in a case where any one of the bit lines BLa and BLb is not limited, the bit line is referred to as "bit line BL".

The data register 27 is a register that temporarily stores the data DAT. The data register 27 transmits and receives data DAT to and from an external controller. The data register 27 is connected to the sense amplifier 26. The data register 27 includes a plurality of latch circuits. Each latch circuit temporarily stores data DAT (write data or read data).

The column decoder 28 is a circuit that decodes a column address. The column decoder 28 is connected to the data register 27. The column decoder 28 selects any latch circuits in the data register 27 on the basis of the decoding result of the column address.

The source line driver 29 is a driver that supplies a voltage to a source line SL of the memory cell array 11. In the present embodiment, the source line SL of the memory cell array 11a and the source line SL of the memory cell array 11b are commonly connected to the source line driver 29. In other words, the memory cell array 11a and the memory cell array 11b share the source line SL.

1.1.2 Circuit Configuration of Memory Cell Array

Next, an example of a circuit configuration of the memory cell array 11 will be described with reference to FIGS. 2 and 3. FIG. 2 is a plan view illustrating a circuit configuration of the memory cell array 11. FIG. 3 is a perspective view illustrating a circuit configuration of the memory cell array 11. Although the examples of FIGS. 2 and 3 illustrate the circuit configuration of the block BLK0, the same applies to the other blocks BLK. Hereinafter, a direction in which the word lines WL extend in each array chip 10 is referred to as an X direction. A direction which intersects with the X direction and in which the bit lines BL extend is referred to as a Y direction. A direction intersecting the X direction and the Y direction and in which the array chips 10a and 10b and the circuit chip 20 are stacked is referred to as a Z direction.

As shown in FIG. 2, for example, the block BLK0 includes four string units SU0 to SU3. More specifically, the memory cell array 11a includes the string units SU0 and SU1 of the block BLK0. The memory cell array 11b includes the string units SU2 and SU3 of the block BLK0.

Each string unit SU includes a plurality of NAND strings NS.

The NAND string NS includes a plurality of memory cell transistors MC, and selection transistors ST1 and ST2. In the example of FIG. 2, the NAND string NS includes five memory cell transistors MC0 to MC4. Note that the number of memory cell transistors MC included in the NAND string NS is arbitrary.

The memory cell transistor MC stores data in a nonvolatile manner. The memory cell transistor MC includes a control gate and a charge storage layer. The memory cell transistor MC may be of a metal-oxide-nitride-oxide-silicon (MONOS) type, or of a floating gate (FG) type. In the MONOS type, an insulating layer is used as the charge storage layer. In the FG type, a conductor is used as the charge storage layer. Hereinafter, a case will be described where the memory cell transistor MC is of the MONOS type.

The selection transistors ST1 and ST2 are used for selecting the string units SU during various operations. Hereinafter, the selected string unit SU is referred to as a "selected string unit SU". The non-selected string units SU are referred to as "non-selected string units SU". The number of selection transistors ST1 and ST2 are freely set. It is sufficient that one or more selection transistors ST1 and one or more selection transistors ST2 are included in the NAND string NS.

The current paths of the memory cell transistor MC and the selection transistors ST1 and ST2 in each NAND string NS are connected in series. In the example of FIG. 2, the current paths of the selection transistor ST2, the memory cell transistors MC0 to MC4, and the selection transistor ST2 are connected in series in this order from a lower side to an upper side of the drawing. That is, the selection transistor ST2, the memory cell transistors MC0 to MC4, and the selection transistor ST1 are sequentially connected from the source line SL toward the bit line BL. A drain of the selection transistor ST1 is coupled to any of the bit lines BL. A source of the selection transistor ST2 is coupled to the source line SL.

The control gates of the plurality of memory cell transistors MC0 to MC4 in the block BLK are commonly connected to the word lines WL0 to WL4, respectively. The word line WL is commonly connected to the memory cell transistor MC of the memory cell array 11a and the memory cell transistor MC of the memory cell array 11b. That is, the memory cell array 11a (array chip 10a) and the memory cell array 11b (array chip 10b) share the word lines WL.

In the example of FIG. 2, the plurality of memory cell transistors MC0 of the string units SU0 and SU1 of the memory cell array 11a and the string units SU2 and SU3 of the memory cell array 11b are commonly connected to the word line WL0. Similarly, the other memory cell transistors MC1 to MC4 are connected to the word lines WL1 to WL4, respectively.

In each block BLK, gates of the plurality of selection transistors ST1 in the string unit SU are commonly connected to one selection gate line SGD. In the example of FIG. 2, gates of the plurality of selection transistors ST1 in the string unit SU0 are commonly connected to a selection gate line SGDa0. Similarly, the gates of the plurality of selection transistors ST1 in the string unit SU1 are commonly connected to a selection gate line SGDa1. Gates of the plurality of selection transistors ST1 in the string unit SU2 are commonly connected to a selection gate line SGDb2. Gates of the plurality of selection transistors ST1 in the string unit SU3 are commonly connected to a selection gate line SGDb3.

In each block BLK, gates of the plurality of selection transistors ST2 in the plurality of string units SU of the memory cell array 11a (array chip 10a) are commonly connected to one selection gate line SGSa. Similarly, gates of the plurality of selection transistors ST2 in the plurality of string units SU of the memory cell array 11b (array chip 10b) are commonly connected to one selection gate line SGSb. In the example of FIG. 2, gates of the plurality of selection transistors ST2 in the string units SU0 and SU1 are commonly connected to a selection gate line SGDa. Similarly, gates of the plurality of selection transistors ST2 in the string units SU2 and SU3 are commonly connected to a selection gate line SGDb. That is, the memory cell array 11a and the memory cell array 11b do not share the selection gate line SGS. Like the selection gate line SGD, the selection gate line SGS may be provided for each string unit SU.

The word lines WL0 to WL4 and the selection gate lines SGDa0, SGDa1, SGDb2, SGDb3, SGSa, and SGSb are connected to the row decoder 25.

The memory cell array 11a and the memory cell array 11b are connected to different bit lines BL. More specifically, drains of the plurality of selection transistors ST1 in each string unit SU of the memory cell array 11a are connected to different bit lines BLa. Similarly, drains of the plurality of selection transistors ST1 in each string unit SU of the memory cell array 11b are connected to different bit lines BLb.

In the example of FIG. 2, the string unit SU0 of the memory cell array 11a includes N+1 (N is an integer of 0 or more) NAND strings NS. That is, the string unit SU0 includes N+1 selection transistors ST1. Drains of the N+1 selection transistors ST1 in the string unit SU0 are connected to the N+1 bit lines BLa0 to BLaN, respectively. The same applies to the string unit SU1 of the memory cell array 11a. That is, the string unit SU0 and the string unit SU1 share the bit line BLa.

The string unit SU2 of the memory cell array 11b includes N+1 NAND strings NS. That is, the string unit SU2 includes N+1 selection transistors ST1. Drains of the N+1 selection transistors ST1 in the string unit SU2 are connected to the N+1 bit lines BLb0 to BLbN, respectively. The same applies to the string unit SU3 of the memory cell array 11b. That is, the string unit SU2 and the string unit SU3 share the bit line BLb.

The bit lines BLa0 to BLaN and BLb0 to BLbN are connected to the sense amplifier 26, respectively.

The source line SL is shared among the plurality of blocks BLK of the memory cell arrays 11a and 11b, for example.

Hereinafter, a set of a plurality of memory cell transistors MC coupled to one word line WL in one string unit SU is referred to as a "cell unit CU". For example, in a case where the memory cell transistor MC is a Single Level Cell (SLC) capable of storing 1-bit data, the storage capacity of the cell unit CU is defined as "1-page data". The number of bits of data that can be stored in the memory cell transistor MC is arbitrary. For example, the memory cell transistor MC may be an MLC (Multi Level Cell) capable of storing 2-bit data, a TLC (Triple Level Cell) capable of storing 3-bit data, a QLC (Quad Level Cell) capable of storing 4-bit data, or a PLC (Penta Level Cell) capable of storing 5-bit data. The cell unit CU may have the storage capacity of two or more page data in accordance with the number of bits of data that the memory cell transistor MC stores.

As illustrated in FIG. 3, in the Z direction, the array region (the string units SU2 and SU3) of the block BLK0 of the memory cell array 11b is disposed above the array region (the string units SU0 and SU1) of the block BLK0 of the memory cell array 11a. That is, the NAND string NS of the memory cell array 11a and the NAND string NS of the memory cell array 11b arranged above the NAND string NS are included in the same block BLK.

In the example of FIG. 3, in one block BLK, the memory cell transistors MC arranged side by side in the X direction and the Y direction are commonly connected to one word line WL. In the memory cell array 11a, the NAND strings NS arranged side by side in the Y direction are commonly connected to the bit line BLa. In the memory cell array 11b, the NAND strings NS arranged side by side in the Y direction are commonly connected to the bit line BLb. The memory cell arrays 11a and 11b are commonly connected to one source line SL.

1.1.3 Arrangement of Chips

Next, an example of arrangement of each chip will be described with reference to FIG. 4. FIG. 4 is a cross-sectional view illustrating arrangement of the array chips 10a and 10b and the circuit chip 20. In the example of FIG. 4, one word line WL, one selection gate line SGDa, one selection gate line SGDb, one selection gate line SGSa, one selection gate line SGSb, one bit line BLa, one bit line BLb, and one source line SL are illustrated in order to simplify the description.

Hereinafter, in a case where the Z direction is limited, a direction from the array chip 10 toward the circuit chip 20 is referred to as a Z1 direction, and a direction facing the Z1 direction is referred to as a Z2 direction.

As illustrated in FIG. 4, the array chip 10a is bonded onto the circuit chip 20 in the Z2 direction. Then, the array chip 10*b* is bonded onto the array chip 10*a*. In other words, the circuit chip 20 is bonded to a surface of the array chip 10*a* facing the Z1 direction. Then, the array chip 10*b* is bonded to a surface of the array chip 10*a* facing the Z2 direction. That is, the circuit chip 20, the array chip 10*a*, and the array chip 10*b* are sequentially stacked (bonded) in the Z2 direction.

A row decoder 25, a sense amplifier 26, and a source line driver 29 are provided on the semiconductor substrate 200 of the circuit chip 20.

The memory cell arrays 11*a* and 11*b* are provided in the array chips 10*a* and 10*b*, respectively.

A part of the memory cell array 11*a* and a part of the memory cell array 11*b* arranged side by side in the Z direction configure a block BLK. The word line WL is shared between the memory cell array 11*a* and the memory cell array 11*b*. The selection gate lines SGDa and SGSa are connected to the NAND strings NS of the memory cell array 11*a* and are not connected to the NAND strings NS of the memory cell array 11*b*. The selection gate lines SGDb and SGSb are connected to the NAND strings NS of the memory cell array 11*b* and are not connected to the NAND strings NS of the memory cell array 11*a*. The source line SL is shared by the memory cell array 11*a* and the memory cell array 11*b*.

1.1.4 Arrangement of Memory Cell Arrays

Next, an example of the arrangement of the memory cell array 11 will be described with reference to FIG. 5. FIG. 5 is a perspective view illustrating arrangement of the memory cell arrays 11*a* and 11*b* and the circuit chip 20. In the example of FIG. 5, one word line WL, one selection gate line SGDa, one selection gate line SGDb, one selection gate line SGSa, and one selection gate line SGSb are illustrated in order to simplify the description. The source line SL is omitted.

As illustrated in FIG. 5, each of the memory cell arrays 11*a* and 11*b* includes cell portions, a WLSG connection portion, and a BL connection portion.

The cell portion is a region in which the memory cell transistor MC is disposed.

A WLSG connection portion is a region where contact plugs, interconnects, and the like that connect the word line WL and the selection gate lines SGD and SGS in the memory cell array 11 and the row decoder 25 are provided. The word lines WL of the memory cell arrays 11*a* and 11*b* are commonly connected to the row decoder 25 of the circuit chip 20 through respective WLSG connection portions. More specifically, the word line WL provided in the memory cell array 11*a* is connected to the row decoder 25 through the WLSG connection portion of the memory cell array 11*a*. The word line WL provided in the memory cell array 11*b* is electrically connected to the word line WL provided in the memory cell array 11*a* at the WLSG connection portion of the memory cell array 11*a*. The selection gate line SGDa is connected to the row decoder 25 through the WLSG connection of the memory cell array 11*a*. The selection gate line SGDb is connected to the row decoder 25 through the WLSG connection of the memory cell array 11*b* and the WLSG connection of the memory cell array 11*a*. Similarly, the selection gate line SGSa is connected to the row decoder 25 through the WLSG connection portion of the memory cell array 11*a*. The selection gate line SGSb is connected to the row decoder 25 through a WLSG connection of the memory cell array 11*b* and a WLSG connection of the memory cell array 11*a*.

The BL connection portion is a region where contact plugs, interconnects, and the like that connect the plurality of bit lines BL and the sense amplifier 26 are provided. The bit line BLa is connected to the sense amplifier 26 through the BL connection portion of the memory cell array 11*a*. In addition, the bit line BLb is connected to the sense amplifier 26 through the BL connection portion of the memory cell array 11*b* and the BL connection portion of the memory cell array 11*a*.

For example, a WLSG connection portion is provided at an end of the memory cell array 11 in the X direction. The cell portion is divided into two parts in the Y direction, for example. A BL connection portion is provided between the two cell portions arranged in the Y direction. The arrangement of the cell portion, the WLSG connection portion, and the BL connection portion is arbitrary. For example, a BL connection portion may be provided at an end of the memory cell array 11 in the Y direction. In addition, a plurality of BL connection portions may be provided in units of one or a plurality of bit lines BL. In this case, a plurality of BL connection portions may be arranged so as to be interspersed in the cell portion. For example, the WLSG connection portions may be provided at both ends of the memory cell array 11 in the X direction. Further, the cell portion may be divided into two parts in the X direction, and the WLSG connection portion may be provided between the two cell portions arranged in the X direction.

Each bit line BL in the memory cell array 11 extends in the Y direction. The two cell portions arranged in the Y direction share the bit lines BL. For example, each of the bit lines BLb0 to BLb3 of the memory cell array 11*b* is connected to a contact plug extending in the Z direction at the BL connection portion of the memory cell array 11*b*. Then, the contact plug passes through the BL connection portion of the memory cell array 11*a* and is connected to the sense amplifier 26.

For example, each of the bit lines BLa0 to BLa3 of the memory cell array 11*a* is connected to a contact plug extending in the Z direction at the BL connection portion of the memory cell array 11*a*. Each of the bit lines BLa0 to BLa3 is connected to the sense amplifier 26 through a contact plug. In the example of FIG. 5, each of the bit lines BLa0 to BLa3 is arranged so as to bypass the contact plugs connected to the bit lines BLb0 to BLb3, respectively, in the BL connection portion. The layout of the bit lines BL are arbitrary.

1.1.5 Planar Configuration of Cell Portion and WLSG Connection Portion

Next, an example of a configuration of the cell portion and the WLSG connection portion will be described with reference to FIGS. 6 and 7. FIG. 6 is a plan view of the cell portion and the WLSG connection portion of the memory cell array 11*b*. FIG. 7 is a plan view of the cell portion and the WLSG connection portion of the memory cell array 11*a*. Note that the examples of FIGS. 6 and 7 illustrate a case where the WLSG connection portions are provided at both ends of the memory cell array 11 in the X direction. Furthermore, in order to simplify the description, the examples of FIGS. 6 and 7 illustrate a case where one cell unit of each memory cell array 11 includes four blocks BLK0 to BLK3 and each block BLK includes one string units SU. In the examples of FIGS. 6 and 7, an insulating layer is omitted.

First, a planar configuration of the cell portion and the WLSG connection portion of the memory cell array 11*b* will be described.

As illustrated in FIG. 6, four blocks BLK0 to BLK3 are arranged in the Y direction from an upper side to a lower side of the drawing. In each block BLK, a plurality of interconnect layers 102 are stacked apart from each other in the Z direction. In the example of FIG. 6, the seven interconnect layers 102 are stacked. Each of the interconnect layers 102 functions as (is included in) a corresponding one of the selection gate line SGS, the word lines WL0 to WL4, and the selection gate line SGD. Each interconnect layer 102 extends in the X direction. Slits SLT are formed on the respective two side surfaces, facing the Y direction, of each interconnect layer 102. The slit SLT extends in the X direction and the Z direction. The slit SLT separates the interconnect layers 102 for each block BLK.

The cell portion is provided with a plurality of memory pillars MP. The memory pillar MP corresponds to the NAND string NS. Details of the structure of the memory pillar MP will be described later. The memory pillar MP has a substantially columnar shape and extends in the Z direction. The memory pillar MP penetrates (passes through) the plurality of interconnect layers 102 stacked in the Z direction.

In the example of FIG. 6, the plurality of memory pillars MP in the block BLK are arranged in a staggered manner in two rows in the X direction. Note that an array of the memory pillars MP can be freely designed. The arrangement of the memory pillars MP may be, for example, a staggered arrangement of eight or more columns. In addition, the array of the memory pillars MP may not be the staggered arrangement.

A plurality of bit lines BLb are arranged side by side in the X direction above the memory pillars MP. The bit line BLb extends in the Y direction. The memory pillars MP of each block BLK are each electrically coupled to any of the bit lines BLb.

The WLSG connection portion of the memory cell array 11b includes a CP1 region. In the example of FIG. 6, in the case of the blocks BLK0 and BLK2, the CP1 region is provided in the WLSG connection portion on the left side of the drawing. In the case of the blocks BLK1 and BLK3, the CP1 region is provided in the WLSG connection portion on the right side of the drawing.

The CP1 region is a region in which a plurality of contact plugs CP1 are provided. The contact plug CP1 extends in the Z direction. The contact plug CP1 is electrically connected to any one of the interconnect layers 102 stacked apart from each other in the Z direction. The contact plug CP1 is not electrically coupled to any other interconnect layers 102 except the one interconnect layer 102. In the example of FIG. 6, seven contact plugs CP1 are provided in one CP1 region. The seven contact plugs CP1 are coupled to the respective seven interconnect layers 102 stacked spaced apart from each other in the Z direction. Hereinafter, in a case where the contact plug CP1 connected to the interconnect layer 102 corresponding to the word line WL0 is limited, the contact plug is referred to as a "contact plug CP1_$w$0". In a case where the contact plug CP1 connected to the interconnect layer 102 corresponding to the word line WL1 is limited, the contact plug is referred to as a "contact plug CP1_$w$1". In a case where the contact plug CP1 connected to the interconnect layer 102 corresponding to the word line WL2 is limited, the contact plug is referred to as a "contact plug CP1_$w$2". In a case where the contact plug CP1 connected to the interconnect layer 102 corresponding to the word line WL3 is limited, the contact plug is referred to as a "contact plug CP1_$w$3". In a case where the contact plug CP1 connected to the interconnect layer 102 corresponding to the word line WL4 is limited, the contact plug is referred to as a "contact plug CP1_$w$4". In a case where the contact plug CP1 connected to the interconnect layer 102 corresponding to the selection gate line SGD is limited, the contact plug is denoted as a "contact plug CP1_$d$". In a case where the contact plug CP1 connected to the interconnect layer 102 corresponding to the selection gate line SGS is limited, the contact plug is denoted as a "contact plug CP1_$s$". In the example of FIG. 6, the contact plugs CP1_$s$, CP1_$w$0, CP1_$w$1, CP1_$w$2, CP1_$w$3, CP1_$w$4, and CP1_$d$ are arranged in this order from an end in the X direction of the memory cell array 11b toward the cell portion. Note that the arrangement of the contact plugs CP1 in each CP1 region is freely set. For example, the contact plugs CP1 may be arranged in two rows along the X direction.

Interconnect layers 111 are provided on the contact plugs CP1. The interconnect layer 111 extends from a coupling position with the contact plug CP1 to the block BLK adjacent in the Y direction. More specifically, the interconnect layer 111 provided on the contact plug CP1 of the block BLK0 extends to the block BLK1. The interconnect layer 111 provided on the contact plug CP1 of the block BLK1 extends to the block BLK0. The interconnect layer 111 provided on the contact plug CP1 of the block BLK2 extends to the block BLK3. The interconnect layer 111 provided on the contact plug CP1 of the block BLK3 extends to the block BLK2.

An electrode pad PD is provided above an end of the interconnect layer 111. More specifically, one end portion of the interconnect layer 111 is connected to the contact plug CP1, and the other end portion is electrically connected to the electrode pad PD. The electrode pad PD is used for electrical coupling with another chip.

Next, a planar configuration of the memory cell array 11a will be described. Hereinafter, differences from the planar configuration of the memory cell array 11b will be mainly described.

As illustrated in FIG. 7, the configuration of the cell portion is similar to that of the memory cell array 11b. A plurality of bit lines BLa are arranged side by side in the X direction above the memory pillars MP. The bit line BLa extends in the Y direction. The memory pillar MP of each block BLK is electrically connected to any of the bit lines BLa.

The WLSG connection portion of the memory cell array 11a includes a CP1 region and a CP2 region. In the example of FIG. 7, in the case of the blocks BLK0 and BLK2, the CP1 region is provided in the WLSG connection portion on the left side of the drawing, and the CP2 region is provided in the WLSG connection portion on the right side of the drawing. In the case of the blocks BLK1 and BLK3, the CP1 region is provided in the WLSG connection portion on a right side of the drawing, and the CP2 region is provided in the WLSG connection portion on a left side of the drawing.

The arrangement of the contact plug CP1 in the CP1 region is similar to that of the memory cell array 11b. For example, the CP1 region of the memory cell array 11a is arranged above the CP1 region of the memory cell array 11b in the Z direction. For example, the contact plug CP1_$s$ of the memory cell array 11a is arranged above the contact plug CP1_$s$ of the memory cell array 11b in the Z direction. The same applies to the other contact plugs CP1_$w$0, CP1_$w$1, CP1_$w$2, CP1_$w$3, CP1_$w$4, and CP1_$d$.

The CP2 region is a region in which a plurality of contact plugs CP2 are provided. The contact plug CP2 extends in the Z direction. The contact plug CP2 is used for electrical connection with another array chip 10. For example, the contact plug CP2 of the memory cell array 11a is arranged above the electrode pad PD electrically connected to the contact plug CP1 of the memory cell array 11b in the Z direction. The contact plug CP2 penetrates the memory cell array 11a. The contact plug CP2 is not electrically connected to the interconnect layer 102 of the memory cell array 11*a*. The contact plug CP2 is electrically connected to the contact plug CP1 of the memory cell array 11*b* through the electrode pad PD and the interconnect layer 111 of the array chip 10*b* described with reference to FIG. 6.

More specifically, for example, the contact plug CP2 provided in the CP2 region of the block BLK0 is electrically connected to the contact plug CP1 provided in the CP1 region of the block BLK1 of the memory cell array 11*b*. The contact plug CP2 provided in the CP2 region of the block BLK1 is electrically connected to the contact plug CP1 provided in the CP1 region of the block BLK0 of the memory cell array 11*b*. The contact plug CP2 provided in the CP2 region of the block BLK2 is electrically connected to the contact plug CP1 provided in the CP1 region of the block BLK3 of the memory cell array 11*b*. The contact plug CP2 provided in the CP2 region of the block BLK3 is electrically connected to the contact plug CP1 provided in the CP1 region of the block BLK2 of the memory cell array 11*b*.

In the example of FIG. 7, seven contact plugs CP2 are provided in one CP2 region. The seven contact plugs CP2 correspond to the seven contact plugs CP1 in one CP1 region of the memory cell array 11*b*, respectively. Hereinafter, in a case where the contact plugs CP2 connected to the contact plugs CP1_*w*0, CP1_*w*1, CP1_*w*2, CP1_*w*3, and CP1_*w*4 of the memory cell array 11*b* are limited, the contact plugs are referred to as contact plugs CP2_*w*0, CP2_*w*1, CP2_*w*2, CP2_*w*3, and CP2_*w*4, respectively. In a case where the contact plugs CP2 connected to the contact plugs CP1_*d* and CP1_*s* of the memory cell array 11*b* are limited, the contact plugs are denoted as contact plugs CP2_*d* and CP2_*s*, respectively.

An interconnect layer 111 is provided on each of the contact plugs CP1 and CP2. The contact plugs CP1_*w*0 to CP1_*w*4 are respectively connected to the contact plugs CP2_*w*0 to CP2_*w*4 of the adjacent blocks BLK through the interconnect layer 111. In addition, different interconnect layers 111 are provided on the contact plug CP1_*d* and the contact plug CP2_*d*. That is, the contact plug CP1_*d* and the contact plug CP2_*d* are not electrically connected. Similarly, different interconnect layers 111 are provided on the contact plug CP1_*s* and the contact plug CP2_*s*. That is, the contact plug CP1_*s* and the contact plug CP2_*s* are not electrically connected.

More specifically, for example, the contact plugs CP1_*w*0 to CP1_*w*4 provided in the block BLK0 are electrically connected to the contact plugs CP2_*w*0 to CP2_*w*4 provided in the block BLK1, respectively. The contact plugs CP1_*w*0 to CP1_*w*4 provided in the block BLK1 are electrically connected to the contact plugs CP2_*w*0 to CP2_*w*4 provided in the block BLK0, respectively. The contact plugs CP1_*w*0 to CP1_*w*4 provided in the block BLK2 are electrically connected to the contact plugs CP2_*w*0 to CP2_*w*4 provided in the block BLK3, respectively. The contact plugs CP1_*w*0 to CP1_*w*4 provided in the block BLK3 are electrically connected to the contact plugs CP2_*w*0 to CP2_*w*4 provided in the block BLK2, respectively.

That is, the word lines WL0 to WL4 of the block BLK0 of the memory cell array 11*a* are electrically connected to the word lines WL0 to WL4 of the block BLK0 of the memory cell array 11*b*, respectively. Then, the selection gate lines SGDa and SGSa of the block BLK0 of the memory cell array 11*a* are not electrically connected to the selection gate lines SGDb and SGSb of the block BLK0 of the memory cell array 11*b*. The same applies to other blocks BLK.

Similarly to the memory cell array 11*b*, an electrode pad PD is provided above the interconnect layer 111. The interconnect layer 111 is electrically connected to the electrode pad PD.

1.1.6 Cross-Sectional Configurations of Cell Portion and WLSG Connecting Portion Next, cross-sectional configurations of the cell portion and the WLSG connection portion will be described.

1.1.6.1 Configuration of WLSG Connection Portion

First, an example of a configuration of the WLSG connection portion will be described with reference to FIG. 8. FIG. 8 is a cross-sectional view taken along line A1-A2 in FIGS. 6 and 7.

As illustrated in FIG. 8, the semiconductor memory device 1 has a bonding structure in which the array chips 10*a* and 10*b* and the circuit chip 20 are attached. The chips are electrically connected to each other through electrode pads PD provided on the chips.

First, the internal configuration of the array chip 10*a* will be described.

The array chip 10*a* includes a memory cell array 11*a* and various interconnect layers for connecting to other chips.

The array chip 10*a* includes insulating layers 101, 105, 107, 110, 115, and 117, interconnect layers 102, 104, 111, and 113, a semiconductor layer 103, and conductors 106, 108, 109, 112, 114, 116, and 118.

In the memory cell array 11*a*, a plurality of insulating layers 101 and a plurality of interconnect layers 102 are alternately stacked one by one. In the example of FIG. 8, seven interconnect layers 102 functioning as the selection gate line SGSa, the word lines WL0 to WL4, and the selection gate line SGDa are sequentially stacked in the Z1 direction. Hereinafter, in a case where specifying the interconnect layers 102 functioning as the word lines WL0, WL1, WL2, WL3, and WL4, the layers are referred to as interconnect layers 102_*w*0, 102_*w*1, 102_*w*2, 102_*w*3, and 102_*w*4, respectively. In a case where specifying the interconnect layers 102 functioning as the selection gate lines SGD and SGS, the interconnect layers are referred to as interconnect layers 102_*d* and 102_*s*, respectively. That is, the interconnect layers 102_*s*, 102_*w*0, 102_*w*1, 102_*w*2, 102_*w*3, 102_*w*4, and 102_*d* are stacked apart from each other in the Z1 direction.

The insulating layer 101 may contain, for example, silicon oxide (SiO). The interconnect layer 102 contains a conductive material. The conductive material may include a metal material, an n-type semiconductor, or a p-type semiconductor. As the conductive material of the interconnect layer 102, for example, a stacked structure of titanium nitride (TiN)/tungsten (W) is used. In this case, TiN is formed so as to cover W. Note that the interconnect layer 102 may contain a high dielectric constant material such as aluminum oxide (AlO). In this case, the high dielectric constant material may be formed so as to cover the conductive material.

The plurality of interconnect layers 102 are separated for each block BLK by the slits SLT extending in the X direction. The slit SLT is filled with the insulating layer 105. The insulating layer 105 may contain SiO.

In the Z2 direction, the semiconductor layer 103 is provided above the interconnect layer 102_*s*. The insulating layer 101 is provided between the interconnect layer 102 and the semiconductor layer 103. The semiconductor layer 103 functions as source line SL. In the Z2 direction, the interconnect layer 104 is provided on the semiconductor layer 103. The interconnect layer 104 is used as an interconnect layer for electrically connecting the semiconductor layer 103 to another chip. The interconnect layer 104 includes a conductive material. The conductive material may include a metal material, an n-type semiconductor, or a p-type semiconductor.

The contact plug CP1 is provided on a surface of each interconnect layer 102 facing the Z1 direction. The contact plug CP1 has, for example, a cylindrical shape. The contact plug CP1 includes the conductor 106 and the insulating layer 107. The conductor 106 has, for example, a columnar shape. One end of the conductor 106 is in contact with any of the interconnect layers 102. The insulating layer 107 is provided so as to cover a side surface (outer periphery) of the conductor 106. The insulating layer 107 has, for example, a cylindrical shape. The side surface of the conductor 106 is not electrically coupled with other interconnect layers 102 by the insulating layer 107. The conductor 106 may contain W, Cu (copper), Al (aluminum), or the like. The insulating layer 107 may contain SiO.

In the example of FIG. 8, the contact plug CP1_w4 is provided on the interconnect layer 102_w4 in the Z1 direction. The contact plug CP1_w4 passes (penetrates) through the interconnect layer 102_d. The contact plug CP1_w4 is electrically connected to the interconnect layer 102_w4 and is not electrically connected to the interconnect layer 102_d.

The contact plug CP2 penetrates the plurality of interconnect layers 102. The contact plug CP2 has, for example, a cylindrical shape. The contact plug CP2 includes the conductor 109 and the insulating layer 110. The conductor 109 has, for example, a columnar shape. The insulating layer 110 is provided so as to cover a side surface (outer periphery) of the conductor 109. The insulating layer 110 has, for example, a cylindrical shape. The conductor 109 is not electrically connected to the interconnect layer 102 by the insulating layer 110.

The semiconductor layer 103 and the interconnect layer 104 are not provided in the CP2 region where the contact plug CP2 is provided. The conductor 108 is provided above the interconnect layer 102_s in the Z2 direction. The insulating layer 101 is provided between the interconnect layer 102 and the conductor 108. The conductor 108 is in contact with (electrically coupled to) one end of the contact plug CP2.

The interconnect layer 111 is provided above the interconnect layer 102_d in the Z1 direction. The interconnect layer 111 extends in the Y direction. The insulating layer 101 is provided between the interconnect layer 102 and the interconnect layer 111. The interconnect layer 111 contains a conductive material. The conductive material may include W, Cu, Al, or the like.

For example, the interconnect layer 111 (electrically) connects an end in the Z1 direction of the contact plug CP1 connected to the interconnect layer 102 functioning as the word line WL and an end in the Z1 direction of the contact plug CP2 provided in the block BLK adjacent in the Y direction. The contact plugs CP1 and CP2 coupled to the interconnect layer 111 are arranged side by side along the Y direction. In the example of FIG. 8, the contact plug CP1_w4 provided in the block BLK0 and the contact plug CP2_w4 provided in the block BLK1 are connected to the interconnect layer 111 disposed so as to straddle the blocks BLK0 and BLK1. In addition, the contact plug CP1_w4 provided in the block BLK2 and the contact plug CP2_w4 provided in the block BLK3 are connected to the interconnect layer 111 disposed so as to cross the blocks BLK2 and BLK3.

In the Z1 direction, the conductor 112 is provided on the interconnect layer 111. The conductor 112 has, for example, a cylindrical shape. The conductor 112 functions as a contact plug CP3. The conductor 112 may include a metal material such as W, Al, or Cu.

In the Z1 direction, the interconnect layer 113 is provided on the contact plug CP3. The interconnect layer 113 may contain a metal material such as W, Al, or Cu.

In the Z1 direction, the conductor 114 is provided on the interconnect layer 113. The conductor 114 has, for example, a cylindrical shape. The conductor 114 functions as a contact plug CP4. The conductor 114 may include a metal material such as W, Al, or Cu.

In the Z1 direction, the insulating layer 115 is provided on the insulating layer 101. The insulating layer 115 may contain SiO.

A plurality of conductors 116 is provided in the same layer as the insulating layer 115. The conductor 116 functions as an electrode pad PD. For example, one conductor 116 is provided on one contact plug CP4. The conductor 116 may contain Cu. In the example of FIG. 8, the case where one interconnect layer 113 is provided between the conductor 116 and the interconnect layer 111 has been described, but the present invention is not limited thereto. The number of interconnect layers provided between the conductor 116 and the interconnect layer 111 is arbitrary.

In the Z2 direction, the insulating layer 117 is provided on the interconnect layer 104, the insulating layer 101, and the conductor 108. The insulating layer 117 may contain SiO.

A plurality of conductors 118 is provided in the same layer as the insulating layer 117. The conductor 118 functions as an electrode pad PD. For example, one conductor 108 is provided on one conductor 118. The conductor 118 may contain Cu.

Next, an internal configuration of the array chip 10b will be described. Hereinafter, differences from the array chip 10a will be mainly described.

In the array chip 10b, the contact plug CP2, the conductor 108, and the conductor 118 described in the configuration of the array chip 10a are eliminated. Other configurations are similar to those of the array chip 10a. The conductor 116 of the array chip 10b is in contact with (bonded to) the conductor 118 of the array chip 10a.

For example, the interconnect layer 102 functioning as the word line WL of the memory cell array 11b is electrically connected to the interconnect layer 102 functioning as the word line WL of the memory cell array 11a through the contact plug CP1, the interconnect layer 111, the contact plug CP3, the interconnect layer 113, the contact plug CP4, and the conductor 116 of the array chip 10b, and the conductor 118, the conductor 108, the contact plug CP2, the interconnect layer 111, and the contact plug CP1 of the array chip 10a.

In the example of FIG. 8, the interconnect layer 102_w4 of the block BLK0 of the memory cell array 11b and the interconnect layer 102_w4 of the block BLK0 of the memory cell array 11a are electrically connected. In other words, the word line WL4 of the memory cell array 11b and the word line WL4 of the memory cell array 11a disposed above in the Z1 direction are electrically connected. At this time, the contact plug CP1_w4 of the memory cell array 11b and the contact plug CP1_w4 of the memory cell array 11a arranged above in the Z1 direction are electrically connected. The same applies to other word lines WL. Note that the contact plug CP2 and the conductor 108 may be provided in the memory cell array 11b.

Next, the circuit chip 20 will be described.

The circuit chip 20 includes a plurality of transistors Tr and various interconnect layers. The plurality of transistors Tr are used for the address register 21, the command register 22, the sequencer 23, the row driver 24, the row decoder 25, the sense amplifier 26, the data register 27, the column decoder 28, the source line driver 29, and the like.

More specifically, the circuit chip 20 includes insulating layers 201, 202, and 209, gate electrodes 203, conductors 204, 206, 208, and 210, and interconnect layers 205 and 207.

Element isolation regions are provided in the vicinity of a surface of the semiconductor substrate 200. The element isolation region electrically isolates an n-type well region and a p-type well region provided in the vicinity of the surface of the semiconductor substrate 200, for example. The element isolation region is filled with the insulating layer 201. The insulating layer 201 may contain SiO.

The insulating layer 202 is provided on the semiconductor substrate 200. The insulating layer 202 may contain SiO.

The transistor Tr includes a gate insulating film (not illustrated) provided on the semiconductor substrate 200, the gate electrode 203 provided on the gate insulating film, and a source and a drain (not illustrated) formed in the semiconductor substrate 200. The source and the drain are each electrically coupled to the interconnect layer 205 via the conductor 204. The conductor 204 extends in the Z2 direction. The conductor 204 functions as a contact plug. The conductor 206 is provided on the interconnect layer 205. The conductor 206 extends in the Z2 direction. The conductor 206 functions as a contact plug. The interconnect layer 207 is provided on the conductor 206. The conductor 208 is provided on the interconnect layer 207. The conductor 208 extends in the Z2 direction. The conductor 208 functions as a contact plug. The interconnect layers 205 and 207 are made of a conductive material. The conductors 204, 206, and 208, and the interconnect layers 205 and 207 may contain a metal material, a p-type semiconductor, or an n-type semiconductor. Note that the number of interconnect layers provided in the circuit chip 20 is freely set.

The insulating layer 209 is provided on the insulating layer 202 in the Z2 direction. The insulating layer 209 may contain SiO.

A plurality of conductors 210 is provided in the same layer as the insulating layer 209. The conductor 210 functions as an electrode pad PD. For example, one conductor 210 is provided on one conductor 208. The conductor 210 may contain a metal material such as Cu. The conductor 210 of the circuit chip 20 is in contact with (electrically connected to) the conductor 116 of the array chip 10a.

1.1.6.2 Configuration of CP1 Region

Next, an example of the configuration of the CP1 region will be described with reference to FIG. 9. FIG. 9 is a cross-sectional view taken along line B1-B2 in FIGS. 6 and 7. Hereinafter, description will be given focusing on the configurations of the contact plugs CP1.

As illustrated in FIG. 9, the contact plugs CP1_s, CP1_w0 to CP1_w4, and CP1_d are provided in the memory cell arrays 11a and 11b, respectively. In the example of FIG. 9, the contact plugs CP1_s, CP1_w0 to CP1_w4, and CP1_d are arranged in this order from the right side to the left side in the drawing. One ends of the contact plugs CP1_s, CP1_w0 to CP1_w4, and CP1_d are in contact with (electrically coupled to) the interconnect layers 102_s, 102_w0 to 102_w4, and 102_d, respectively. In addition, the other ends of the contact plugs CP1_s, CP1_w0 to CP1_w4, and CP1_d are in contact with (electrically coupled to) different interconnect layers 111. Therefore, lengths of the contact plugs CP1_s, CP1_w0 to CP1_w4, and CP1_d in the Z direction are different from each other.

More specifically, the contact plug CP1_s penetrates six interconnect layers 102_w0 to 102_w4, and 102_d. An end of the contact plug CP1_s in the Z2 direction is electrically connected to the interconnect layer 102_s. The contact plug CP1_s is not electrically coupled to the six interconnect layers 102_w0 to 102_w4 and 102_d.

The contact plug CP1_w0 penetrates five interconnect layers 102_w1 to 102_w4 and 102_d. An end of the contact plug CP1_w0 in the Z2 direction is electrically connected to the interconnect layer 102_w0. The contact plug CP1_w0 is not electrically coupled to the five interconnect layers 102_w1 to 102_w4 and 102_d.

The contact plug CP1_w1 penetrates four interconnect layers 102_w2 to 102_w4 and 102_d. An end of the contact plug CP1_w1 in the Z2 direction is electrically connected to the interconnect layer 102_w1. The contact plug CP1_w1 is not electrically coupled to the four interconnect layers 102_w2 to 102_w4 and 102_d.

The contact plug CP1_w2 penetrates three interconnect layers 102_w3, 102_w4, and 102_d. An end of the contact plug CP1_w2 in the Z2 direction is electrically connected to the interconnect layer 102_w2. The contact plug CP1_w2 is not electrically coupled to the three interconnect layers 102_w3, 102_w4, and 102_d.

The contact plug CP1_w3 penetrates two interconnect layers 102_w4 and 102_d. An end of the contact plug CP1_w3 in the Z2 direction is electrically connected to the interconnect layer 102_w3. The contact plug CP1_w3 is not electrically coupled to the two interconnect layers 102_w4 and 102_d.

The contact plug CP1_w4 penetrates the interconnect layer 102_d. An end of the contact plug CP1_w4 in the Z2 direction is electrically connected to the interconnect layer 102_w4. The contact plug CP1_w4 is not electrically coupled to the interconnect layer 102_d.

An end of the contact plug CP1_d in the Z2 direction is electrically connected to the interconnect layer 102_d. In the memory cell array 11a, the interconnect layer 111 to which the contact plug CP1_d is connected is not electrically connected to the contact plug CP2_d. The interconnect layer 111, the conductor 112 (contact plug CP3), the interconnect layer 113, the conductor 114 (contact plug CP4), and the conductor 116 (electrode pad PD) are disposed on the contact plugs CP1_d and CP1_s along the Z1 direction.

1.1.6.3 Configuration of CP2 Region

Next, an example of the configuration of the CP2 region will be described with reference to FIG. 10. FIG. 10 is a cross-sectional view taken along line C1-C2 in FIGS. 6 and 7. Hereinafter, description will be given focusing on the configurations of the contact plugs CP2.

As illustrated in FIG. 10, the array chip 10a is provided with the contact plugs CP2_s, CP2_w0 to CP2_w4, and CP2_d. In the example of FIG. 10, the contact plugs CP2_s, CP2_w0 to CP2_w4, and CP2_d are arranged in this order from the right side to the left side in the drawing. The contact plugs CP2_s, CP2_w0 to CP2_w4, and CP2_d have substantially the same shape (the same length). The contact plugs CP2_s, CP2_w0 to CP2_w4, and CP2_d penetrate seven interconnect layers 102_s, 102_w0 to 102_w4, and 102_d. The contact plugs CP2_s, CP2_w0 to CP2_w4, and CP2_d are not electrically coupled to the seven interconnect layers 102_s, 102_w0 to 102_w4, and 102_d. One ends of the contact plugs CP2_s, CP2_w0 to CP2_w4, and CP2_d are coupled to different conductors 108. The other ends of the contact plugs CP2_s, CP2_w0 to CP2_w4, and CP2_d are coupled to different interconnect layers 111. The interconnect layer 111 to which the contact plugs CP2_w0 to CP2_w4 are connected is connected to the contact plugs CP1_w0 to CP1_w4, respectively. The interconnect layer 111 to which the contact plug CP2_d is connected is not electrically connected to the contact plug CP1_d. Similarly, the interconnect layer 111 to which the contact plug CP2_s is connected is not electrically connected to the contact plug CP1_s. The interconnect layer 111, the conductor 112 (contact plug CP3), the interconnect layer 113, the conductor 114 (contact plug CP4), and the conductor 116 (electrode pad PD) are disposed on each contact plug CP2 along the Z1 direction.

1.1.6.4 Configuration of Cell Portion

Next, an example of a configuration of the cell portion will be described with reference to FIG. 11. FIG. 11 is a cross-sectional view taken along line D1-D2 in FIGS. 6 and 7. Hereinafter, description will be given focusing on the configurations of the memory pillar MP and the bit line BL.

As illustrated in FIG. 11, each of the array chips 10a and 10b is provided with the plurality of memory pillars MP.

The memory pillar MP penetrates the plurality of interconnect layers 102. The memory pillar MP extends in the Z direction. An end of the memory pillar MP in the Z2 direction is in contact with the semiconductor layer 103. In the Z1 direction, the conductor 126 is provided on an end of the memory pillar MP. For example, the conductor 126 has a substantially columnar shape. The conductor 126 functions as a contact plug CP5. A conductor 127 is provided on the conductor 126. For example, the conductor 127 has a substantially columnar shape. The conductor 127 functions as a contact plug CP6. A plurality of interconnect layers 128 are provided above the memory pillars MP in the Z1 direction. The interconnect layer 128 extends in the Y direction. The plurality of interconnect layers 128 are arranged side by side in the X direction. The interconnect layer 128 of the memory cell array 11a functions as a bit line BLa. The interconnect layer 128 of the memory cell array 11b functions as a bit line BLb. The interconnect layer 128 is electrically connected to any of the memory pillars MP through the contact plugs CP5 and CP6.

The conductor 126 and 127, and the interconnect layer 128 may contain a metal material such as W, Al, Cu, or the like.

Next, the internal configuration of the memory pillar MP will be described.

The memory pillar MP includes a block insulating film 120, a charge storage layer 121, a tunnel insulating film 122, a semiconductor layer 123, a core layer 124, and a cap layer 125.

More specifically, a hole MH that penetrates the plurality of interconnect layers 102 is formed. The hole MH corresponds to the memory pillar MP. An end of the hole MH in the Z2 direction reaches the semiconductor layer 103. On a side surface of the hole MH, the block insulating film 120, the charge storage layer 121, and the tunnel insulating film 122 are stacked in this order from the outside. For example, when the hole MH has a cylindrical shape, the block insulating film 120, the charge storage layer 121, and the tunnel insulating film 122 each have a cylindrical shape. The semiconductor layer 123 is provided so as to be in contact with a side surface of the tunnel insulating film 122. An end of the semiconductor layer 123 in the Z2 direction is in contact with the semiconductor layer 103. The semiconductor layer 123 is a region in which channels of the memory cell transistors MC and the selection transistors ST1 and ST2 are formed. Therefore, the semiconductor layer 123 functions as a signal line that couples the current paths of the selection transistor ST2, the memory cell transistors MC0 to MC4, and the selection transistor ST1. The semiconductor layer 123 is filled with the core layer 124. A cap layer 125, a side surface of which is in contact with the tunnel insulating film 122, is provided on ends of the semiconductor layer 123 and the core layer 124 in the Z1 direction. That is, the memory pillar MP includes the semiconductor layer 123 that passes through the plurality of interconnect layers 102 and extends in the Z direction.

The block insulating film 120, the tunnel insulating film 122, and the core layer 124 may contain SiO. The charge storage layer 121 may include silicon nitride (SiN). The semiconductor layer 123 and the cap layer 125 may include, for example, polysilicon.

The memory cell transistors MC0 to MC4 are configured by combining the memory pillar MP and the interconnect layers 102_w0 to 102_w4, respectively. Similarly, the selection transistor ST1 is configured by combining the memory pillar MP and the interconnect layer 102_d. The selection transistor ST2 is configured by combining the memory pillar MP and the interconnect layer 102_s.

1.1.7 Configuration of Data Register and Sense Amplifier

Next, an example of configurations of the data register 27 and the sense amplifier 26 will be described with reference to FIG. 12. FIG. 12 is a block diagram of the data register 27 and the sense amplifier 26.

As illustrated in FIG. 12, the sense amplifier 26 includes a plurality of sense amplifier units SAU provided for each pair of bit lines BLa and BLb. More specifically, for example, a sense amplifier unit SAU corresponding to a set of the bit line BLa0 of the memory cell array 11a and the bit line BLa0 of the memory cell array 11b is provided. Similarly, a sense amplifier unit SAU corresponding to a set of the bit line BLaN of the memory cell array 11a and the bit line BLbN of the memory cell array 11b is provided. That is, N+1 sense amplifier units SAU are provided for a set of N+1 bit lines BLa and BLb.

The data register 27 includes, for example, a plurality of latch circuits XDL provided for each sense amplifier unit SAU. The latch circuit XDL temporarily stores read data and write data. The latch circuit XDL is used to input and output data between the external controller and the sense amplifier unit SAU. Each latch circuit XDL is connected to the corresponding sense amplifier unit SAU through a bus DBUS. Note that a plurality of sense amplifier units SAU may be connected to one latch circuit XDL.

Next, an internal configuration of the sense amplifier unit SAU will be described. The sense amplifier unit SAU includes, for example, a BL hook-up circuit BLHU, a sense circuit SA, and latch circuits SDL, ADL, BDL, CDL, and TDL. The sense circuit SA and the latch circuits SDL, ADL, BDL, CDL, and TDL are commonly connected to a bus LBUS. In other words, the latch circuit XDL, the sense circuit SA, and the latch circuits SDL, ADL, BDL, CDL, and TDL are connected so as to be able to transmit and receive data to and from each other.

The BL hook-up circuit BLHU is a circuit that connects the bit line BL and the sense circuit SA. The bit lines BLa and BLb are connected to the BL hook-up circuit BLHU. The BL hook-up circuit BLHU is connected to the sense circuit SA through the node BLI.

At the time of the read operation, the sense circuit SA senses the data read to the corresponding bit line BL and determines whether the read data is "0" data or "1" data. During the write operation, the sense circuit SA applies a voltage to the bit line BL based on data stored in any of the latch circuits SDL, ADL, BDL, CDL, and TDL.

The latch circuits SDL, ADL, BDL, CDL, and TDL temporarily store read data and write data. For example, during the read operation, data can be transferred from the sense circuit SA to any one of the latch circuits SDL, ADL, BDL, CDL, and TDL. During the write operation, data can be transferred from the latch circuit XDL to any one of the latch circuits SDL, ADL, BDL, CDL, and TDL.

The configuration of the sense amplifier unit SAU is not limited thereto, and various modifications can be made. For example, the number of latch circuits included in the sense amplifier unit SAU can be designed based on the number of bits of data that can be stored in one memory cell transistor MC.

1.1.8 Circuit Configuration of Sense Amplifier Unit

Next, an example of a circuit configuration of the sense amplifier unit SAU will be described with reference to FIG. 13. FIG. 13 is a circuit diagram of the sense amplifier unit SAU. The sense amplifier unit SAU of the present embodiment senses a current flowing from a node SEN to the bit line BL. Note that, in the example illustrated in FIG. 13, in order to simplify the description, the latch circuits ADL, BDL, and CDL are illustrated in one common circuit diagram. The circuit configurations of the latch circuits ADL, BDL, and CDL are similar to those of the latch circuits SDL and TDL. In the following description, one of a source and a drain of a transistor is referred to as "one end of the transistor", and the other of the source and the drain is referred to as "the other end of the transistor".

As illustrated in FIG. 13, the sense amplifier unit SAU includes a BL hook-up circuit BLHU, a sense circuit SA, latch circuits SDL, ADL, BDL, CDL, and TDL, an LBUS precharge circuit LBPC, and a DBUS switch circuit DBSW.

1.1.8.1 Configuration of BL Hook-up Circuit

First, a configuration of the BL hook-up circuit BLHU will be described. The BL hook-up circuit BLHU includes high withstand voltage n-channel MOS transistors THN1 to THN4.

One end of the transistor THN1 is connected to the bit line BLa. The other end of the transistor THN1 is connected to a node BLBIAS. A bias voltage is applied to the node BLBIAS. A signal BIASa is input to a gate of the transistor THN1. The signal BIASa is a signal for controlling electrical connection between the bit line BLa and the node BLBIAS. In a case where the bit line BLa and the node BLBIAS are electrically connected, a high ("H") level voltage for turning on a transistor THN1 is applied to the signal BIASa.

One end of the transistor THN2 is connected to the bit line BLa. The other end of the transistor THN2 is connected to the node BLI. A signal BLSa is input to a gate of the transistor THN2. The signal BLSa is a signal for controlling electrical connection between the bit line BLa and the node BLI. In a case where the bit line BLa and the sense circuit SA are electrically connected, a voltage at a "H" level for turning on a transistor THN2 is applied to the signal BLSa.

For example, in the read operation and the write operation, in a case where the memory cell array 11a is selected, that is, in a case where the bit line BLa is selected, the transistor THN1 is turned off, and the transistor THN2 is turned on. In a case where the memory cell array 11a is non-selected, that is, in a case where the bit line BLa is non-selected, the transistor THN1 is turned on, and the transistor THN2 is turned off.

One end of the transistor THN3 is connected to the bit line BLb. The other end of the transistor THN3 is connected to the node BLBIAS. A signal BIASb is input to a gate of the transistor THN3. The signal BIASb is a signal for controlling electrical connection between the bit line BLb and the node BLBIAS. In a case where the bit line BLb and the node BLBIAS are electrically connected, a voltage at a "H" level for turning on a transistor THN3 is applied to the signal BIASb.

One end of the transistor THN4 is connected to the bit line BLb. The other end of the transistor THN4 is connected to the node BLI. A signal BLSb is input to a gate of the transistor THN4. The signal BLSb is a signal for controlling electrical connection between the bit line BLb and the node BLI. In a case where the bit line BLb and the sense circuit SA are electrically connected, a voltage at a "H" level for turning on the transistor THN4 is applied to the signal BLSb.

For example, in the read operation and the write operation, in a case where the memory cell array 11b is selected, that is, in a case where the bit line BLb is selected, the transistor THN3 is turned off, and the transistor THN4 is turned on. In a case where the memory cell array 11b is non-selected, that is, in a case where the bit line BLb is non-selected, the transistor THN3 is turned on, and the transistor THN4 is turned off.

For example, the BL hook-up circuit BLHU receives signals BIASa, BIASb, BLSa, and BLSb from the sequencer 23.

1.1.8.2 Configuration of Sense Circuit

Next, a configuration of the sense circuit SA will be described. The sense circuit SA includes a low withstand voltage p-channel MOS transistor TP1, low withstand voltage n-channel MOS transistors TN1 to TN11, and a capacitance element CA.

A voltage VDDSA is applied to one end of the transistor TP1. The voltage VDDSA is a power supply voltage of the sense circuit SA. The other end of the transistor TP1 is connected to a node ND1. A gate of the transistor TP1 is connected to a node INV_S. The node INV_S is a node capable of storing data (inverted data) in the latch circuit SDL. In a case where the node INV_S is at the Low ("L") level, the transistor TP1 is turned on.

One end of the transistor TN1 is connected to the node ND1. The other end of the transistor TN1 is connected to a node SRCGND. For example, a ground voltage VSS or the like is applied to the node SRCGND. A gate of the transistor TN1 is connected to the node INV_S. In a case where the node INV_S is at the "H" level, the transistor TN1 is turned on. Therefore, one of the transistors TP1 and TN1 is turned on and the other is turned off on the basis of the logic level of the node INV_S. In other words, the voltage VDDSA or the voltage of the node SRCGND can be applied to the node ND1 based on data stored in the latch circuit SDL.

One end of the transistor TN2 is connected to the node ND1. The other end of the transistor TN2 is connected to a node SCOM. A signal BLX is input to a gate of the transistor TN2. In a case where the signal BLX is at the "H" level, the transistor TN2 is turned on.

One end of the transistor TN3 is connected to the node BLI. The other end of the transistor TN3 is connected to the node SCOM. A signal BLC is input to a gate of the transistor TN3. The transistor TN3 can function as a clamp transistor that clamps a voltage applied to the node BLI based on the voltage of the signal BLC.

One end of a transistor TN4 is connected to the node SCOM. The other end of the transistor TN4 is connected to the node SEN. A signal XXL is input to a gate of the transistor TN4. In a case where the signal XXL is at the "H" level, the transistor TN4 is turned on.

One end of a transistor TN5 is connected to the node SCOM. The other end of the transistor TN5 is connected to the node SRCGND. A signal NLO is input to a gate of the transistor TN5. In a case where the signal NLO is at the "H" level, the transistor TN5 is turned on.

The voltage VDDSA is applied to one end of a transistor TN6. The other end of the transistor TN6 is connected to the node SEN. A signal SPC is input to a gate of the transistor TN6. In a case where the signal SPC is at the "H" level, the transistor TN6 is turned on. For example, the transistor TN6 is used for charging the node SEN.

One end of a transistor TN7 is connected to the node SEN. The other end of the transistor TN7 is connected to the bus LBUS. A signal BLQ is input to a gate of the transistor TN7. In a case where the signal BLQ is at the "H" level, the transistor TN7 is turned on. The transistor TN7 is turned on in a case where the bus LBUS and the node SEN are electrically connected.

One end of a transistor TN8 is connected to the bus LBUS. The other end of the transistor TN8 is connected to one end of a transistor TN9. A signal STB is input to a gate of the transistor TN8. In a case where the signal STB is asserted, the sense circuit SA determines the voltage of the node SEN. That is, the sense circuit SA determines data stored in the selected memory cell transistor MC. More specifically, when the signal STB at the "H" level is input, the transistor TN8 is turned on. Meanwhile, in a case where the transistor TN9 is in an on state, the bus LBUS is discharged through the transistors TN8 and TN9. Furthermore, in a case where the transistor TN9 is in an off state, the bus LBUS is not discharged through the transistors TN8 and TN9. Data based on the voltage of the bus LBUS is stored in any of the latch circuits SDL, ADL, BDL, CDL, and TDL sharing the bus LBUS.

A clock signal CLK is input to the other end of the transistor TN9. A gate of the transistor TN9 is connected to the node SEN. The transistor TN9 functions as a sense transistor that senses the voltage of the node SEN. For example, in a case where the voltage of the node SEN is equal to or higher than a threshold voltage of the transistor TN9, the transistor TN9 is turned on. Furthermore, in a case where the voltage of the node SEN is less than the threshold voltage of the transistor TN9, the transistor TN9 is turned off.

One electrode of the capacitance element CA is connected to the node SEN. The clock signal CLK is input to the other electrode of the capacitance element CA.

One end of a transistor TN10 is connected to the node SEN. The other end of the transistor TN10 is connected to one end of a transistor TN11. A signal LSL is input to a gate of the transistor TN10. In a case where the signal LSL is at the "H" level, the transistor TN10 is turned on.

The voltage VSS is applied to the other end of the transistor TN11. A gate of the transistor TN11 is connected to the bus LBUS.

For example, the sense circuit SA receives signals BLX, BLC, XXL, NLO, SPC, BLQ, STB, and LSL from the sequencer 23.

1.1.8.3 Configuration of Latch Circuit SDL

Next, a configuration of the latch circuit SDL will be described. The latch circuit SDL includes low withstand voltage p-channel MOS transistors TP21 to TP24 and low withstand voltage n-channel MOS transistors TN21 to TN24.

The voltage VDDSA is applied to one end of the transistor TP21. The other end of the transistor TP21 is connected to one end of the transistor TP22. A signal SLL is input to a gate of the transistor TP21.

The other end of the transistor TP22 is connected to one end of the transistor TN22. The gate of the transistor TP22 is connected to the node INV_S.

The voltage VDDSA is applied to one end of the transistor TP23. The other end of the transistor TP23 is connected to one end of a transistor TP24. A signal SLI is input to a gate of the transistor TP23.

The other end of the transistor TP24 is connected to one end of the transistor TN23. A gate of the transistor TP24 is connected to a node LAT_S.

One end of the transistor TN21 is connected to the node LAT_S. The other end of the transistor TN21 is connected to the bus LBUS. A signal STL is input to a gate of the transistor TN21.

The other end of the transistor TN22 is grounded (the ground voltage VSS is applied). A gate of the transistor TN22 is connected to the node INV_S.

The other end of the transistor TN23 is grounded. A gate of the transistor TN23 is connected to the node LAT_S.

One end of the transistor TN24 is connected to the node INV_S. The other end of the transistor TN24 is connected to the bus LBUS. A signal STI is input to a gate of the transistor TN24.

The latch circuit SDL stores data at the node LAT_S. The latch circuit SDL stores inverted data of data stored in the node LAT_S in the node INV_S. For example, in a case where the latch circuit SDL stores "1" data, the voltage at the "L" level (voltage VSS) is applied to the node INV_S. In a case where the latch circuit SDL stores "0" data, a voltage at the "H" level (voltage VDDSA) is applied to the node INV_S.

For example, the latch circuit SDL receives the signals SLL, SLI, STL, and STI from the sequencer 23.

1.1.8.4 Configuration of Latch Circuit TDL

Next, a configuration of the latch circuit TDL will be described. The latch circuit TDL includes low withstand voltage p-channel MOS transistors TP31 to TP34 and low withstand voltage n-channel MOS transistors TN31 to TN34.

The voltage VDDSA is applied to one end of the transistor TP31. The other end of the transistor TP31 is connected to one end of the transistor TP32. A signal TLL is input to a gate of the transistor TP31.

The other end of the transistor TP32 is connected to one end of the transistor TN32. A gate of the transistor TP32 is connected to a node INV_T.

The voltage VDDSA is applied to one end of the transistor TP33. The other end of the transistor TP33 is connected to one end of the transistor TP34. The signal TLI is input to a gate of the transistor TP33.

The other end of the transistor TP34 is connected to one end of the transistor TN33. A gate of the transistor TP34 is connected to a node LAT_T.

One end of the transistor TN31 is connected to the node LAT_T. The other end of the transistor TN31 is connected to the bus LBUS. The signal TTL is input to a gate of the transistor TN31.

The other end of the transistor TN32 is grounded (the ground voltage VSS is applied). The gate of the transistor TN32 is connected to a node INV_T.

The other end of the transistor TN33 is grounded. A gate of the transistor TN33 is connected to the node LAT_T.

One end of the transistor TN34 is connected to the node INV_T. The other end of the transistor TN34 is connected to the bus LBUS. A signal TTI is input to a gate of the transistor TN34.

The latch circuit TDL stores data at the node LAT_T. In addition, the latch circuit TDL stores the inverted data of the data stored in the node LAT_T at the node INV_T. For example, in a case where the latch circuit TDL stores "1" data, a voltage at the "L" level (voltage VSS) is applied to the node INV_T. Further, in a case where the latch circuit TDL stores "0" data, a voltage at the "H" level (voltage VDDSA) is applied to the node INV_T.

For example, the latch circuit TDL receives the signals TLL, TLI, TTL, and TTI from the sequencer 23.

1.1.8.5 Configuration of Latch Circuits ADL, BDL, and CDL

Next, configurations of the latch circuits ADL, BDL, and CDL will be briefly described. The configurations of the latch circuits ADL, BDL, and CDL are similar to those of the latch circuits SDL and TDL. For example, a signal *LL corresponding to the signal SLL, a signal *LI corresponding to the signal SLI, a signal *TL corresponding to the signal STL, a signal *TI corresponding to the signal STI, a node LAT_* corresponding to the node LAT_S, and a node INV_* corresponding to the node INV_S, the latch circuit ADL is configured by describing "A" in * in the case of the latch circuit ADL. That is, the signals ALL, ALI, ATL, and ATI, and the nodes LAT_A and INV_A are described. Similarly, in the case of the latch circuit BDL, "B" is described in *. In the case of the latch circuit CDL, "C" is described in *.

1.1.8.6 Configuration of LBUS Precharge Circuit

Next, the LBUS precharge circuit LBPC will be described. The LBUS precharge circuit LBPC is a charging circuit of the bus LBUS. The LBUS precharge circuit LBPC includes a low withstand voltage n-channel MOS transistor TN41. The voltage VDDSA is applied to one end of the transistor TN41. The other end of the transistor TN41 is connected to the bus LBUS. The signal LPC is input to a gate of the transistor TN41. For example, in the read operation, the LBUS precharge circuit LBPC precharges the bus LBUS before transferring a sensing result of the sense circuit SA to the bus LBUS.

For example, the LBUS precharge circuit LBPC receives the signal LPC from the sequencer 23.

1.1.8.7 Configuration of DBUS Switch Circuit

Next, the DBUS switch circuit DBSW will be described. The DBUS switch circuit DBSW is a circuit that connects the sense amplifier unit SAU and the bus DBUS. In other words, the DBUS switch circuit DBSW connects the sense amplifier unit SAU and the latch circuit XDL. The DBUS switch circuit DBSW includes a low withstand voltage n-channel MOS transistor TN42. One end of the transistor TN42 is connected to the bus LBUS. The other end of the transistor TN42 is connected to the bus DBUS. A signal DSW is input to a gate of the transistor TN42.

For example, the DBUS switch circuit DBSW receives the signal DSW from the sequencer 23.

1.2 Read Operation

Next, the read operation will be described. Hereinafter, in order to simplify the description, a case where the memory cell transistor MC is an SLC capable of storing 1-bit data will be described. The threshold voltage of the SLC takes a value included in one of two discrete threshold voltage distributions. Hereinafter, a state in which data is erased by extracting a charge from a charge storage layer is defined as "1" data. On the other hand, a state in which a charge is injected into the charge storage layer and data is written is defined as "0" data. Therefore, a threshold voltage of the memory cell transistor MC holding the "1" data is lower than a threshold voltage of the memory cell transistor MC holding the "0" data.

1.2.1 Timing Chart of Read Operation

Next, an example of a timing chart of the read operation will be described with reference to FIGS. 14 to 16. FIG. 14 is a timing chart illustrating voltages of interconnects and signals in the read operation. The example of FIG. 14 illustrates a case where data of any cell unit CU of the memory cell array 11a is read. FIG. 15 is a diagram illustrating a state of the NAND string NS in a period from time t1 to time t2 in FIG. 14. FIG. 16 is an example diagram illustrating a difference in a voltage rise of the word line WL depending on the presence or absence of coupling. Hereinafter, the string unit SU including the cell unit CU to be read is referred to as "selected string unit SU". The string unit SU that does not include the cell unit CU to be read is referred to as "non-selected string unit SU". The memory cell array 11 including the selected string unit SU is referred to as "selected memory cell array 11". The memory cell array 11 not including the selected string unit SU is referred to as "non-selected memory cell array 11". The bit line BL connected to the selected memory cell array 11 is referred to as a "selected bit line BL". The bit line BL connected to the non-selected memory cell array 11 is referred to as a "non-selected bit line BL".

As illustrated in FIG. 14, during the period from time t0 to time t3, the word lines WL and the bit lines BL are started up. That is, the word lines WL and the bit lines BL are charged during the period from time t0 to time t3.

At time t0, a voltage VBLS is applied as the voltage at the "H" level to the signal BLSa of the BL hook-up circuit BLHU. As a result, the transistor THN2 is turned on, and the selected bit line BLa is electrically connected to the sense circuit SA. Furthermore, a voltage VBIAS is applied to the signal BIASb as a voltage at the "H" level. As a result, the transistor THN3 is turned on, and the non-selected bit line BLb is electrically connected to the node BLBIAS.

During a period from time t0 to time t1, the source line driver 29 boosts a voltage of source line SL from the voltage VSS to a voltage VSRC. The voltage VSRC is higher than the voltage VSS. Similarly, the sense amplifier 26 boosts the voltages of the bit lines BLa and BLb from the voltage VSS to the voltage VSRC.

During a period from time t1 to time t2, the sense amplifier 26 boosts the voltage of the selected bit line BLa to a voltage VBLRD. The voltage VBLRD is a voltage applied to the selected bit line BL at the time of data reading. The voltage VBLRD is higher than the voltage VSRC. In addition, the sense amplifier 26 boosts a voltage of the non-selected bit line BLb to a voltage VCH. The voltage VCH is higher than the voltage VBLRD.

During a period from time t0 to time t2, the row decoder 25 boosts the voltages of the selection gate lines SGDa and SGDb from the voltage VSS to a voltage VSGDon. The voltage VSGDon is higher than the voltage VSS. The selection transistor ST1 to which the voltage VSGDon is applied is turned on. The row decoder 25 boosts the voltage of the selection gate line SGSa of the selected memory cell array 11a from the voltage VSS to a voltage VSGSon. The voltage VSGSon is higher than the voltage VSS. The selection transistor ST2 to which the voltage VSGSon is applied is turned on. The voltage VSGSon may be the same voltage value as the voltage VSGDon, or may be a different voltage value. The row decoder 25 boosts the voltage of the selection gate line SGSb of the non-selected memory cell array 11b from the voltage VSS to a voltage VSGSoff. The voltage VSGSoff is higher than the voltage VSS and lower than the voltage VSGSon. The selection transistor ST2 to which the voltage VSGSoff is applied is turned off. As a result, as illustrated in FIG. 15, the selection transistors ST1 and ST2 of the selected memory cell array 11a are turned on. On the other hand, the selection transistor ST1 of the non-selected memory cell array 11b is turned on, and the selection transistor ST2 is turned off. A channel potential of each NAND string NS of the selected memory cell array 11a is boosted to the voltage VBLRD. The channel potential of each NAND string NS of the non-selected memory cell array 11b is boosted to the voltage VCH. The channel potential of the NAND string NS of the non-selected memory cell array 11b is higher than the channel potential of the NAND string NS of the selected memory cell array 11a.

In this state, the row decoder 25 boosts the voltage of the word lines WL from the voltage VSS to a voltage VREAD. When the voltage VREAD is applied to a gate of the memory cell transistor MC, the memory cell transistor MC is turned on regardless of stored data. At this time, a boosting speed of the voltage of the word lines WL increases due to capacitive coupling with the channel of the non-selected memory cell array 11b to which the voltage VCH is applied from the non-selected bit line BLb. As illustrated in FIG. 16, for example, in the case of no coupling, a period during which the word lines WL are boosted to the voltage VREAD is a period tRP2 from time t0 to time t2'. On the other hand, in a case where coupling is present, the period during which the word lines WL are boosted to the voltage VREAD is shortened to the period tRP1 from time t0 to time t2.

As illustrated in FIG. 14, a period from time t3 to time t4 is a data reading period.

At time t3, the row decoder 25 applies a voltage VSGDoff to the selection gate line SGDa corresponding to the non-selected string unit SU of the selected memory cell array 11a and the selection gate line SGDb of the non-selected memory cell array 11b. The voltage VSGDoff is higher than the voltage VSS and lower than the voltage VSGDon. The selection transistor ST1 to which the voltage VSGDoff is applied is turned off. As a result, the selection transistor ST1 of the non-selected string unit SU of the selected memory cell array 11a and the selection transistor ST1 of the non-selected memory cell array 11b are turned off. The row decoder 25 applies a read voltage VCGRV to the selected word line WL. The voltage VCGRV is lower than the voltage VSGDon. The voltage VCRGV is based on a threshold voltage distribution of the memory cell transistor MC. For example, in a case where the memory cell transistor MC to be read stores "1" data (in an erase state), the memory cell transistor MC is turned on. In a case where the memory cell transistor MC to be read stores "0" data (in a case where the memory cell transistor MC is in a write state), the memory cell transistor MC is turned off.

During a period from time t3 to time t4, the sense amplifier 26 reads data of the cell unit CU to be read.

During a period from time t4 to time t5, the word lines WL and the bit lines BL are caused to fall. More specifically, the row decoder 25 applies the voltage VSS to the word lines WL and the selection gate lines SGDa, SGDb, SGSa, and SGSb. The source line driver 29 applies voltage VSS to the source line SL. The sense amplifier 26 applies the voltage VSS to the bit lines BLa and BLb. In addition, the sense amplifier 26 applies the voltage VSS to the signals BLSa and BIASb of the BL hook-up circuit BLHU. As a result, the transistors THN2 and THN3 are turned off.

1.3 Write Operation

Next, the write operation will be described. The write operation includes a program operation and a program verify operation.

The program operation is an operation of increasing a threshold voltage by injecting electrons into the charge storage layer (alternatively, the threshold voltage is maintained by hardly injecting electrons into the charge storage layer). In the program operation, the memory cell transistor MC is set to be programmed or prohibited from being programmed based on the write data stored in the sense amplifier unit SAU. The memory cell transistor MC that has not reached a threshold voltage of a write target state is set as a program target. In addition, the memory cell transistor MC having reached the threshold voltage of the write target state is set to program prohibition.

The program verify operation is an operation of reading data and determining whether or not the threshold voltage of the memory cell transistor MC has reached a target level (write target state) after the program operation. Hereinafter, a case where the threshold voltage of the memory cell transistor MC has reached the target level is referred to as "passed verification", and a case where the threshold voltage has not reached the target level is referred to as "failed verification". More specifically, for example, in the program verify operation, in a case where the number of fail bits of the read data is greater than or equal to a preset reference value, it is determined that "the verify has failed". Then, a combination of the program operation and the program verify operation (hereinafter, referred to as a "program loop") is repeated, the threshold voltage of the memory cell transistor MC is increased to the target level. The timing chart of the program verify operation is the same as the timing chart of the read operation described with reference to FIGS. 14 to 16. The read voltage VCGRV is set based on the target level to be targeted.

1.3.1 Timing Chart of Program Operation

Next, an example of a timing chart of the program operation will be described with reference to FIGS. 17 and 18. FIG. 17 is a timing chart illustrating voltages of interconnects and signals in the program operation. FIG. 18 is a diagram illustrating a state of the NAND string NS in a period from time t0 to time t1 in FIG. 17. The example of FIG. 17 illustrates a case where data is written to any cell unit CU of the memory cell array 11a. The example of FIG. 17 illustrates an example of a timing chart of the program operation in a case where the word lines WL0, WL1, . . . are sequentially selected in the write operation. In other words, the example of FIG. 17 illustrates an example of a timing chart of the program operation in a case where the write operation is executed sequentially from the memory cell transistor MC0 on the source line SL side. For example, in the circuit configuration of the memory cell array 11 illustrated in FIG. 2, the write operation is sequentially executed from the memory cell transistor MC0 to the memory cell transistor MC4.

As illustrated in FIG. 17, during a period from time t0 to time t2, the word lines WL and the bit lines BL are started up. That is, the word lines WL and the bit lines BL are charged during the period from time t0 to time t2.

At time t0, a voltage VBLS is applied as the voltage at the "H" level to the signal BLSa of the BL hook-up circuit BLHU. As a result, the transistor THN2 is turned on, and the selected bit line BLa is electrically connected to the sense circuit SA. Furthermore, a voltage VBIAS is applied to the signal BIASb as a voltage at the "H" level. As a result, the transistor THN3 is turned on, and the non-selected bit line BLb is electrically connected to the node BLBIAS.

During a period from time t0 to time t1, the source line driver 29 boosts a voltage of source line SL from the voltage VSS to a voltage VSRC.

In the selected memory cell array 11a, in a case where "0" data is stored in the latch circuit SDL, the sense amplifier 26 applies the voltage VSS to the bit line BLa corresponding to the "0" data. On the other hand, in the selected memory cell array 11a, in a case where "1" data is stored in the latch circuit SDL, the sense amplifier 26 applies the voltage VBLPG to the bit line BLa corresponding to the "1" data. The voltage VBLPG is higher than the voltage VSS. A voltage value of the voltage VBLPG may be the same voltage value as the voltage VCH. In the non-selected memory cell array 11b, the sense amplifier 26 applies the voltage VCH to the non-selected bit line BLb.

The row decoder 25 boosts the voltages of the selection gate lines SGDa and SGDb from the voltage VSS to the voltage VSGDon. In addition, the row decoder 25 boosts the voltages of the selection gate lines SGSa and SGSb from the voltage VSS to the voltage VSGSoff. As a result, as illustrated in FIG. 18, the selection transistors ST1 of the memory cell arrays 11a and 11b are turned on. On the other hand, the selection transistors ST2 of the memory cell arrays 11a and 11b are turned off. The voltage VBLPG or the voltage VSS is applied to the channel of each NAND string NS of the selected memory cell array 11a. The channel potential of each NAND string NS of the non-selected memory cell array 11b is boosted to the voltage VCH. The channel potential of the NAND string NS of the non-selected memory cell array 11b is higher than the channel potential of the NAND string NS of the selected memory cell array 11a.

In this state, the row decoder 25 boosts the voltage of the word lines WL from the voltage VSS to a voltage VPRE. The voltage VPRE is a voltage higher than the voltage VSS. When the voltage VPRE is applied to a gate of the memory cell transistor MC, the memory cell transistor MC is turned on regardless of stored data. At this time, as in the read operation, the boosting speed of the voltage of the word lines WL increases due to capacitive coupling with the channel of the non-selected memory cell array 11b to which the voltage VCH is applied from the non-selected bit line BLb.

As shown in FIG. 17, data is written into the memory cell transistor MC during a period from time t2 to time t4.

At time t2, the row decoder 25 applies a voltage VPASS to the non-selected word lines WL and the selected word line WL of the selected block BLK. The voltage VPASS is a voltage higher than the voltage VPRE. The row decoder 25 applies the voltage VSGDoff to the selection gate line SGDa corresponding to the non-selected string unit SUa in the selected memory cell array 11a. In addition, the row decoder 25 applies the voltage VSGDoff to the selection gate line SGDb in the non-selected memory cell array 11b. As a result, the selection transistor ST1 to which the voltage VSGDoff is applied is turned off.

At time t3, the row decoder 25 applies the program voltage VPGM to the selected word line WL. When the voltage VPGM is applied to the selected word line WL, the threshold voltage of the memory cell transistor MC connected to the selected word line WL and connected to the bit line BLa corresponding to data write "0" increases. In addition, an increase in the threshold voltage of the memory cell transistor MC connected to the selected word line WL and connected to the bit line BLb of the data write "1" is suppressed by a self-boost technology or the like.

During a period from time t4 to time t5, the word lines WL and the bit lines BL are caused to fall. More specifically, the row decoder 25 applies the voltage VSS to the word lines WL and the selection gate lines SGDa, SGDb, SGSa, and SGSb. The source line driver 29 applies voltage VSS to the source line SL. The sense amplifier 26 applies the voltage VSS to the bit lines BLa and BLb. In addition, the sense amplifier 26 applies the voltage VSS to the signals BLSa and BIASb of the BL hook-up circuit BLHU. As a result, the transistors THN2 and THN3 are turned off.

1.4 Effects According to Present Embodiment

With the configuration according to the present embodiment, the semiconductor memory device can improve processing capability. This advantageous effect will be described in detail.

For example, a method is known in which a plurality of memory cell arrays (array chips) are stacked in order to highly integrate a semiconductor memory device. In this case, in order to suppress an increase in the number of word lines WL connected to the row decoder, the word lines WL of each memory cell array can be shared. For example, when the word line WL is charged in the read operation, the selection transistors ST1 and ST2 are turned on in order to suppress disturbance in the non-selected string units SU. However, when the selection transistors ST1 and ST2 of the non-selected string units SU are in the on state, the channel capacitance of the NAND string NS becomes a capacitance load of the word line WL charging. Therefore, a boosting speed of the voltage of the word line WL is reduced. In addition, a consumption current for charging the word line WL increases.

On the other hand, in the configuration according to the present embodiment, when the word line WL is charged (started) in the read operation, a channel potential of the NAND string NS of the non-selected memory cell array 11 can be set to be higher than a channel potential of the NAND string NS of the selected memory cell array 11. Specifically, the selection transistors ST1 of the non-selected memory cell array 11 can be turned on, and the selection transistors ST2 can be turned off. In this state, a voltage VCH higher than that of the selected bit line BL can be applied to the non-selected bit line BL. As a result, the channel potential of the NAND string NS of the non-selected memory cell array can be increased to the voltage VCH. A boosting speed of the voltage of the word line WL can be increased by a capacitive coupling between the channel of the NAND string NS of the non-selected memory cell array 11 and the word line WL. As a result, a charging period of the word line WL can be shortened. Therefore, a processing capability of the semiconductor memory device can be improved.

Furthermore, with the configuration according to the present embodiment, the boosting of the word line WL is assisted by the capacitive coupling between the channel of the NAND string NS of the non-selected memory cell array 11 and the word line WL, so that a current consumption when charging the word line WL can be reduced. Therefore, the power consumption of the semiconductor memory device can be reduced.

Furthermore, with the configuration according to the present embodiment, when the word line WL is charged (started) in the program operation, the boosting speed of the voltage of the word line WL can be increased by the capacitive coupling between the channel of the non-selected memory cell array 11 and the word line WL, similarly to the read operation.

2. Second Embodiment

Next, a second embodiment will be described. In a second embodiment, a configuration of a semiconductor memory device 1 different from that of the first embodiment, and a read operation and a write operation will be described. Hereinafter, differences from the first embodiment will be mainly described.

2.1 Configuration 2.1.1 Overall Configuration of Semiconductor Memory Device First, an example of an overall configuration of the semiconductor memory device 1 will be described with reference to FIG. 19. FIG. 19 is a block diagram illustrating an overall configuration of the semiconductor memory device 1. In FIG. 19, a part of connection between the components is indicated by an arrow line, but the connection between the components is not limited thereto.

As illustrated in FIG. 19, in the present embodiment, a source line SLa of a memory cell array 11a and a source line SLb of a memory cell array 11b are independently connected to a source line driver 29. Other configurations are the same as those of the first embodiment.

2.1.2 Circuit Configuration of Memory Cell Array

Next, an example of a circuit configuration of the memory cell array 11 will be described with reference to FIGS. 20 and 21. FIG. 20 is a plan view illustrating a circuit configuration of the memory cell array 11. FIG. 21 is a perspective view illustrating a circuit configuration of the memory cell array 11. Note that the examples of FIGS. 20 and 21 illustrate a circuit configuration of a block BLK0, but the same applies to other blocks BLK.

As illustrated in FIGS. 20 and 21, a plurality of string units SU of a plurality of blocks BLK of the memory cell array 11a (array chip 10a) are commonly connected to one source line SLa. That is, sources of a plurality of selection transistors ST2 in the memory cell array 11a are commonly connected to one source line SLa. Similarly, a plurality of string units SU of the plurality of blocks BLK of the memory cell array 11b (array chip 10b) are commonly connected to one source line SLb. That is, sources of the plurality of selection transistors ST2 in the memory cell array 11b are commonly connected to one source line SLb.

2.1.3 Arrangement of Chips

Next, an example of arrangement of each chip will be described with reference to FIG. 22. FIG. 22 is a cross-sectional view illustrating arrangement of the array chips 10a and 10b and the circuit chip 20. In the example of FIG. 22, in order to simplify the description, one word line WL, one selection gate line SGDa, one selection gate line SGDb, one selection gate line SGSa, one selection gate line SGSb, one bit line BLa, one bit line BLb, one source line SLa, one source line SLb are illustrated.

As illustrated in FIG. 22, the source line SLa is connected to the memory cell array 11a and is not connected to the memory cell array 11b. The source line SLb is connected to the memory cell array 11b and is not connected to the memory cell array 11a.

2.2 Timing Chart of Read Operation

Next, an example of a timing chart of the read operation will be described with reference to FIGS. 23 and 24. FIG. 23 is a timing chart illustrating voltages of interconnects and signals in the read operation. The example of FIG. 23 illustrates a case where data of any cell unit CU of the memory cell array 11a is read. FIG. 24 is a diagram illustrating a state of the NAND string NS in a period from time t1 to time t2 in FIG. 23. Hereinafter, the source line SL connected to the selected memory cell array 11 is referred to as a "selected source line SL". The source line SL connected to the non-selected memory cell array 11 is referred to as a "non-selected source line SL".

As illustrated in FIG. 23, during a period from time t0 to time t3, the word lines WL and the bit lines BL are started up. That is, the word lines WL and the bit lines BL are charged during the period from time t0 to time t3.

At time t0, a voltage VBLS is applied as the voltage at the "H" level to the signal BLSa of the BL hook-up circuit BLHU. As a result, the transistor THN2 is turned on, and the selected bit line BLa is electrically connected to the sense circuit SA.

During a period from time t0 to time t1, the source line driver 29 boosts the voltages of source lines SLa and SLb from a voltage VSS to a voltage VSRC. The sense amplifier 26 boosts the voltage of the selected bit line BLa from the voltage VSS to the voltage VSRC.

During a period from time t1 to time t2, the source line driver 29 boosts the voltage of non-selected source line SLb to a voltage VCH. The sense amplifier 26 boosts a voltage of a selected bit lines BLa to a voltage VBLRD.

During a period from time t0 to time t2, the row decoder 25 boosts the voltages of the selection gate lines SGDa and SGDb from the voltage VSS to the voltage VSGDoff. In addition, the row decoder 25 boosts the voltages of the selection gate lines SGSa and SGSb from the voltage VSS to a voltage VSGSon. As a result, as illustrated in FIG. 24, the selection transistors ST1 of the memory cell arrays 11a and 11b are turned off. The selection transistors ST2 of the memory cell arrays 11a and 11b are turned on. The channel potential of each NAND string NS of the selected memory cell array 11a is boosted to the voltage VSRC. The channel potential of each NAND string NS of the non-selected memory cell array 11b is boosted to the voltage VCH.

In this state, the row decoder 25 boosts the voltage of the word lines WL from the voltage VSS to a voltage VREAD. At this time, the boosting speed of the voltage of the word lines WL increases due to capacitive coupling with the channel of the non-selected memory cell array 11b to which the voltage VCH is applied from the non-selected source line SLb.

As illustrated in FIG. 23, a period from time t3 to time t4 is a data reading period.

At time t3, the row decoder 25 applies a voltage VSGDon to the selection gate line SGDa corresponding to the selected string unit SU of the selected memory cell array 11a. As a result, the selection transistor ST1 of the selected string unit SU of the selected memory cell array 11a is turned on. The row decoder 25 applies a voltage VSGSoff to the selection gate line SGSb. As a result, the selection transistor ST2 of the non-selected memory cell array 11b is turned off. In addition, the row decoder 25 applies a read voltage VCGRV to the selected word line WL.

During a period from time t3 to time t4, the sense amplifier 26 reads data of the cell unit CU to be read.

During a period from time t4 to time t5, the word lines WL and the bit lines BL are caused to fall. More specifically, the row decoder 25 applies the voltage VSS to the word lines WL and the selection gate lines SGDa, SGDb, SGSa, and SGSb. The source line driver 29 applies the voltage VSS to the source lines SLa and SLb. The sense amplifier 26 applies the voltage VSS to the bit lines BLa and BLb. In addition, the sense amplifier 26 applies the voltage VSS to the signal BLSa of the BL hook-up circuit BLHU. As a result, the transistor THN2 is turned off.

2.3 Timing Chart of Program Operation

Next, an example of a timing chart of the program operation will be described with reference to FIGS. 25 and 26. FIG. 25 is a timing chart illustrating voltages of interconnects and signals in the program operation. FIG. 26 is a diagram illustrating a state of the NAND string NS in a period from time t0 to time t1 in FIG. 25. The example of FIG. 25 illustrates a case where data is written to any cell unit CU of the memory cell array 11a. The example of FIG. 25 shows an example of a timing chart of the program operation in a case where the write operation is executed sequentially from the memory cell transistor MC on the bit line BL side. For example, in the case of the circuit configuration of the memory cell array illustrated in FIG. 20, the write operation is sequentially executed from a memory cell transistor MC4 to a memory cell transistor MC0.

As illustrated in FIG. 25, during a period from time t0 to time t2, the word lines WL and the bit lines BL are started up. That is, the word lines WL and the bit lines BL are charged during the period from time t0 to time t2.

At time t0, a voltage VBLS is applied as the voltage at the "H" level to the signal BLSa of the BL hook-up circuit BLHU. As a result, the transistor THN2 is turned on, and the selected bit line BLa is electrically connected to the sense circuit SA. Furthermore, a voltage VBIAS is applied to the signal BIASb as a voltage at the "H" level. As a result, the transistor THN3 is turned on, and the non-selected bit line BLb is electrically connected to the node BLBIAS.

During a period from time t0 to time t1, the source line driver 29 boosts the voltage of selected source line SLa from voltage VSS to voltage VSRC. The source line driver 29 boosts the voltage of non-selected source line SLb from the voltage VSS to the voltage VCH.

In the selected memory cell array 11a, in a case where "0" data is stored in the latch circuit SDL, the sense amplifier 26 applies the voltage VSS to the bit line BLa corresponding to the "0" data. On the other hand, in the selected memory cell array 11a, in a case where "1" data is stored in the latch circuit SDL, the sense amplifier 26 applies the voltage VBLPG to the bit line BLa corresponding to the "1" data.

The row decoder 25 boosts the voltages of the selection gate lines SGDa and SGDb from the voltage VSS to the voltage VSGDoff. In addition, the row decoder 25 boosts the voltages of the selection gate lines SGSa and SGSb from the voltage VSS to a voltage VSGSon. As a result, as illustrated in FIG. 26, the selection transistors ST1 of the memory cell arrays 11a and 11b are turned off. The selection transistors ST2 of the memory cell arrays 11a and 11b are turned on. The channel potential of each NAND string NS of the selected memory cell array 11a is boosted to the voltage VSRC. A channel potential of each NAND string NS of the non-selected memory cell array 11b is boosted to the voltage VCH.

In this state, the row decoder 25 boosts the voltage of the word lines WL from the voltage VSS to a voltage VPRE. At this time, the boosting speed of the voltage of the word lines WL increases due to capacitive coupling with the channel of the non-selected memory cell array 11b to which the voltage VCH is applied from the non-selected source line SLb.

As shown in FIG. 25, data is written into the memory cell transistor MC during a period from time t2 to time t4.

At time t2, the row decoder 25 applies a voltage VPASS to the non-selected word line WL and the selected word line WL of the selected block BLK. The row decoder 25 applies the voltage VSGDon to the selection gate line SGDa corresponding to the selected string unit SUa in the selected memory cell array 11a. As a result, the selection transistor ST1 to which the voltage VSGDon is applied is turned off. The row decoder 25 applies a voltage VSGSoff to the selection gate lines SGSa and SGSb. As a result, the selection transistors ST2 of the memory cell arrays 11a and 11b are turned off.

At time t3, the row decoder 25 applies the voltage VPGM to the selected word line WL.

During a period from time t4 to time t5, the word lines WL and the bit lines BL are caused to fall. More specifically, the row decoder 25 applies the voltage VSS to the word lines WL and the selection gate lines SGDa, SGDb, SGSa, and SGSb. The source line driver 29 applies voltage VSS to the source lines SLa and SLb. The sense amplifier 26 applies the voltage VSS to the bit lines BLa and BLb. In addition, the sense amplifier 26 applies the voltage VSS to the signal BLSa of the BL hook-up circuit BLHU. As a result, the transistor THN2 is turned off.

2.4 Effects of Present Embodiment

In the configuration according to the present embodiment, the memory cell array 11a and the memory cell array 11b are connected to different source lines SL. Therefore, when the word line WL is charged (raised) in the read operation and the write operation, the voltage VCH can be applied to the non-selected source line SL. As a result, the channel potential of the NAND string NS of the non-selected memory cell array can be increased to the voltage VCH. A boosting speed of the voltage of the word line WL can be increased by a capacitive coupling between the channel of the NAND string NS of the non-selected memory cell array 11 and the word line WL. Therefore, the same effects as those of the first embodiment can be obtained.

2.5 Modification

Next, two modifications of the second embodiment will be described. Hereinafter, differences from the second embodiment will be mainly described.

2.5.1 First Modification

First, a first modification will be described with reference to FIGS. 27 and 28. In the first modification, a case where a boost speed of a word line WL is increased by capacitive coupling with a channel of a non-selected memory cell array 11 based on the voltages of a non-selected bit line BL and a non-selected source line SL in the read operation will be described. FIG. 27 is a timing chart illustrating voltages of interconnects and signals in the read operation. FIG. 28 is a diagram illustrating a state of the NAND string NS in a period from time t1 to time t2 in FIG. 27. The example of FIG. 27 illustrates a case where data of any cell unit CU of the memory cell array 11a is read.

As illustrated in FIG. 27, during a period from time t0 to time t3, the word lines WL and the bit lines BL are started up. That is, the word lines WL and the bit lines BL are charged during the period from time t0 to time t3.

At time t0, a voltage VBLS is applied as the voltage at the "H" level to the signal BLSa of the BL hook-up circuit BLHU. As a result, the transistor THN2 is turned on, and the selected bit line BLa is electrically connected to the sense circuit SA. Furthermore, a voltage VBIAS is applied to the signal BIASb as a voltage at the "H" level. As a result, the transistor THN3 is turned on, and the non-selected bit line BLb is electrically connected to the node BLBIAS.

During a period from time t0 to time t1, the source line driver 29 boosts the voltages of source lines SLa and SLb from a voltage VSS to a voltage VSRC. The sense amplifier 26 boosts the voltages of the bit lines BLa and BLb from the voltage VSS to the voltage VSRC.

During a period from time t1 to time t2, the source line driver 29 boosts the voltage of non-selected source line SLb to a voltage VCH. The sense amplifier 26 boosts a voltage of a selected bit line BLa to a voltage VBLRD. In addition, the sense amplifier 26 boosts a voltage of the non-selected bit line BLb to a voltage VCH.

During a period from time t0 to time t2, the row decoder 25 boosts the voltages of the selection gate lines SGDa and SGDb from the voltage VSS to a voltage VSGDon. In addition, the row decoder 25 boosts the voltages of the selection gate lines SGSa and SGSb from the voltage VSS to a voltage VSGSon. As a result, as illustrated in FIG. 28, the selection transistors ST1 of the memory cell arrays 11a and 11b are turned on. The selection transistors ST2 of the memory cell arrays 11a and 11b are turned on. A channel potential of each NAND string NS of the selected memory cell array 11a is boosted to the voltage VBLRD. In addition, the channel potential of each NAND string NS of the non-selected memory cell array 11b is boosted to the voltage VCH applied from the non-selected bit line BLb and the non-selected source line SLb.

In this state, the row decoder 25 boosts the voltage of the word lines WL from the voltage VSS to a voltage VREAD. At this time, a boosting speed of the voltage of the word lines WL increases due to capacitive coupling with the channel of the non-selected memory cell array 11b to which the voltage VCH is applied from the non-selected bit line BLb and the non-selected source line SLb.

As illustrated in FIG. 27, a period from time t3 to time t4 is a data reading period.

At time t3, the row decoder 25 applies a voltage VSGDoff to the selection gate line SGDa corresponding to the non-selected string unit SU of the selected memory cell array 11a and the selection gate line SGDb of the non-selected memory cell array 11b. As a result, the selection transistor ST1 of the non-selected string unit SU of the selected memory cell array 11a and the selection transistor ST1 of the non-selected memory cell array 11b are turned off. The row decoder 25 applies a voltage VSGSoff to the selection gate line SGSb. As a result, the selection transistor ST2 of the non-selected memory cell array 11b is turned off. In addition, the row decoder 25 applies a read voltage VCGRV to the selected word line WL.

During a period from time t3 to time t4, the sense amplifier 26 reads data of the cell unit CU to be read.

During a period from time t4 to time t5, the word lines WL and the bit lines BL are caused to fall. More specifically, the row decoder 25 applies the voltage VSS to the word lines WL and the selection gate lines SGDa, SGDb, SGSa, and SGSb. The source line driver 29 applies the voltage VSS to the source lines SLa and SLb. The sense amplifier 26 applies the voltage VSS to the bit lines BLa and BLb. In addition, the sense amplifier 26 applies the voltage VSS to the signals BLSa and BIASb of the BL hook-up circuit BLHU. As a result, the transistors THN2 and THN3 are turned off.

2.5.2 Second Modification

Next, a second modification will be described with reference to FIG. 29. In the second modification, similarly to the first embodiment, a case where a write operation is sequentially executed from a memory cell transistor MC0 on a source line SL side in the write operation will be described. FIG. 29 is a timing chart illustrating voltages of interconnects and signals in the program operation. The example of FIG. 29 illustrates a case where data is written to any cell unit CU of a memory cell array 11a.

As illustrated in FIG. 29, during the period from time t0 to time t1, a source line driver 29 boosts a voltage of selected source line SLa from a voltage VSS to a voltage VSRC. The source line driver 29 boosts the voltage of non-selected source line SLb from the voltage VSS to the voltage VCH. The voltages of other interconnects and signal lines are similar to those in FIG. 17 of the first embodiment. The source line driver 29 may apply the voltage VSRC to the non-selected source line SLb.

2.5.3 Effects of First Modification and Second Modification

With the configurations according to the first modification and the second modification, the same effects as those of the second embodiment can be obtained.

3. Others

According to the above embodiment, a semiconductor memory device includes: a first string (NS) in which a first selection transistor (ST1), a first memory cell (MC0), and a second selection transistor (ST2) are coupled in series; a second string (NS) in which a third selection transistor (ST1), a second memory cell (MC0), and a fourth selection transistor (ST2) are coupled in series; a word line (WL) coupled to a gate of the first memory cell and a gate of the second memory cell; a first selection gate line (SGDa) coupled to a gate of the first selection transistor; a second selection gate line (SGSa) coupled to a gate of the second selection transistor; a third selection gate line (SGDb) coupled to a gate of the third selection transistor; a fourth selection gate line (SGSb) coupled to a gate of the fourth selection transistor; a first bit line (BLa) coupled to the first selection transistor; and a second bit line (BLb) coupled to the third selection transistor. In a read operation of the first memory cell, when a voltage of the word line is raised to a first voltage (VREAD), a second voltage (VBLRD) is applied to the first bit line and a third voltage (VCH) higher than the second voltage is applied to the second bit line.

With application of the above embodiments, there can be provided a semiconductor memory device capable of suppressing an increase in current consumption.

Furthermore, the "couple" or "connect" in the above embodiments includes a state where coupling is indirectly made by interposing, for example, other components such as a transistor or a resistor between components to be coupled.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first string in which a first selection transistor, a first memory cell, and a second selection transistor are coupled in series;
a second string in which a third selection transistor, a second memory cell, and a fourth selection transistor are coupled in series;
a word line coupled to a gate of the first memory cell and a gate of the second memory cell;
a first selection gate line coupled to a gate of the first selection transistor;
a second selection gate line coupled to a gate of the second selection transistor;
a third selection gate line coupled to a gate of the third selection transistor;
a fourth selection gate line coupled to a gate of the fourth selection transistor;
a first bit line coupled to the first selection transistor; and
a second bit line coupled to the third selection transistor, wherein
in a read operation of the first memory cell, when a voltage of the word line is raised to a first voltage, a second voltage is applied to the first bit line and a third voltage higher than the second voltage is applied to the second bit line, the first selection transistor, the second selection transistor, and the third selection transistor are turned on, and the fourth selection transistor is turned off, and
the third selection transistor is turned off when data is read from the first memory cell after the voltage of the word line is raised to the first voltage.

2. The semiconductor memory device according to claim 1, wherein
in the read operation of the first memory cell, a read voltage lower than the first voltage is applied to the word line when data is read from the first memory cell after the voltage of the word line is raised to the first voltage.

3. The semiconductor memory device according to claim 1, further comprising:
a row decoder coupled to the word line, the first selection gate line, the second selection gate line, the third selection gate line, and the fourth selection gate line; and
a sense amplifier coupled to the first bit line and the second bit line.

4. The semiconductor memory device according to claim 1, wherein
the write operation includes a program loop that alternately repeats a program operation and a program verify operation, and
in the program operation of the first memory cell, when the voltage of the word line is raised to a fourth voltage, a fifth voltage is applied to the first bit line and a sixth voltage higher than the fifth voltage is applied to the second bit line.

5. A semiconductor memory device comprising:
a first string in which a first selection transistor, a first memory cell, and a second selection transistor are coupled in series;
a second string in which a third selection transistor, a second memory cell, and a fourth selection transistor are coupled in series;
a word line coupled to a gate of the first memory cell and a gate of the second memory cell;

a first selection gate line coupled to a gate of the first selection transistor;
a second selection gate line coupled to a gate of the second selection transistor;
a third selection gate line coupled to a gate of the third selection transistor;
a fourth selection gate line coupled to a gate of the fourth selection transistor;
a first bit line coupled to the first selection transistor; and
a second bit line coupled to the third selection transistor, wherein
in a read operation of the first memory cell, when a voltage of the word line is raised to a first voltage, a second voltage is applied to the first bit line and a third voltage higher than the second voltage is applied to the second bit line,
the write operation includes a program loop that alternately repeats a program operation and a program verify operation,
in the program operation of the first memory cell, when the voltage of the word line is raised to a fourth voltage, a fifth voltage is applied to the first bit line, a sixth voltage higher than the fifth voltage is applied to the second bit line, the first selection transistor and the third selection transistor are turned on, and the second selection transistor and the fourth selection transistor are turned off.

6. The semiconductor memory device according to claim 5, wherein
in the program operation of the first memory cell, after the voltage of the word line is raised to the fourth voltage, a program voltage higher than the fourth voltage is applied to the word line.

7. The semiconductor memory device according to claim 6, wherein
in the program operation of the first memory cell, the third selection transistor is turned off while the program voltage is applied to the word line.

8. A semiconductor memory device, comprising:
a first string in which a first selection transistor, a first memory cell, and a second selection transistor are coupled in series;
a second string in which a third selection transistor, a second memory cell, and a fourth selection transistor are coupled in series;
a word line coupled to a gate of the first memory cell and a gate of the second memory cell;
a first selection gate line coupled to a gate of the first selection transistor;
a second selection gate line coupled to a gate of the second selection transistor;
a third selection gate line coupled to a gate of the third selection transistor;
a fourth selection gate line coupled to a gate of the fourth selection transistor;
a first bit line coupled to the first selection transistor;
a second bit line coupled to the third selection transistor;
a first source line coupled to the second selection transistor; and
a second source line coupled to the fourth selection transistor, wherein
in a read operation of the first memory cell, when a voltage of the word line is raised to a first voltage, a second voltage is applied to the first source line, a third voltage higher than the second voltage is applied to the second source line, the first selection transistor and the third selection transistor are turned off, and the second selection transistor and the fourth selection transistor are turned on, and after the voltage of the word line is raised to the first voltage, when data is read from the first memory cell, the first selection transistor is turned on, and the fourth selection transistor is turned off.

9. The semiconductor memory device according to claim 8, wherein in the read operation of the first memory cell, a read voltage lower than the first voltage is applied to the word line when data is read from the first memory cell after the voltage of the word line is raised to the first voltage.

10. The semiconductor memory device according to claim 8, further comprising:

a row decoder coupled to the word line, the first selection gate line, the second selection gate line, the third selection gate line, and the fourth selection gate line;

a sense amplifier coupled to the first bit line and the second bit line; and a source line driver coupled to the first source line and the second source line.

11. The semiconductor memory device according to claim 8, wherein the write operation includes a program loop that alternately repeats a program operation and a program verify operation, and in the program operation of the first memory cell, when the voltage of the word line is raised to a fourth voltage, a fifth voltage is applied to the first source line, and a sixth voltage higher than the fifth voltage is applied to the second source line.

12. The semiconductor memory device according to claim 11, wherein in the program operation of the first memory cell, after the voltage of the word line is raised to the fourth voltage, a program voltage higher than the fourth voltage is applied to the word line.

13. The semiconductor memory device according to claim 12, wherein the second selection transistor and the fourth selection transistor are turned off during a period in which the program voltage is applied to the word line.

14. The semiconductor memory device according to claim 8, wherein in the read operation of the first memory cell, a seventh voltage is applied to the first bit line and an eighth voltage higher than the seventh voltage is applied to the second bit line when the voltage of the word line is raised to the first voltage.

15. The semiconductor memory device according to claim 14, wherein in the read operation of the first memory cell, the first selection transistor, the second selection transistor, the third selection transistor, and the fourth selection transistor are turned on when the voltage of the word line is raised to the first voltage, and the second selection transistor and the fourth selection transistor are turned off when data is read from the first memory cell after the voltage of the word line is raised to the first voltage.

16. The semiconductor memory device according to claim 14, wherein in the read operation of the first memory cell, a read voltage lower than the first voltage is applied to the word line when data is read from the first memory cell after the voltage of the word line is raised to the first voltage.

17. The semiconductor memory device according to claim 3, further comprising:

a circuit chip including the row decoder and the sense amplifier;

a first array chip including the first string; and a second array chip including the second string, wherein the circuit chip is bonded to a first surface of the first array chip, and the second array chip is bonded to a second surface of the first array chip facing the first surface.

18. The semiconductor memory device according to claim 10, further comprising:

a circuit chip including the row decoder and the sense amplifier;

a first array chip including the first string; and a second array chip including the second string, wherein the circuit chip is bonded to a first surface of the first array chip, and the second array chip is bonded to a second surface of the first array chip facing the first surface.

* * * * *